(12) United States Patent  (10) Patent No.: US 8,624,232 B2
Sonar et al.  (45) Date of Patent: Jan. 7, 2014

(54) AMBIPOLAR POLYMERIC SEMICONDUCTOR MATERIALS AND ORGANIC ELECTRONIC DEVICES

(76) Inventors: Prashant Sonar, Singapore (SG);
Samarendra P. Singh, Singapore (SG);
Mui Siang Soh, Singapore (SG); Yuning Li, Singapore (SG)

(*) Notice: Subject to any disclaimer, the term of this patent is extended or adjusted under 35 U.S.C. 154(b) by 8 days.

(21) Appl. No.: 13/393,223

(22) PCT Filed: Apr. 30, 2010

(86) PCT No.: PCT/SG2010/000174
§ 371 (c)(1),
(2), (4) Date: Feb. 28, 2012

(87) PCT Pub. No.: WO2011/025454
PCT Pub. Date: Mar. 3, 2011

(65) Prior Publication Data
US 2012/0153274 A1 Jun. 21, 2012

Related U.S. Application Data

(60) Provisional application No. 61/272,182, filed on Aug. 28, 2009.

(51) Int. Cl.
*H01L 29/08* (2006.01)
(52) U.S. Cl.
USPC .............. 257/40; 257/E51.005; 257/E51.024; 528/360; 528/367
(58) Field of Classification Search
USPC ............ 257/40, E51.005, E51.024; 528/360, 528/367
See application file for complete search history.

(56) References Cited

U.S. PATENT DOCUMENTS

| | | | |
|---|---|---|---|
| 6,791,129 | B2 | 9/2004 | Inukai |
| 7,112,679 | B2 | 9/2006 | Zhou et al. |
| 7,132,500 | B2 | 11/2006 | Ong et al. |
| 7,132,682 | B2 | 11/2006 | Ong et al. |
| 7,141,644 | B2 | 11/2006 | Ong et al. |
| 7,223,484 | B2 | 5/2007 | Stössel et al. |
| 7,244,809 | B2 | 7/2007 | Giles et al. |
| 7,282,733 | B2 | 10/2007 | Ong et al. |
| 7,294,288 | B2 | 11/2007 | Koller et al. |
| 7,368,510 | B2 | 5/2008 | Lee et al. |
| 7,517,945 | B2 | 4/2009 | Ong et al. |
| 8,329,915 | B2 | 12/2012 | Moawia et al. |
| 2003/0186079 | A1 | 10/2003 | Towns et al. |
| 2006/0081839 | A1 | 4/2006 | Jeong et al. |
| 2006/0113527 | A1 | 6/2006 | Han et al. |

(Continued)

FOREIGN PATENT DOCUMENTS

| CA | 2 625 306 A1 | 9/2009 |
|---|---|---|
| EP | 2 033 983 A2 | 3/2009 |

(Continued)

OTHER PUBLICATIONS

PCT International Search Report for PCT Counterpart Application No. PCT/SG2010/000174, 4 pgs (Jul. 12, 2010).

(Continued)

*Primary Examiner* — Shane Fang
(74) *Attorney, Agent, or Firm* — Blakely, Sokoloff, Taylor & Zafman LLP

(57) ABSTRACT

There is provided compounds of formula I, ambipolar semiconductor material derived from such compounds and devices comprising such ambipolar semiconductor material.

$$[D_a\text{-}A_{core}\text{-}D_b\text{-}A_c\text{-}]_n \qquad (I)$$

14 Claims, 4 Drawing Sheets

(56) References Cited

U.S. PATENT DOCUMENTS

| | | |
|---|---|---|
| 2007/0090371 A1 | 4/2007 | Drechsel et al. |
| 2008/0197768 A1 | 8/2008 | Conway et al. |
| 2008/0315187 A1 | 12/2008 | Bazan et al. |
| 2009/0032106 A1 | 2/2009 | Sellinger et al. |
| 2009/0032808 A1 | 2/2009 | Bazan et al. |
| 2009/0065766 A1 | 3/2009 | Li |
| 2009/0065878 A1 | 3/2009 | Li |
| 2009/0171048 A1 | 7/2009 | Chan et al. |
| 2010/0006154 A1 | 1/2010 | Kitazawa et al. |
| 2010/0331550 A1 | 12/2010 | Moawia et al. |
| 2011/0023964 A1 | 2/2011 | Kitazawa et al. |
| 2011/0121273 A1 | 5/2011 | Jo et al. |
| 2011/0156018 A1 | 6/2011 | Moriwaki et al. |
| 2011/0201777 A1 | 8/2011 | Kondou et al. |
| 2012/0156829 A1 | 6/2012 | Chen et al. |

FOREIGN PATENT DOCUMENTS

| | | |
|---|---|---|
| EP | 2 034 537 A2 | 3/2009 |
| EP | 2 327 734 A1 | 6/2011 |
| EP | 2 338 925 A1 | 6/2011 |
| JP | 2009-158921 A | 7/2009 |
| JP | 2009-267196 A | 11/2009 |
| WO | WO 2005/049695 A1 | 6/2005 |
| WO | WO 2005/073265 A1 | 8/2005 |
| WO | WO 2007/136351 A1 | 11/2007 |
| WO | WO 2008/000664 A1 | 1/2008 |
| WO | WO 2008/044585 A1 | 4/2008 |
| WO | WO 2008/127029 A1 | 10/2008 |
| WO | WO 2009/105041 A1 | 8/2009 |
| WO | WO 2009/105042 A1 | 8/2009 |
| WO | WO 2009/125647 A1 | 10/2009 |
| WO | WO 2009/139339 A1 | 11/2009 |
| WO | WO 2010/026972 A1 | 3/2010 |
| WO | WO 2010/036494 A1 | 4/2010 |
| WO | WO 2010/044470 A1 | 4/2010 |
| WO | WO 2010/096019 A1 | 8/2010 |

OTHER PUBLICATIONS

Written Opinion of the International Search Authority for PCT Counterpart Application No. PCT/SG2010/000174, 7 pgs (Jul. 12, 2010).
PCT Notification of Transmittal of International Preliminary Examination Report for PCT Application No. PCT/SG2010/000174, 5 pgs. (Jun. 28, 2011).
Written Opinion of the International Preliminary Examining Authority for PCT Counterpart Application No. PCT/SG2010/000174, 5 pgs (Aug. 26, 2011).
Zhang et al., "Low Bandgap π-Conjugated Copolymers Based on Fused Thiophenes and Benzothiadiazole: Synthesis and Structure-Property Relationship Study," Journal of Polymer Science: Part A: Polymer Chemistry, vol. 47, pp. 5498-5508 (2009).
Bernede, J. C., "Organic Photovoltaic Cells: History, Principle and Techniques", Journal of the Chilean Chemical Society, vol. 53, No. 3, pp. 1549-1564, (2008).
Biniek, Laure, et al., "A [3,2-b]thienothiophene-a/t-benzothiadiazole Copolymer for Photovoltaic Applications: Design, Synthesis, Material Characterization and Device Performances", Journal of Materials Chemistry, vol. 19, pp. 4946-4951, (2009).
Blom, Paul W. M., et al., "Device Physics of Polymer:Fullerene Bulk Heterojunction Solar Cells", Advanced Materials, vol. 19, pp. 1551-1566, (2007).
Blouin, Nicolas, et al., "A Low-Bandgap Poly(2,7-Carbazole) Derivative for Use in High-Performance Solar Cells", Advanced Materials, vol. 19, pp. 2295-2300, (2007).
Bundgaard, Eva, et al., "Low Band Gap Polymers for Organic Photovoltaics", Solar Energy Materials & Solar Cells, vol. 91, pp. 954-985, (2007).
Cha, Soon Wook, et al., "Electroluminescence of LEDs consisting Two Layers of $Alq_3$ and High $T_g$, Blue-Light Emitting Branched Compounds", Synthetic Metals, vol. 143, pp. 97-101, (2004).

Chan, Hardy Sze on, et al., "Synthesis, Characterization and Applications of Thiophene-Based Functional Polymers", Progress in Polymer Science, vol. 23, pp. 1167-1231, (1998).
Chen, Chih-Ping, et al., "Low-Bandgap Poly(Thiophene-Phenylene-Thiophene) Derivatives with Broaden Absorption Spectra for Use in High-Performance Bulk-Heterojunction Polymer Solar Cells", Journal of the American Chemical Society, vol. 130, pp. 12828-12833, (2008).
Chen, Hsiang-Yu, et al., "Polymer Solar Cells with Enhanced Open-Circuit Voltage and Efficiency", Nature Photonics, vol. 3, pp. 649-653, (Nov. 2009).
Frey, Joseph, et al., "Improved Synthesis of dithieno[3,2-b:2',3'-d]thiophene (DTT) and Derivatives for Cross Coupling", Chemical Communications, vol. 20, pp. 2424-2425, (2002).
Gong, Cheng, et al., "Polymer Solar Cell based on poly(2,6-bis(3-alkylthiophen-2-yl)dithieno-[3,2-b;2',3'-d]thiophene)", Solar Energy Materials & Solar Cells, vol. 93, pp. 1928-1931, (2009).
Greenham, N. C., et al., "Efficient Light Emitting Diodes based on Polymers with High Electron Affinities", Nature, vol. 365, pp. 628-630, (Oct. 14, 1993).
Günes, Serap, et al., "Conjugated Polymer-Based Organic Solar Cells", Chemical Reviews, vol. 107, No. 4, pp. 1324-1338, (2007).
Hou, Jianhui, et al., "Synthesis, Characterization, and Photovoltaic Properties of a Low Band Gap Polymer Based on Silole-Containing Polythiophenes and 2,1,3-Benzothiadiazole", Journal of the American Chemical Society, vol. 130, No. 48, pp. 16144-16145, (2008).
Hughes, Gregory, et al., "Electron-Transporting Materials for Organic Electroluminescent and Electrophosphorescent Devices", Journal of Materials Chemistry, vol. 15, pp. 94-107, (2005).
PCT International Search Report and Written Opinion of the International Searching Authority issued in PCT Application No. PCT/SG2009/000393, 10 pages, (Dec. 24, 2009).
PCT International Preliminary Report on Patentability issued in PCT Application No. PCT/SG2009/000393, 4 pages, (Sep. 27, 2011).
PCT International Search Report and Written Opinion of the International Searching Authority issued in PCT Application No. PCT/SG2010/000172, 13 pages, (Jul. 29, 2010).
PCT International Preliminary Report on Patentability issued in PCT Application No. PCT/SG2010/000172, 4 pages, (Jul. 25, 2011).
PCT Notification of Transmittal of International Preliminary Report on Patentability (Chapter II of the Patent Cooperation Treaty) issued in PCT Application No. PCT/SG2010/000174, 6 pages, (Dec. 7, 2011).
PCT International Search Report and Written Opinion of the International Searching Authority issued in PCT Application No. PCT/SG2010/000175, 6 pages, (Jul. 12, 2010).
PCT International Preliminary Report on Patentability (Chapter I of the Patent Cooperation Treaty) issued in PCT Application No. PCT/SG2010/000175, 4 pages, (Feb. 28, 2012).
Katz, Howard E., et al., "Synthetic Chemistry for Ultrapure, Processable, and High-Mobility Organic Transistor Semiconductors", Accounts of Chemical Research, vol. 34, No. 5, pp. 359-369, (2001).
Kietzke, Thomas, et al., "Efficient Polymer Solar Cells Based on M3EH-PPV", Chemistry of Materials, vol. 17, No. 26, pp. 6532-6537, (2005).
Kietzke, Thomas, et al., "Effect of Annealing on the Characteristics of Organic Solar Cells: Polymer Blends with a 2-Vinyl-4,5-dicyanoimidazole Derivative", Macromolecules, vol. 40, No. 13, pp. 4424-4428, (2007).
Kim, Bong Soo, et al., "Charge Mobilities and Luminescence Characteristics of Blue-Light Emitting Bent Carbazole Trimers Connected through Vinylene Linkers—Effect of Nitrile Substituents", Synthetic Metals, vol. 145, pp. 229-235, (2004).
Kim, Felix Sunjoo, et al., "High-Mobility Ambipolar Transistors and High-Gain Inverters from a Donor-Acceptor Copolymer Semiconductor", Advanced Materials, vol. 22, pp. 478-482, (2010).
Kim, Sun Woong, et al., "2.4-in. Monochrome Small Molecular OLED Display for Mobile Application", Current Applied Physics, vol. 2, pp. 335-338, (2002).
Kitamura, Chitoshi, et al., "Synthesis and Properties of a New Ethyne-Linked Donor/Acceptor Pentamer", Tetrahedron Letters, vol. 43, pp. 3373-3376, (2002).

(56) References Cited

OTHER PUBLICATIONS

Kroon, Renee, et al., "Small Bandgap Polymers for Organic Solar Cells (Polymer Material Development in the Last 5 Years)", Polymer Reviews, vol. 48, pp. 531-582, (2008).
Kulkarni, Abhishek P., et al., "Electron Transport Materials for Organic Light-Emitting Diodes", Chemistry of Materials, vol. 16, No. 23, pp. 4556-4573, (2004).
Li, Jun, et al., "High-Performance Thin-Film Transistors from Solution-Processed Dithienothiophene Polymer Semiconductor Nanoparticles", Chemistry of Materials, vol. 20, No. 6, pp. 2057-2059, (Mar. 25, 2008).
Li, Ji-Cheng, et al., "Synthesis and Characterization of a Thiophene-Benzothiadiazole Copolymer", Macromolecular Research, vol. 17, No. 5, pp. 356-360, (2009).
Li, Yuning, et al., "Poly(2,5-bis(2-thienyl)-3,6-dialkylthieno[3,2-$b$]thiophene)s—High-Mobility Semiconductors for Thin-Film Transistors", Advanced Materials, vol. 18, pp. 3029-3032, (2006).
Li, Yongfang, et al., "Conjugated Polymer Photovoltaic Materials with Broad Absorption Band and High Charge Carrier Mobility", Advanced Materials, vol. 20, pp. 2952-2958, (2008).
Liang, Fushun, et al., "Design and Synthesis of Alternating Regioregular Oligothiophenes/Benzothiadiazole Copolymers for Organic Solar Cells", Macromolecules, vol. 42, No. 16, pp. 6107-6114, (2009).
Liang, Yongye, et al., "Development of New Semiconducting Polymers for High Performance Solar Cells", Journal of the American Chemical Society, vol. 131, No. 1, pp. 56-57, (2009).
Lloyd, Matthew T., et al., "Photovoltaics from Soluble Small Molecules", Materials Today, vol. 10, No. 11, pp. 34-41, (Nov. 2007).
Lu, Jianping, et al., "Crystalline Low Band-Gap Alternating Indolocarbazole and Benzothiadiazole-Cored Oligothiophene Copolymer for Organic Solar Cell Applications", Chemical Communications, pp. 5315-5317, (2008).
Ma, Wanli, et al., "Thermally Stable, Efficient Polymer Solar Cells with Nanoscale Control of the Interpenetrating Network Morphology", Advanced Functional Materials, vol. 15, pp. 1617-1622, (2005).
Mayer, Alex C., et al., "Polymer-Based Solar Cells", Materials Today, vol. 10, No. 11, pp. 28-33, (Nov. 2007).
McCulloch, Iain, et al., "Liquid-Crystalline Semiconducting Polymers with High Charge-Carrier Mobility", Nature Materials, vol. 5, pp. 328-333, (Apr. 2006).
Meier, Herbert, et al., "The Effect of 2,2-dicyanovinyl Groups as Electron Acceptors in Push-Pull Substituted oligo(1,4-phenylenevinylene)s", Tetrahedron Letters, vol. 44, pp. 1915-1918, (2003).
Meier, Herbert, "Conjugated Oligomers with Terminal Donor-Acceptor Substitution", Angewandte Chemie International Edition, vol. 44, pp. 2482-2506, (2005).
Mühlbacher, David, et al., "High Photovoltaic Performance of a Low-Bandgap Polymer", Advanced Materials, vol. 18, pp. 2884-2889, (2006).
Ong, Beng S., et al., "High-Performance Semiconducting Polythiophenes for Organic Thin-Film Transistors", Journal of the American Chemical Society, vol. 126, No. 11, pp. 3378-3379, (2004).
Ooi, Zi En, et al., "Solution Processable Bulk-Heterojunction Solar Cells using a Small Molecule Acceptor", Journal of Materials Chemistry, vol. 18, pp. 4619-4622, (2008).
Pan, Hualong, et al., "Benzodithiophene Copolymer—A Low-Temperature, Solution-Processed High-Performance Semiconductor for Thin-Film Transistors", Advanced Functional Materials, vol. 17, pp. 3574-3579, (2007).
Pan, Hualong, et al., "Low-Temperature, Solution-Processed, High-Mobility Polymer Semiconductors for Thin-Film Transistors", Journal of the American Chemical Society, vol. 129, No. 14, pp. 4112-4113, (2007).
Peet, J., et al., "Efficiency Enhancement in Low-Bandgap Polymer Solar Cells by Processing with Alkane Dithiols", Nature Materials, vol. 6, pp. 497-500, (Jul. 2007).
Salleo, A., et al., "Polymer Thin-Film Transistors with Chemically Modified Dielectric Interfaces", Applied Physics Letters, vol. 81, No. 23, pp. 4383-4385, (Dec. 2, 2002).
Shin, Richard Yee Cheong, et al., "N-Type Conjugated Materials Based on 2-Vinyl-4,5-dicyanoimidazoles and Their Use in Solar Cells", Chemistry of Materials, vol. 19, No. 8, pp. 1892-1894, (2007).
Shin, Richard Y. C., et al., "Electron-Accepting Conjugated Materials Based on 2-Vinyl-4,5-dicyanoimidazoles for Application in Organic Electronics", Journal of Organic Chemistry, vol. 74, No. 9, pp. 3293-3298, (2009).
Sirringhaus, Henning, et al., "Integrated Optoelectronic Devices Based on Conjugated Polymers", Science, vol. 280, pp. 1741-1744, (Jun. 12, 1998).
Sirringhaus, H., et al., "Two-Dimensional Charge Transport in Self-Organized, High-Mobility Conjugated Polymers", Nature, vol. 401, pp. 685-688, (Oct. 14, 1999).
Slooff, L. H., et al., "Determining the Internal Quantum Efficiency of Highly Efficient Polymer Solar Cells through Optical Modeling", Applied Physics Letters, vol. 90, Article 143506, 4 pages, (2007).
Subbiah, Jegadesan, et al., "Efficient Green Solar Cells via a Chemically Polymerizable Donor—Acceptor Heterocyclic Pentamer", ACS Applied Materials & Interfaces, vol. 1, No. 6, pp. 1154-1158, (2009).
Takahashi, Masabumi, et al., "Palladium-Catalyzed C-H Homocoupling of Bromothiophene Derivatives and Synthetic Application to Well-Defined Oligothiophenes", Journal of the American Chemical Society, vol. 128, No. 33, pp. 10930-10933, (2006).
Tamayo, Arnold B., et al., "A Low Band Gap, Solution Processable Oligothiophene with a Diketopyrrolopyrrole Core for Use in Organic Solar Cells", Journal of Physical Chemistry C, vol. 112, No. 30, pp. 11545-11551, (2008).
Thelakkat, Mukundan, "Star-Shaped, Dendrimeric and Polymeric Triarylamines as Photoconductors and Hole Transport Materials for Electro-Optical Applications", Macromolecular Materials and Engineering, vol. 287, No. 7, pp. 442-461, (2002).
Wang, Ergang, et al., "High-Performance Polymer Heterojunction Solar Cells of a Polysilafluorene Derivative", Applied Physics Letters, vol. 92, Article 033307, 4 pages, (2008).
Wienk, Martijn M., et al., "Narrow-Bandgap Diketo-Pyrrolo-Pyrrole Polymer Solar Cells: The Effect of Processing on the Performance", Advanced Materials, vol. 20, pp. 2556-2560, (2008).
Winder, Christoph, et al., "Low Bandgap Polymers for Photon Harvesting in Bulk Heterojunction Solar Cells", Journal of Materials Chemistry, vol. 14, pp. 1077-1086, (2004).
Wong, Henry M. P., et al., "Donor and Acceptor Behavior in a Polyfluorene for Photovoltaics", Journal of Physical Chemistry C, vol. 111, No. 13, pp. 5244-5249, (2007).
Wong, Man Shing, et al., "Synthesis and Functional Properties of Donor-Acceptor π-Conjugated Oligomers", Chemistry of Materials, vol. 15, No. 5, pp. 1198-1203, (2003).
Yu, Chao-Ying, et al., "Thiophene/Phenylene/Thiophene-Based Low-Bandgap Conjugated Polymers for Efficient Near-Infrared Photovoltaic Applications", Chemistry of Materials, vol. 21, pp. 3262-3269, (2009).
Yue, Wei, et al., "Poly(oligothiophene-alt-benzothiadiazole)s: Tuning the Structures of Oligothiophene Units toward High-Mobility "Black" Conjugated Polymers", Macromolecules, vol. 42, No. 17, pp. 6510-6518, (2009).
Zhang, Xin, et al., "Donor/Acceptor Vinyl Monomers and their Polymers: Synthesis, Photochemical and Photophysical Behaviour", Progress in Polymer Science, vol. 31, pp. 893-948, (2006).
Zhang, Shiming, et al., "Synthesis of a Soluble Conjugated Copolymer based on Dialkyl-Substituted Dithienothiophene and its Application in Photovoltaic Cells", Polymer, vol. 50, pp. 3595-3599, (2009).
Zhu, Y. et al., "Highly Luminescent 1,4-Diketo-3,6-diphenylpyrrolo[3,4-c]pyrrole- (DPP-) Based Conjugated Polymers Prepared Upon Suzuki Coupling", Macromolecules, vol. 40, No. 19, pp. 6981-6989, (2007).
Zhu, Zhengguo, et al., "Panchromatic Conjugated Polymers Containing Alternating Donor/Acceptor Units for Photovoltaic Applications", Macromolecules, vol. 40, No. 6, pp. 1981-1986, (2007).

(56) References Cited

OTHER PUBLICATIONS

Zou, Yingping, et al., "A High-Mobility Low-Bandgap Poly(2,7-carbazole) Derivative for Photovoltaic Applications", Macromolecules, vol. 42, No. 8, pp. 2891-2894, (2009).

Bundgaard, Eva, et al., "Low Band Gap Polymers for Organic Solar Cells", Proc. of SPIE, vol. 6334, pp. 63340T-1-63340T-10, (2006).

Bundgaard, Eva, et al., "Low-Band-Gap Conjugated Polymers Based on Thiophene, Benzothiadiazole, and Benzobis(thiadiazole)", Macromolecules, vol. 39, pp. 2823-2831, (2006).

Bundgaard, Eva, et al., "Bulk Heterojunctions Based on a Low Band Gap Copolymer of Thiophene and Benzothiadiazole", Solar Energy Materials and Solar Cells, Vol, 91, pp. 1631-1637, (2007).

Melucci, Manuela, et al:, "Liquid-Crystalline Rigid-Core Semiconductor Oligothiophenes: Influence of Molecular Structure on Phase Behaviour and Thin-Film Properties", Chemistry: a European Journal, vol. 13, pp. 10046-10054, (2007).

Response to PCT Written Opinion mailed Jul. 12, 2010 and PCT Demand for PCT Counterpart Application No. PCT/SG2010/000174, 50 pgs., (Jun. 28, 2011).

Response to PCT Written Opinion mailed Aug. 26, 2011 for PCT Counterpart Application No. PCT/SG2010/000174, 33 pgs., (Oct. 25, 2011).

PCT Notification concerning Transmittal of International Preliminary Report on Patentability (Chapter I of the Patent Cooperation Treaty) for PCT Application No. PCT/SG2010/000175, 5 pgs., (Mar. 8, 2012).

First Office Action for Chinese Patent Application No. 201080041373.3, 13 pages, (Apr. 28, 2013).

AMBIPOLAR POLYMERIC SEMICONDUCTOR MATERIALS AND ORGANIC ELECTRONIC DEVICES

CROSS-REFERENCE TO RELATED APPLICATIONS

This patent application is a U.S. National Phase Application under 35 U.S.C. 371 of International Application No. PCT/SG2010/000174 filed on Apr. 30, 2010, entitled AMBIPOLAR POLYMERIC SEMICONDUCTOR MATERIALS AND ORGANIC ELECTRONIC DEVICES, which claims benefit of, and priority from U.S. provisional patent application No. 61/272,182, filed on Aug. 28, 2009, the contents of which are hereby incorporated herein by reference.

FIELD OF THE INVENTION

The present invention relates to organic compounds, ambipolar semiconductor material derived from such compounds and devices comprising such ambipolar semiconductor material.

BACKGROUND OF THE INVENTION

There has been much development of organic compounds as semiconductor materials. In particular, high performance unipolar p-type and n-type polymer semiconductors have been developed in recent years, having hole and electron mobility, respectively, approaching 1 $cm^2/V \cdot s$. Polymer semiconductors with high transport mobility in thin film transistors are useful in many applications, including displays and RFIDs.

Ambipolar organic thin film transistors capable of conducting both holes and electrons in p- and n-channel region operations have drawn recent attention. Such devices can provide an alternative approach for construction of complementary digital integrated circuits which mimic the prevailing complementary metal-oxide semiconductor (CMOS) technology. Such CMOS-like digital circuits have many advantages such as greater speed, higher noise immunity, lower power dissipation, and better tolerance of variability and shifts in transistor operating characteristics as compared to non-complementary circuits.

Ambipolar transistors can be fabricated by using (i) two stacked layers of discrete p- and n-channel semiconducting materials; (ii) one two-component layer comprising a blend of unipolar p- and n-type organic semiconductors; or (iii) one layer of a single-component material with either symmetric or asymmetric electrodes.

However, the use of unipolar p-type and n-type organic semiconductors for bilayered (i) or mixed layered (ii) ambipolar OTFTs requires complicated fabrication procedures or such devices have shown poor performance. For design (iii), although many of the current organic semiconductor materials show ambipolar charge transport properties, such materials require strict operating conditions (e.g., high vacuum), special dielectric materials, or very low work function electrode materials.

Ambipolar semiconductor materials with balanced high hole and electron mobilities could greatly simplify device fabrication, especially when using a solution processing technique such as ink-jet printing for complex fabrication of logic circuits. Currently, there are very few single-component semiconducting materials that demonstrate stable ambipolar operation characteristics in an OTFT. Known ambipolar single-component semiconductor materials typically demonstrate low and unbalanced hole and electron mobilities ($10^{-5}$-0.1 $cm^2/V \cdot s$).

Very recently, an ambipolar polymer with hole mobility of 0.003 $cm^2/v \cdot s$ and electron mobility of 0.04 $cm^2/V \cdot s$ was described in Kim et al., Adv. Mater. 2010, 22, 478-482.

Accordingly, there is a need for production of alternative ambipolar organic materials useful for production of efficient electronic devices.

SUMMARY OF THE INVENTION

The invention relates to organic compounds that can be used as ambipolar semiconductor materials for electron and hole transport in organic electronic devices.

The compounds of the invention incorporate alternating blocks of electron accepting groups and electron donating groups. The compounds are polymers comprising a repeating unit that is based on a core planar acceptor moiety that is deficient in electrons and can provide electron transport properties and a donor moiety that is rich in electrons to provide hole transport properties. An additional acceptor moiety contributes, along with the core acceptor group, provision of a low LUMO energy level for efficient electron injection and transport. The donor and acceptor groups provide balanced electron and hole transport.

The compounds of the invention may exhibit high, well-balanced electron and hole mobilities. Thus, the compounds may be useful as a single-component ambipolar semiconductor material for inclusion in organic electronic devices, including in organic thin film transistors.

Thus, in one aspect, the present invention provides a compound of formula I:

$$[D_a\text{-}A_{core}\text{-}D_b\text{-}A_c\text{-}]_n \qquad (I)$$

wherein each $A_{core}$ is an electron accepting fused heteroaromatic group having at least one nitrogen atom in the backbone of the heteroaromatic group and at least one S, O or Se atom either in the backbone of the heteroaromatic group or as a conjugated substituent on the heteroaromatic group; each D is an independently selected conjugated electron donating aromatic or heteroaromatic group having from 5 to 50 backbone atoms, each D optionally substituted with one or more electron donating substituents or electron withdrawing substituents, provided that even when substituted the electronic character of each D is electron donating; each A is an independently selected conjugated electron accepting aromatic or heteroaromatic group having from 5 to 50 backbone atoms or an ethenylene group substituted with one or two electron withdrawing substituents, each A being optionally substituted with one or more electron donating substituents or electron withdrawing substituents provided that even when substituted the electronic character of each A is electron accepting; n is an integer having a value of from 2 to 10000; and each a, each b and each c is independently an integer from 1 to 4.

In some embodiments, the compound has formula Ia:

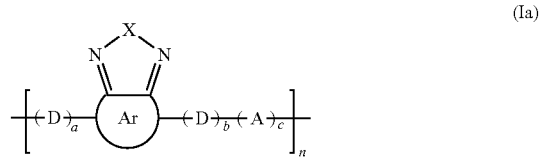

(Ia)

wherein each Ar is a fused aromatic or heteroaromatic divalent moiety which has, including the two atoms of the $C_2N_2X$ ring to which Ar is fused, from 5 to 40 backbone atoms; each X is independently S, O or Se; each D is independently an electron donating group that includes at least a five-membered conjugated heterocyclic moiety that contains at least one heteroatom that is S, O or Se, and which may further include one or more additional heteroatoms, including N, S, O or Se, and which may be optionally substituted.

For formula Ia, in some embodiments each Ar may be independently one of Ar1 to Ar8 and each Ar may be optionally substituted:

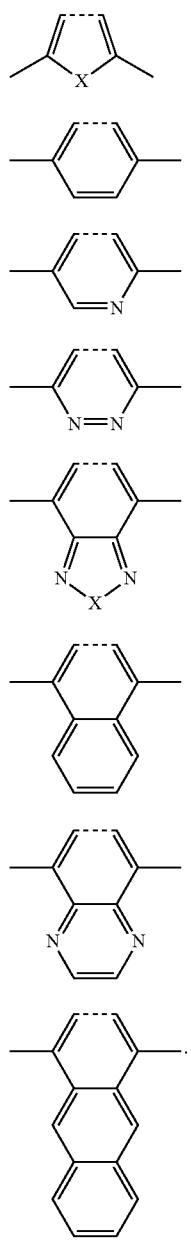

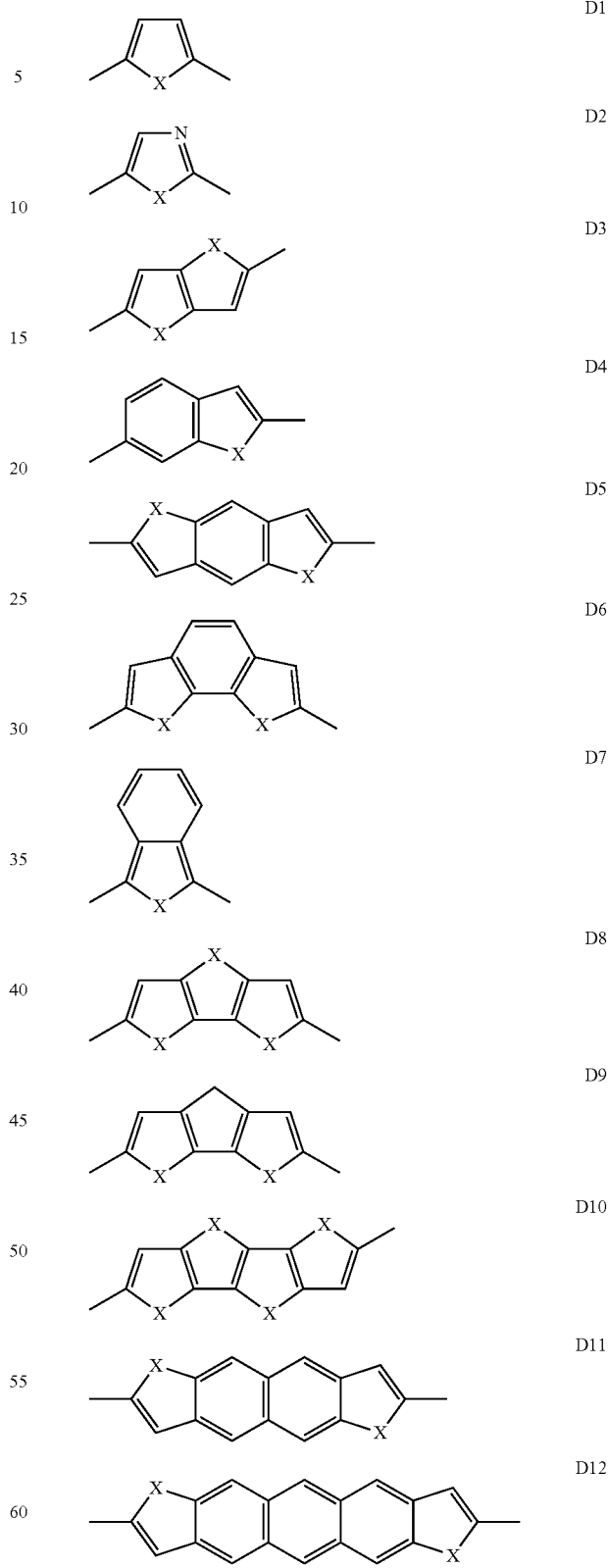

wherein each X is independently S, O or Se.

For formula Ia, in some embodiments each D may be independently one of D1 to D12 and each D may be optionally substituted:

For formula Ia, each A may be independently one of A1 to A19 and each A may be optionally substituted:

A1 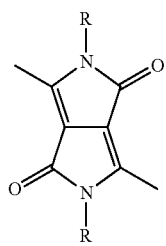
A2 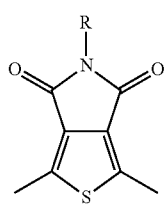
A3 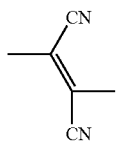
A4 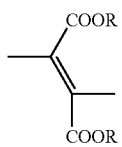
A5 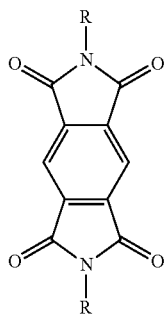
A6 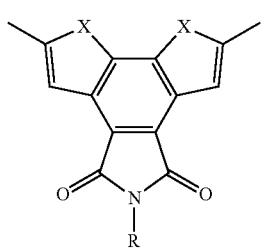
A7 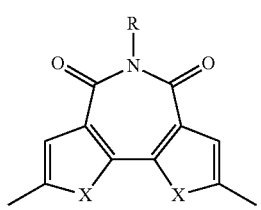
A8 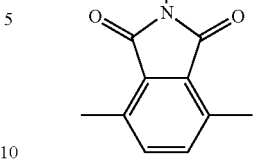
A9 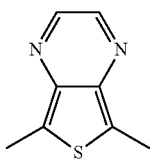
A10 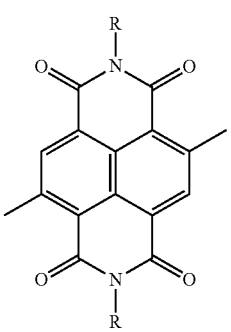
A11 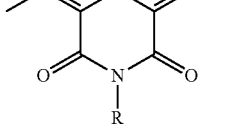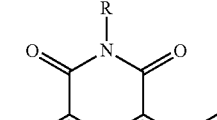
A12 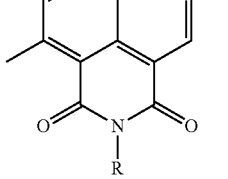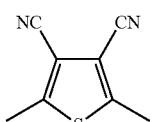
A13 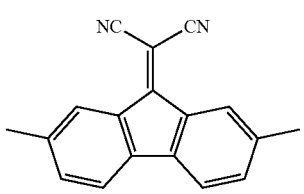

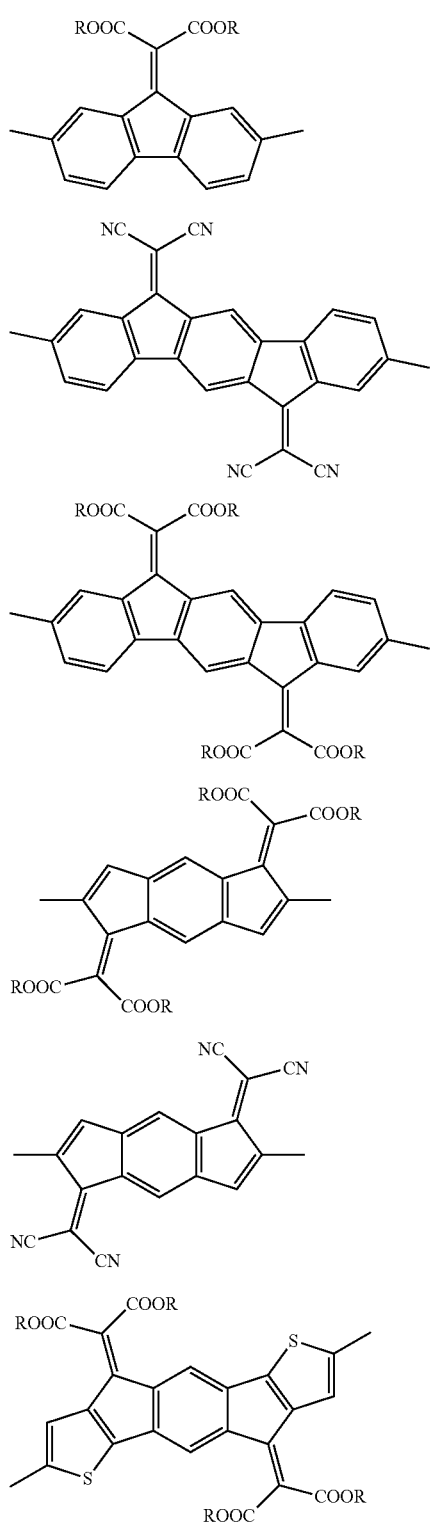

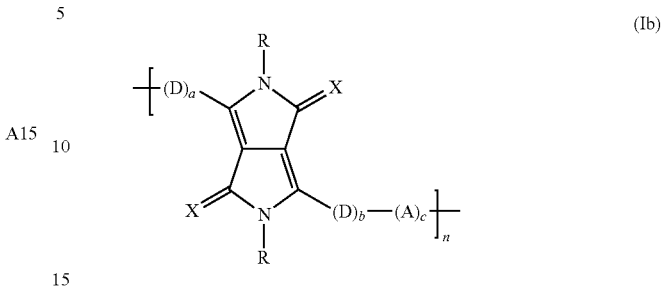

wherein each X is independently S, O or Se; and each R is independently straight or branched $C_1$-$C_{40}$ alkyl, straight or branched alkoxy having from 1 to 40 carbons in the alkyl portion, $C_6$-$C_{40}$ aryl, $C_6$-$C_{40}$ substituted aryl, heteroaryl having from 5 to 40 backbone atoms, substituted heteroaryl having from 5 to 40 backbone atoms, any of which may be optionally substituted with F, Cl or CN, where appropriate.

In some embodiments, the compound may have formula Ib:

wherein each R is independently straight or branched $C_1$-$C_{40}$ alkyl, straight or branched alkoxy having from 1 to 40 carbons in the alkyl portion, $C_6$-$C_{40}$ aryl, $C_6$-$C_{40}$ substituted aryl, heteroaryl having from 5 to 40 backbone atoms, substituted heteroaryl having from 5 to 40 backbone atoms, any of which may be optionally substituted with F, Cl or CN, where appropriate; and each X is independently S, O or Se.

In formula Ib, each D may be independently one of D13 to D27 and each D may be optionally substituted:

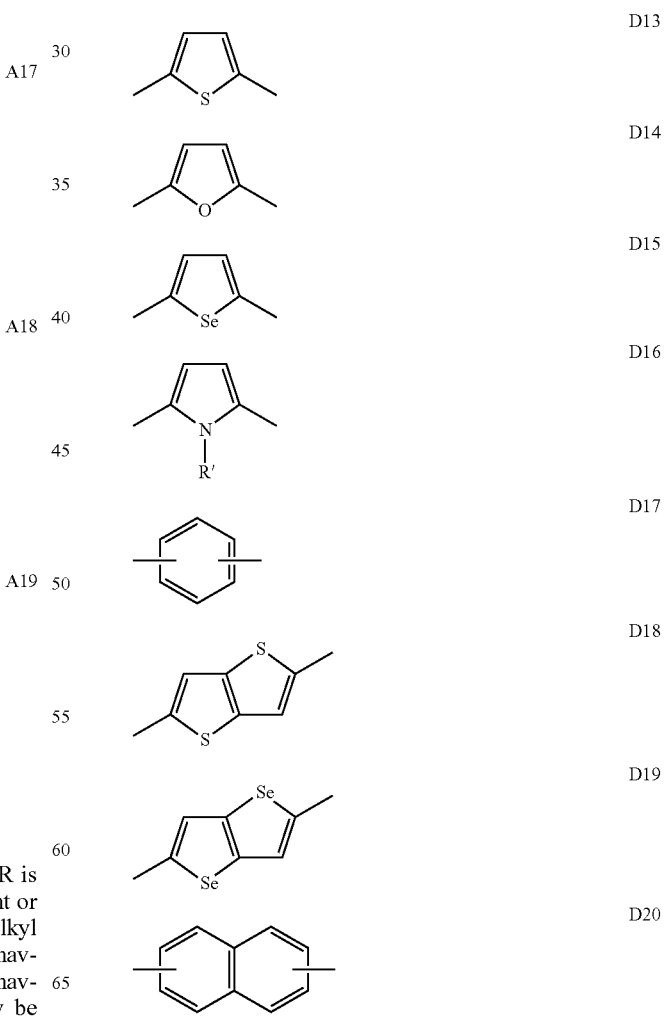

-continued

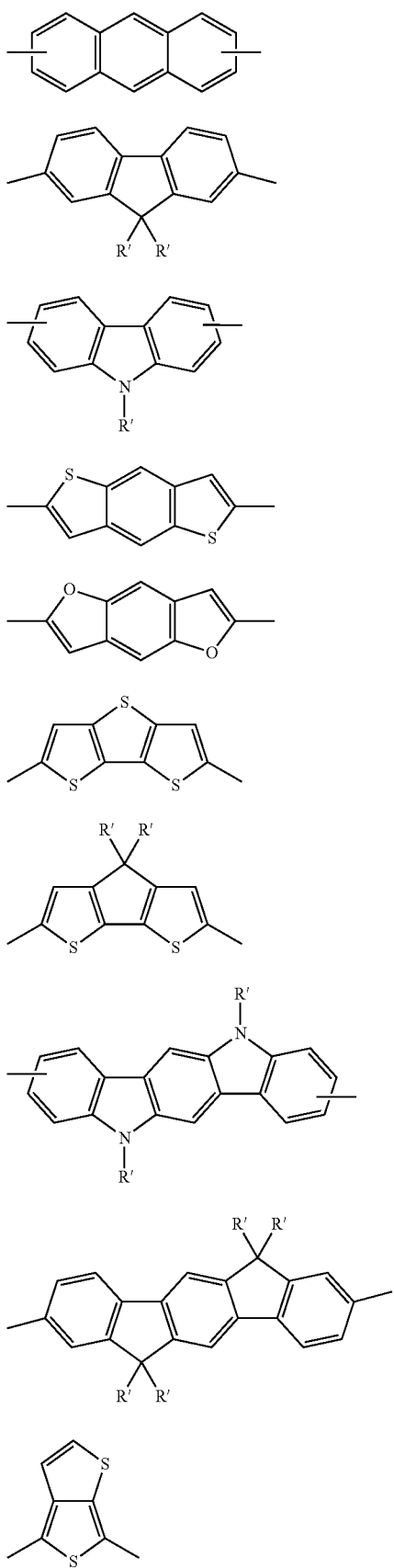

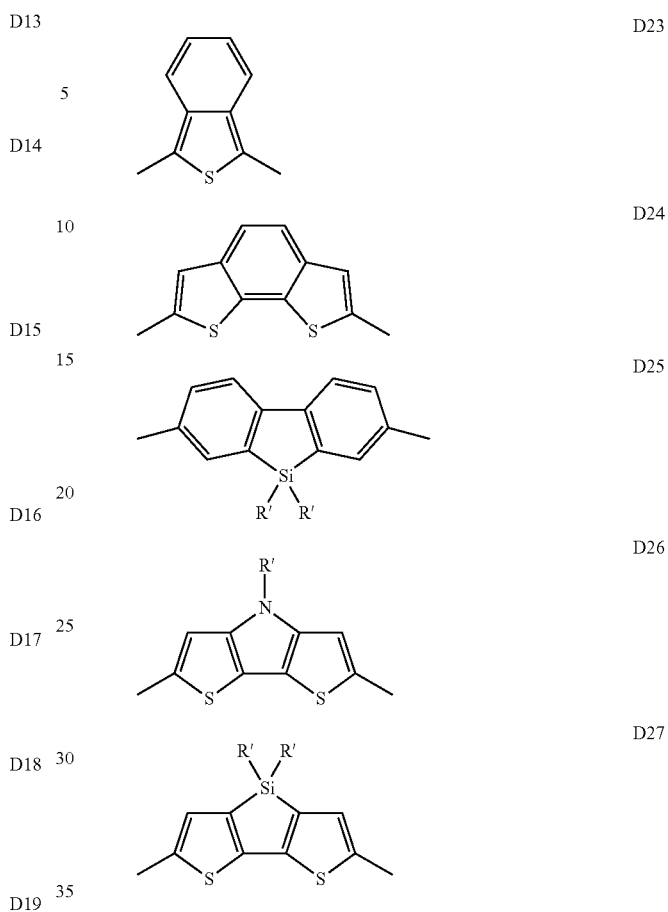

wherein each R' is independently straight or branched $C_1$-$C_{40}$ alkyl, straight or branched alkoxy having from 1 to 40 carbons in the alkyl portion, $C_6$-$C_{40}$ aryl, $C_6$-$C_{40}$ substituted aryl, heteroaryl having from 5 to 40 backbone atoms, substituted heteroaryl having from 5 to 40 backbone atoms, any of which may be optionally substituted with F, Cl or CN, where appropriate.

In formula Ib, each A may be independently one of A20 to A35 and each A may be optionally substituted:

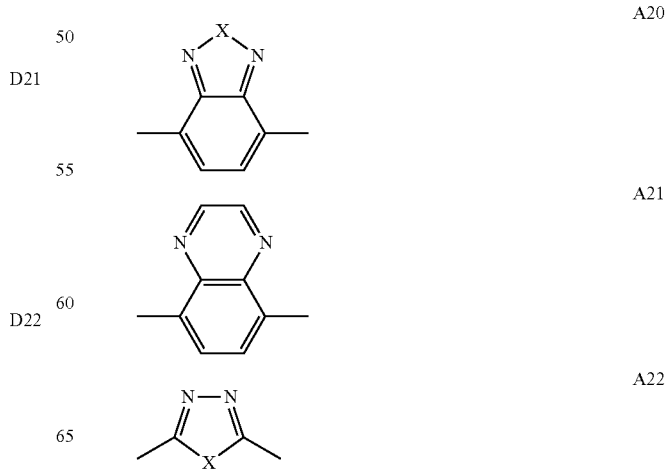

-continued

A23 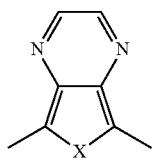

A24 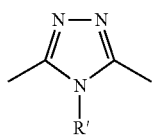

A25 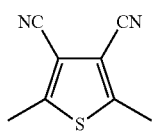

A26 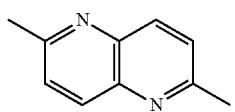

A27 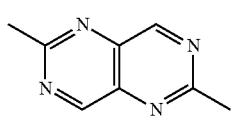

A28 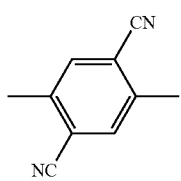

A29 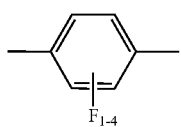

A30 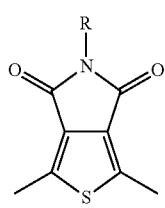

-continued

A31 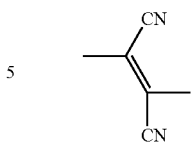

A32 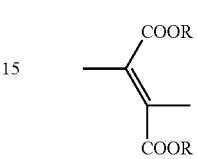

A33 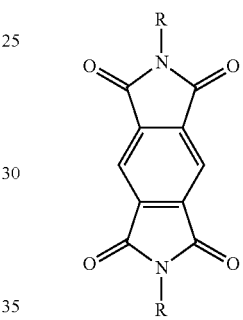

A34 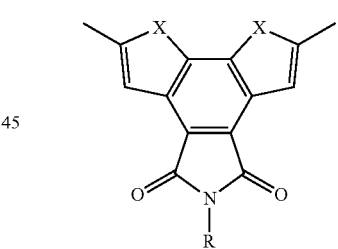

A35 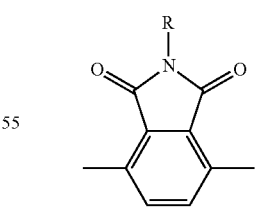

wherein each X is independently S, O or Se; and each R and each R' is independently straight or branched $C_1$-$C_{40}$ alkyl, straight or branched alkoxy having from 1 to 40 carbons in the alkyl portion, $C_6$-$C_{40}$ aryl, $C_6$-$C_{40}$ substituted aryl, heteroaryl having from 5 to 40 backbone atoms, substituted heteroaryl having from 5 to 40 backbone atoms, any of which may be optionally substituted with F, Cl or CN, where appropriate.

In some embodiments, the compound of the invention may be any one of compounds 1 to 37:
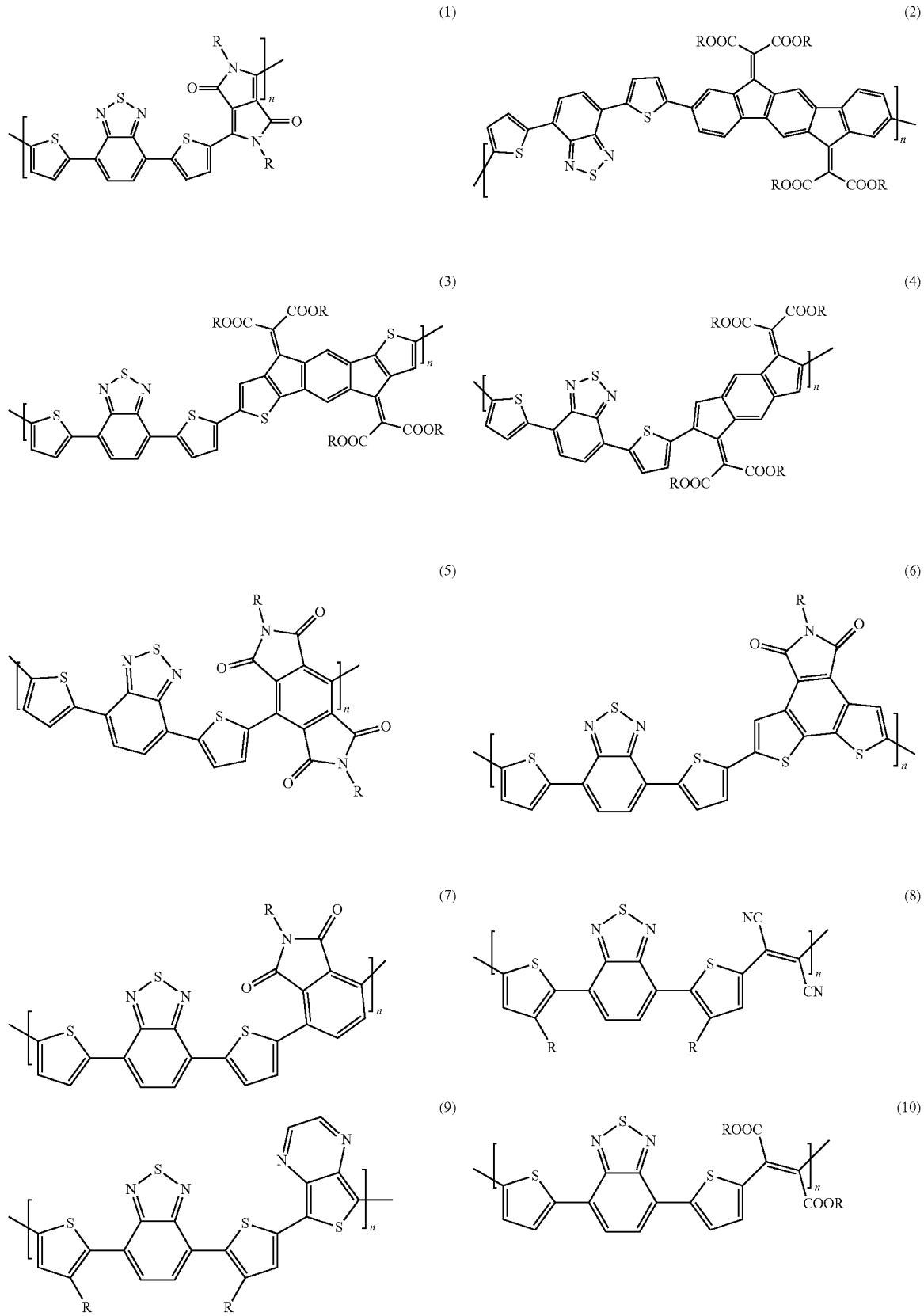

-continued
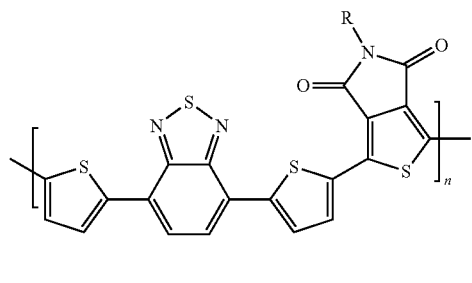
(11)
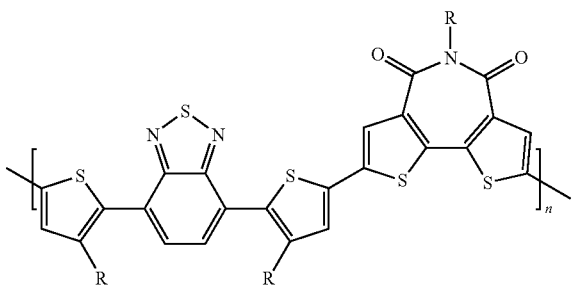
(12)
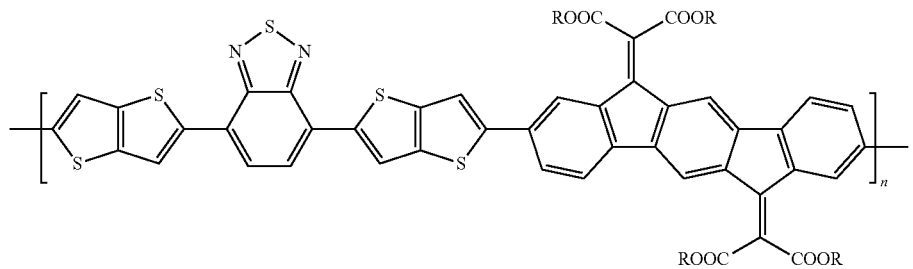
(13)
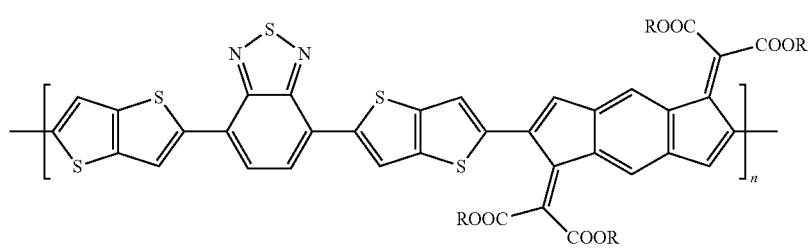
(14)
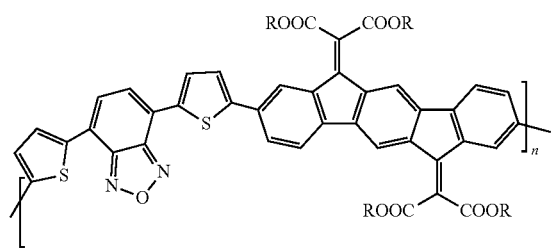
(15)
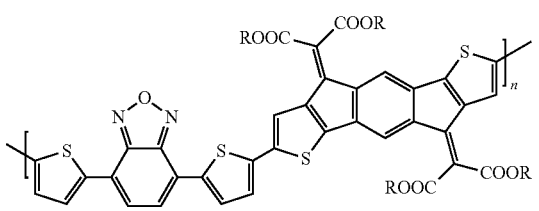
(16)
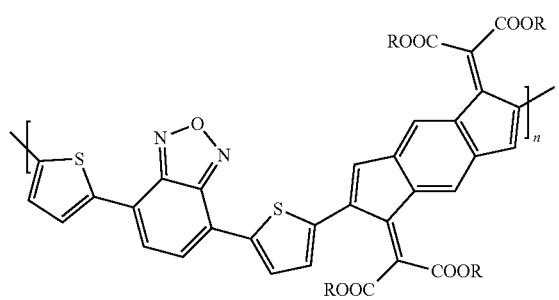
(17)
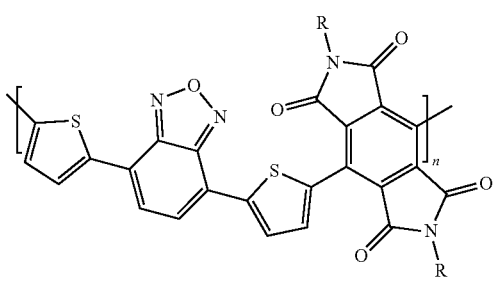
(18)

-continued
(19)
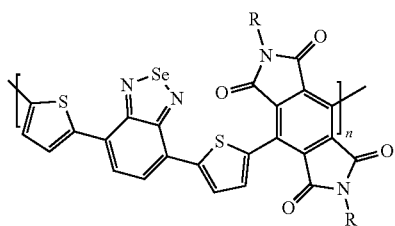
(20)
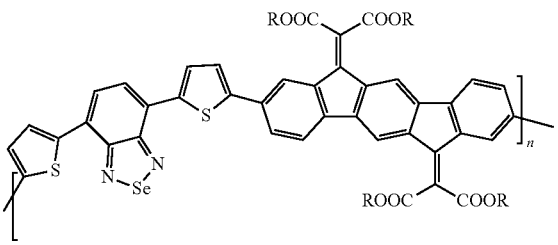
(21)
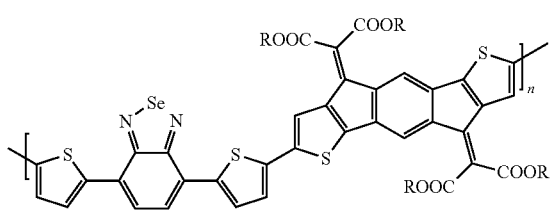
(22)
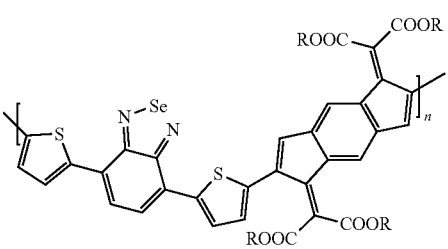
(23)
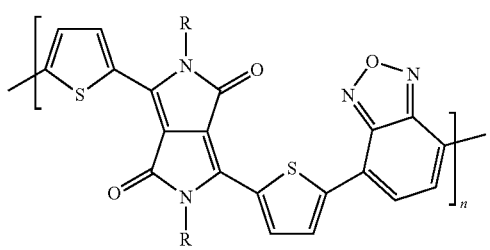
(24)
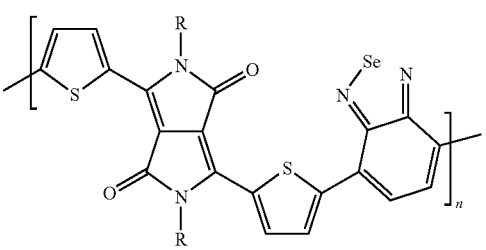
(25)
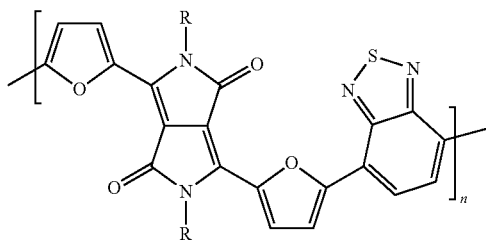
(26)
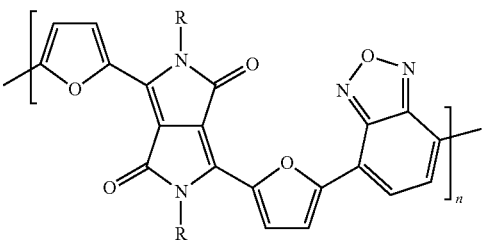
(27)
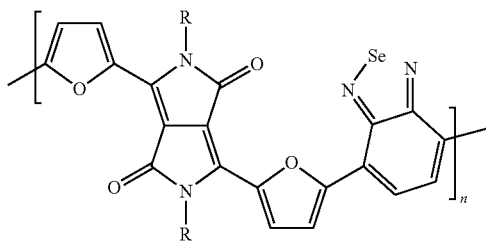
(28)
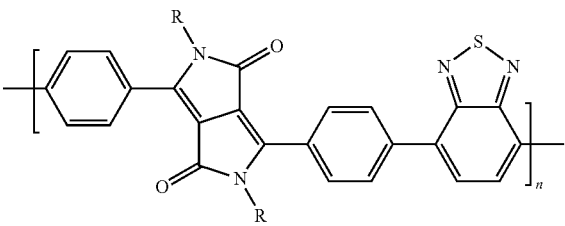
(29)
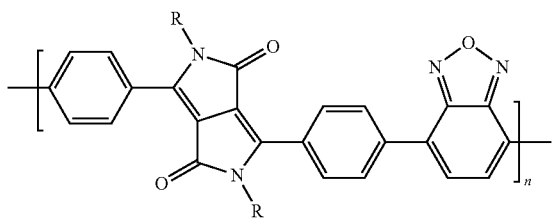
(30)
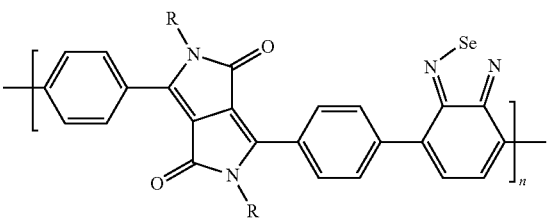

-continued

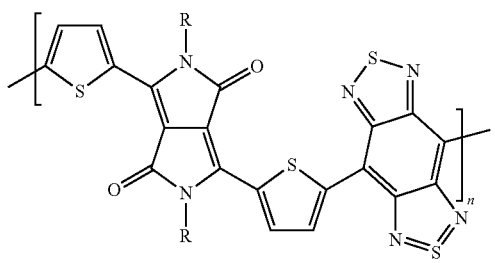
(31)

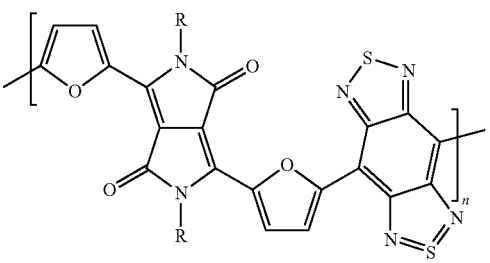
(32)

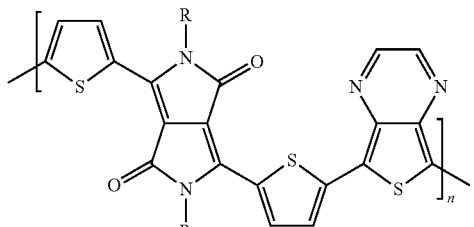
(33)

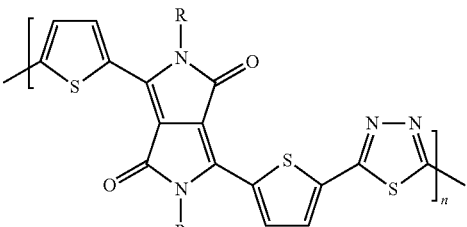
(34)

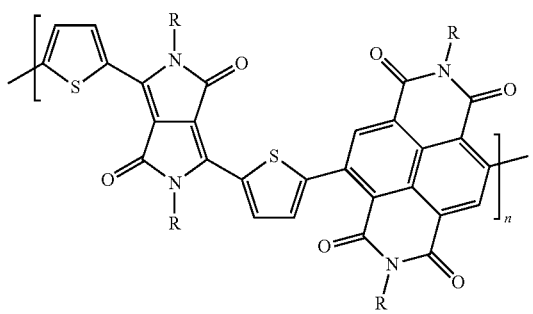
(35)

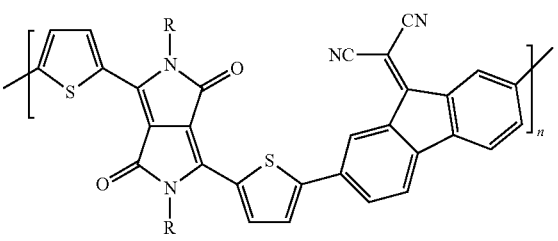
(36)

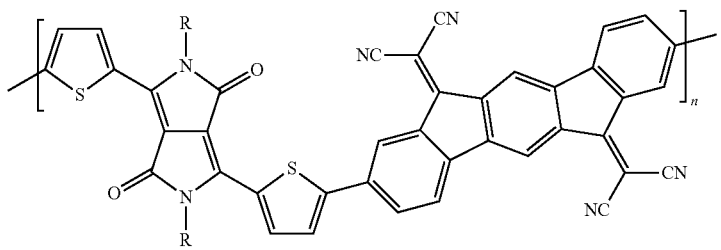
(37)

wherein each R is independently straight or branched $C_1$-$C_{40}$ alkyl, straight or branched alkoxy having from 1 to 40 carbons in the alkyl portion, $C_6$-$C_{40}$ aryl, $C_6$-$C_{40}$ substituted aryl, heteroaryl having from 5 to 40 backbone atoms, substituted heteroaryl having from to 40 backbone atoms, any of which may be optionally substituted with F, Cl or CN, where appropriate.

In another aspect, the invention also provides a thin film comprising a compound of the invention.

In another aspect, the invention also provides an organic electronic device comprising a compound of the invention or a thin film of the invention.

The organic electronic device may be a thin film transistor, the device comprising a gate electrode separated from a source electrode and a drain electrode by a gate dielectric, and a semiconductor material in contact with the gate dielectric and forming a conductive path between the source electrode and the drain electrode, the semiconductor material comprising a thin film of the invention. The thin film transistor may be an ambipolar thin film transistor. The source electrode and the drain electrode may be made of the same conductive material.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures, which illustrate, by way of example only, embodiments of the present invention.

Figure 1:
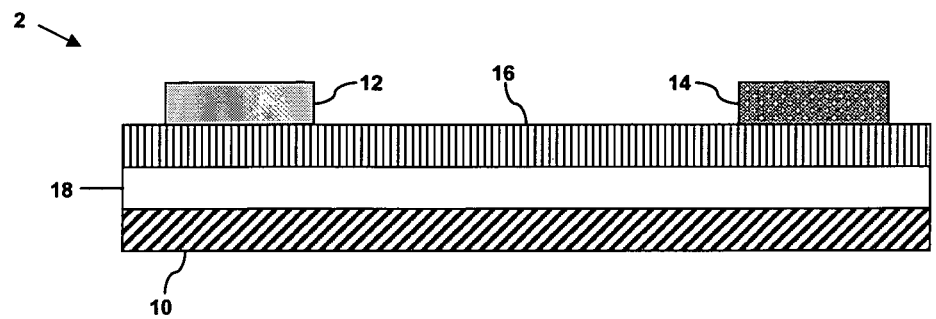
FIG. 1 is a schematic diagram of an organic thin film transistor device structure.

C. operated in hole (left) and electron (right) enhancement mode processed on OTS treated p⁺-Si/SiO$_2$ substrate.

DETAILED DESCRIPTION

Presented here are conjugated polymeric compounds that may be used as single component ambipolar semiconductor materials, and electronic devices incorporating such compounds.

The compounds may be easily synthesized and may be solution processable. Accordingly, electronic devices incorporating these compounds may be easily manufactured, including using solution deposition techniques such as inkjet printing, dip and/or spin coating, and screen printing, to name a few.

The compounds described herein contain alternating blocks of aromatic, heteroaromatic or ethenylene acceptor groups (A groups, also referred to as electron withdrawing groups or electron accepting groups), which blocks are referred to as acceptor blocks, and blocks of aromatic or heteroaromatic donor groups (D groups, also referred to as electron donating groups), which blocks are referred to as donor blocks, along the compound backbone. The acceptor blocks contribute to the electron transport, while the donor blocks contribute to the hole transport.

The repeating unit of the polymeric compounds contains a core acceptor group ($A_{core}$) with a donor block containing one or more donor groups on each side of the core acceptor group (D), and an additional acceptor group (A) containing one or more acceptor groups, thus providing the general formula I:

$$[D_a\text{-}A_{core}\text{-}D_b\text{-}A_c\text{-}]_n \qquad (I)$$

In formula I, n is an integer from 2 to 10,000, resulting in a polymer with from 2 to 10,000 repeating units.

In formula I, each of a, b and c is independently an integer from 1 to 4, resulting in a polymer having alternating donor blocks and acceptor blocks along the backbone, in which the acceptor blocks alternate between an acceptor block that is a single core acceptor group as defined below, $A_{core}$, and an acceptor block that is from one to four acceptor groups (A as defined below) other than $A_{core}$.

Each donor group and acceptor group is separated from the next donor or acceptor group in the compound backbone by a single bond, thus resulting in a conjugated molecule. The term "conjugated" as used herein in reference to the backbone of an organic molecule refers to a molecule having two or more multiple bonds (double or triple bonds) in the main chain of the molecule, each multiple bond being separated from the next consecutive multiple bond by a single bond so that it orbitals overlap not only across the multiple bond, but also across adjacent single bonds located between adjacent multiple bonds. The present compounds are composed of aromatic groups, heteroaromatic groups and ethenylene groups connected to each other by single bonds.

An ethenylene group is a divalent —CH═CH— group in which the two carbons are connected by a double bond. Any ethenylene group may have either or both hydrogens optionally substituted.

An aromatic group is a cyclic group having 4n+2π electrons, where n is an integer equal to or greater than 0. As used herein, "aromatic" is used interchangeably with "aryl" to refer to an aromatic group, regardless of the valency of the aromatic group. Thus, aryl refers to monovalent aromatic groups, divalent aromatic groups (i.e. arylenes) and higher multivalent aromatic groups. Any aromatic group may be optionally substituted.

A heteroaromatic group is an aromatic group containing one or more heteroatoms in the backbone, such as N, O, S or Se, for example. As used herein, "heteroaromatic" is used interchangeably with "heteroaryl", and a heteroaryl group refers to monovalent aromatic groups, divalent aromatic groups (i.e. heterarylenes) and higher multivalent aromatic groups containing one or more heteroatoms. Any heteroaromatic group may be optionally substituted.

It will be appreciated that an unsubstituted terminal aromatic or heteroaromatic group (also referred to as end-cap groups; i.e. at an end of a molecule that is formed from linking of multiple aromatic and/or heteroaromatic groups) will be monovalent and that an unsubstituted interior aromatic or heteroaromatic group (i.e. within a chain and not at an end of a molecule formed from linking of multiple aromatic and/or heteroaromatic groups) will be at least divalent.

As used herein when describing either electron withdrawing (i.e. accepting) or electron donating character of a particular aromatic or heteroaromatic group, such terms are used relative to the reference group of an unsubstituted phenyl group, either monovalent or divalent depending on whether the relevant group is a terminal group or falls within the backbone chain. Benzene is weakly electron donating, and thus electron donating aromatic or heteroaromatic groups described herein have equivalent or greater electron donating character as compared to a phenyl group. In contrast, electron withdrawing (electron accepting) aromatic or heteroaromatic groups described herein have less electron donating character as compared to a phenyl group. Thus, when a given aromatic or heteroaromatic group is conjugated to a phenyl group, if the pi electron cloud of the phenyl group moves toward the given aromatic or heteroaromatic group, the group is considered to be electron withdrawing; otherwise, the group is considered to be electron donating. Conventional methods and techniques can be used to determine whether a pi electron cloud of a phenyl group moves toward a given aromatic or heteroaromatic group, including electrophilic substitution reactions, or theoretical calculations of electron density.

It should be noted that for any list of possible elements or features provided in this specification, any sublist falling within a given list is also intended. Similarly, for any range provided, any subrange falling within a given range is also intended.

Each A in formula I is an independently selected conjugated electron withdrawing aromatic or heteroaromatic group having from 5 to 50 backbone atoms, or is an ethenylene group substituted with one or two electron withdrawing substituents. Thus, A may be a conjugated electron withdrawing aromatic group having from 6 to 50 backbone carbon atoms, a conjugated electron withdrawing heteroaromatic group having from 5 to 50 backbone atoms, or an ethenylene group substituted with one or two electron withdrawing substituents.

Each aromatic or heteroaromatic A may be optionally substituted with one or more substituents provided that when substituted the electronic character of each A is electron accepting, as described above. Thus, substituents include electron withdrawing substituents as well as electron donating substituents.

An "electron withdrawing substituent" is a substituent that has a tendency to pull electrons away from the backbone of the aromatic or heteroaromatic group, on which it is substituted, towards the substituent, creating an electron-rich region at or near the substituent. Electron-withdrawing substituents include halo, fluoroalkyl (including perfluoroalkyl), carboxyl, cyano, ammonio, nitro, thionyl, sulfonyl, amido linked to the backbone through the oxygen, pyridinium, phosphonium, pyridyl, thiazolyl, oxadiazolyl and triazolyl groups.

An "electron donating substituent" is a substituent that is electron rich and thus has a tendency to push electrons toward the backbone of the aromatic or heteroaromatic group, on which it is substituted, into the conjugated system created by the backbones of the A and D groups as set out in formula I. Electron donating substituents include alkoxyl, alkylthio, amino, hydroxyl, amido connected to the backbone through the nitrogen, carboxyl connected to the backbone through the oxygen, phenyl, naphthyl, thienyl, furyl, pyrrolyl, carbazolyl, alkyl, alkenyl and alkynyl.

Each D in formula I is an independently selected conjugated electron donating aromatic or heteroaromatic group having from 5 to 50 backbone atoms. Each D may be optionally substituted with one or more electron donating substituents or electron withdrawing substitutents provided that even when substituted the electronic character of each D is electron donating, as described above.

In formula I, the $A_{core}$ acceptor group is specifically chosen as an electron accepting fused heteroaromatic group, for example having from 8 to 40 backbone atoms, having at least one nitrogen atom in the backbone of the heteroaromatic group and at least one S, O or Se atom either in the backbone of the heteroaromatic group or as a conjugated substituent on the heteroaromatic group.

As with A and D above, $A_{core}$ may be further substituted with electron withdrawing or electron donating substituents, provided that even when substituted the electronic character of each $A_{core}$ is electron withdrawing.

Thus, any of each $A_{core}$, each A and each D may be substituted. Substituents include one or more, or any combination of, alkyl, aryl, heteroaryl, halogen (Cl, Br, or F), cyano or nitro.

Inclusion of the $A_{core}$ group provides a low LUMO energy level to the compound. The additional A group also contributes to a low LUMO and together the $A_{core}$ and the A groups facilitate electron transport, while the D groups facilitate hole transport, thus providing the ambipolar nature of the compounds. The particular $A_{core}$, D and A groups may be chosen to tune the LUMO and HOMO energy levels of a compound of formula I, and to balance the electron transport mobility against the hole transport mobility, thus providing compounds having high, well-balanced ambipolar charge mobility.

The $A_{core}$ group may be

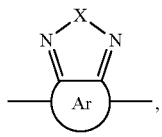

thus yielding compounds having general formula Ia:

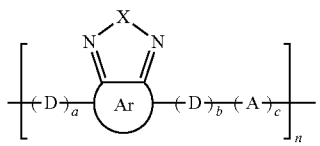

(Ia)

In the $A_{core}$ group depicted in formula Ia, X is S, O or Se. Ar is an aromatic or heteroaromatic divalent moiety fused to the $C_2N_2X$ ring, which aromatic or heteroaromatic moiety has, including the two atoms of the $C_2N_2X$ ring to which Ar is fused, from 5 to 40 backbone atoms, which may be for example C, N, S, O or Se.

In particular, the Ar moiety may be any one of the following divalent moieties, in which the dashed line represents the common bond between Ar and the $C_2N_2X$ ring to which Ar is fused:

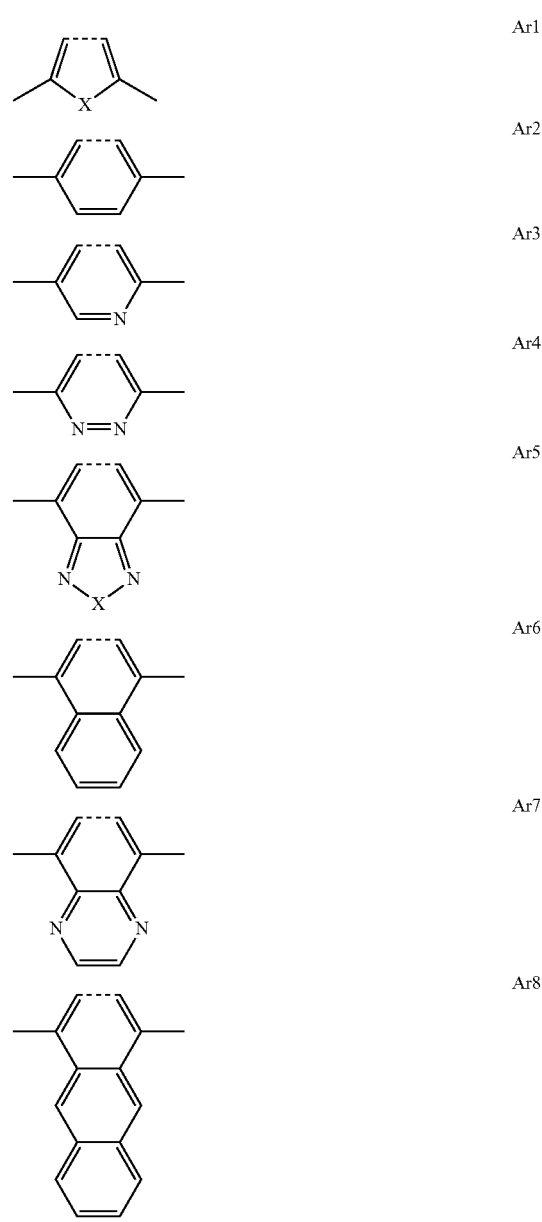

In the above depicted Ar groups, each Ar group is drawn with the appropriate number of pi electrons as if it were an independent aromatic or heteroaromatic group rather than fused as part of $A_{core}$. It will be appreciated that when fused as part of $A_{core}$, the depicted Ar moiety will have the appropriate number of pi electrons so that $A_{core}$ as a whole is aromatic.

Although the above list for various Ar moieties is provided, it is intended that in certain embodiments, each Ar may be independently chosen from any subset of the above list.

In some embodiments, the Ar moiety is Ar1. In some embodiments, the Ar moiety is Ar2. In some embodiments, the Ar moiety is Ar3. In some embodiments, the Ar moiety is Ar4. In some embodiments, the Ar moiety is Ar5. In some embodiments, the Ar moiety is Ar6. In some embodiments, the Ar moiety is Ar7. In some embodiments, the Ar moiety is Ar8.

In formula Ia, $A_{core}$ may be optionally substituted, including for example, with Br, F, Cl, nitro, cyano, one or more straight or branched $C_1$-$C_{40}$ alkyl, straight or branched alkoxy having from 1 to 40 carbons in the alkyl portion, $C_6$-$C_{40}$ aryl, $C_6$-$C_{40}$ substituted aryl, heteroaryl having from 5 to 40 backbone atoms, substituted heteroaryl having from 5 to 40 backbone atoms, any of which may be optionally substituted with F, Cl or CN, where appropriate.

In formula Ia, each D group is an electron donating group that includes at least a five-membered conjugated heterocyclic moiety that contains at least one heteroatom that is S, O or Se, and which may further include one or more additional heteroatoms, including N, S, O, or Se.

The above described D groups may have reduced steric interaction with the $A_{core}$ recited in formula Ia. The electron donating character of each D group within each D block facilitates hole injection and transport. Without being limited to any particular theory, for D groups immediately adjacent to $A_{core}$, the S, O or Se heteroatom may interact with a backbone N atom in $A_{core}$ to form a coplanar region in the backbone. The increased coplanarity in the backbone may facilitate pi-conjugation, thus facilitating charge transport.

Thus, in some embodiments, each D may independently be any one of the following divalent electron donating groups, in which X is S, O or Se:

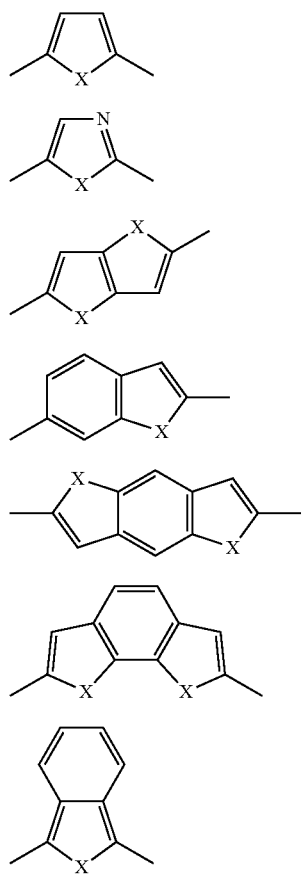

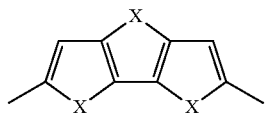

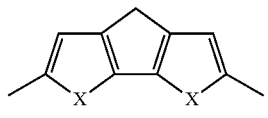

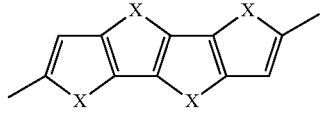

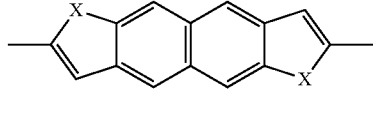

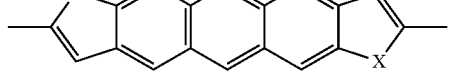

Although the above list for various D groups is provided, it is intended that in certain embodiments, each D may be independently chosen from any subset of the above list.

In certain embodiments any D may be D1. In certain embodiments, any D may be D2. In certain embodiments, any D may be D3. In certain embodiments, any D may be D4. In certain embodiments, any D may be D5. In certain embodiments, any D may be D6. In certain embodiments, any D may be D7. In certain embodiments, any D may be D8. In certain embodiments, any D may be D9. In certain embodiments, any D may be D10. In certain embodiments, any D may be D11. In certain embodiments, any D may be D12.

Any D group may be optionally substituted, including for example, with Br, F, Cl, nitro, cyano, one or more straight or branched $C_1$-$C_{40}$ alkyl, straight or branched alkoxy having from 1 to 40 carbons in the alkyl portion, $C_6$-$C_{40}$ aryl, $C_6$-$C_{40}$ substituted aryl, heteroaryl having from 5 to 40 backbone atoms, substituted heteroaryl having from 5 to 40 backbone atoms, any of which may be optionally substituted with F, Cl or CN, where appropriate.

In formula Ia, each A group is an electron accepting optionally substituted aromatic or heteroaromatic group or is an electron accepting substituted ethenylene group.

Thus, in some embodiments, each A may independently be any one of the following divalent electron accepting groups:

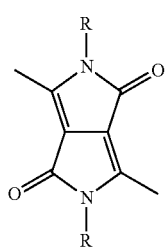

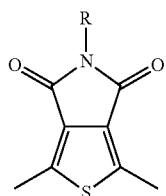
A2
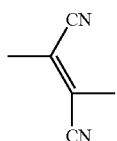
A3
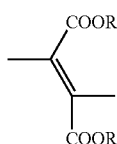
A4
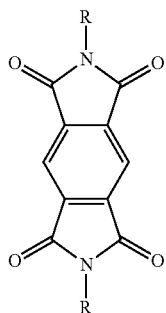
A5
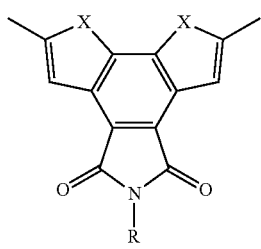
A6
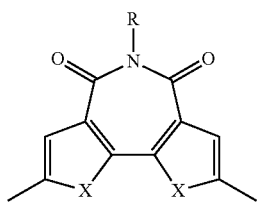
A7
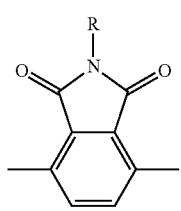
A8
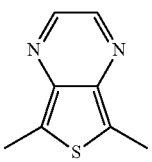
A9
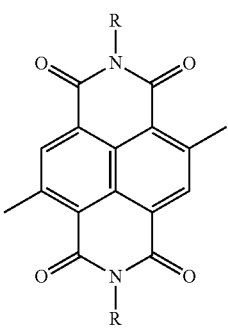
A10
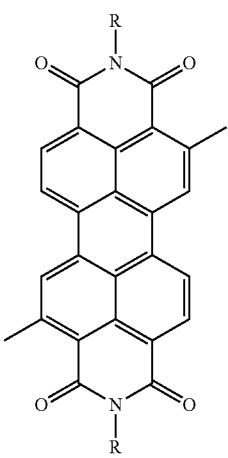
A11
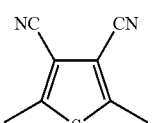
A12
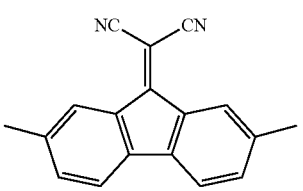
A13
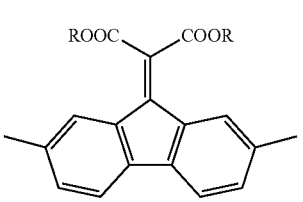
A14

A15

A16

A17

A18

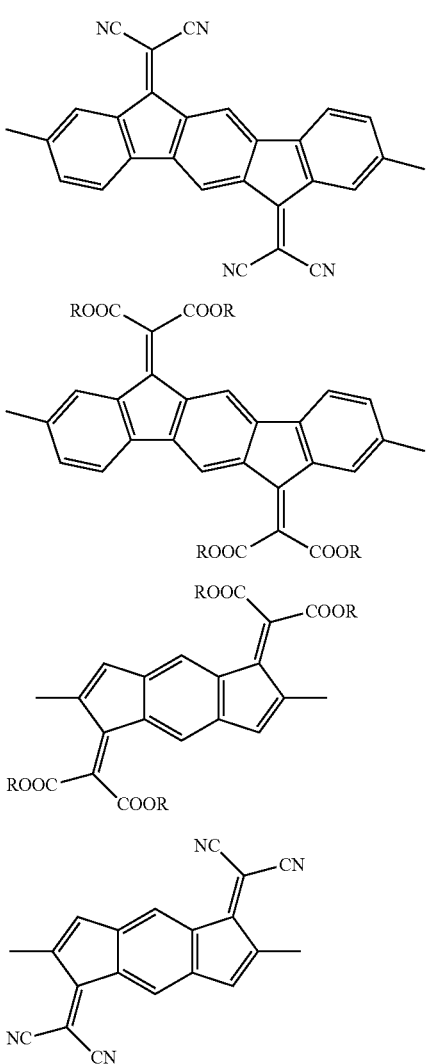

A19

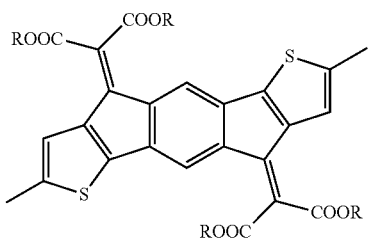

In the above A groups A1 to A19, any R may independently be straight or branched $C_1$-$C_{40}$ alkyl, straight or branched alkoxy having from 1 to 40 carbons in the alkyl portion, $C_6$-$C_{40}$ aryl, $C_6$-$C_{40}$ substituted aryl, heteroaryl having from 5 to 40 backbone atoms, substituted heteroaryl having from 5 to 40 backbone atoms, any of which may be optionally substituted with F, Cl or CN, where appropriate.

Although the above list for various A groups is provided, it is intended that in certain embodiments, each A may be independently chosen from any subset of the above list.

In certain embodiments any A may be A1. In certain embodiments, any A may be A2. In certain embodiments, any A may be A3. In certain embodiments, any A may be A4. In certain embodiments, any A may be A5. In certain embodiments, any A may be A6. In certain embodiments, any A may be A7. In certain embodiments, any A may be A8. In certain embodiments, any A may be A9. In certain embodiments, any A may be A10. In certain embodiments, any A may be A11. In certain embodiments, any A may be A12. In certain embodiments, any A may be A13. In certain embodiments, any A may be A14. In certain embodiments, any A may be A15. In certain embodiments, any A may be A16. In certain embodiments, any A may be A17. In certain embodiments, any A may be A18. In certain embodiments, any A may be A19.

By selecting specific A groups for inclusion in the compound, the LUMO energy level of the polymer can be lowered, facilitating electron injection and transport.

In various embodiments, compounds of formula Ia include the following compounds 1 to 22, in which R is as defined above:

(1)

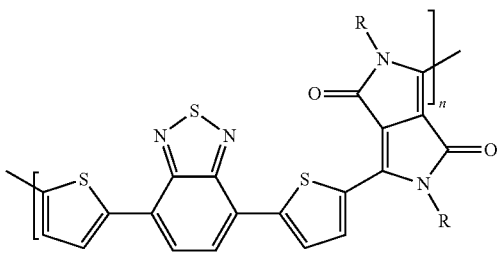

(2)

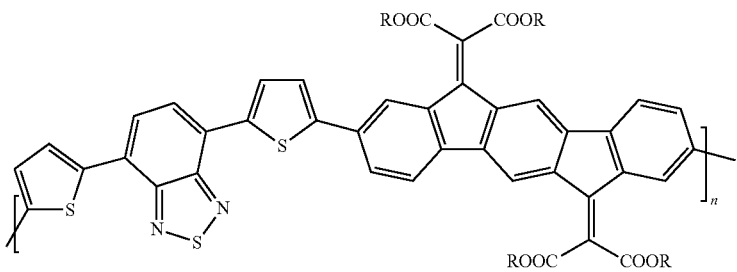

-continued
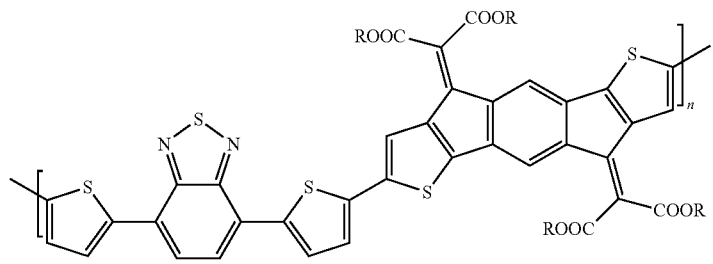
(3)
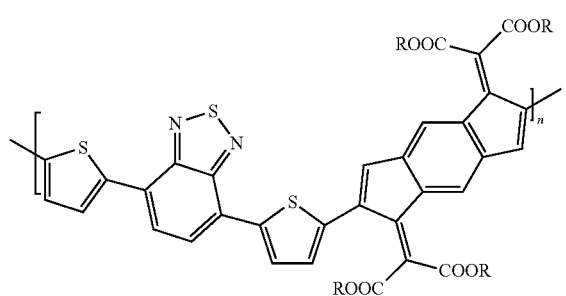
(4)
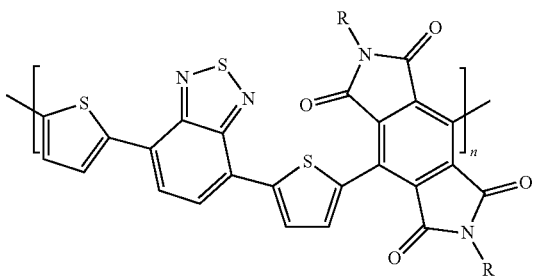
(5)
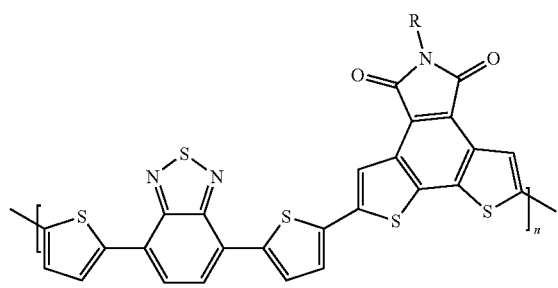
(6)
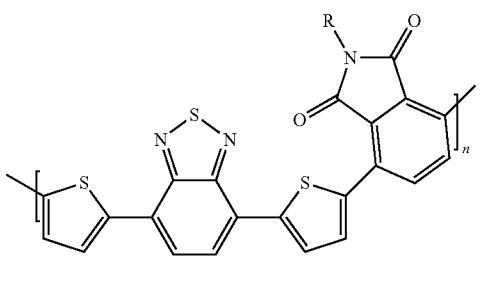
(7)
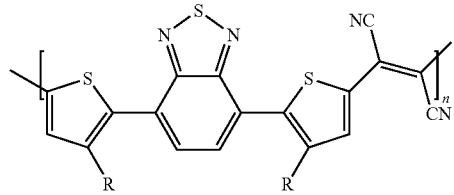
(8)
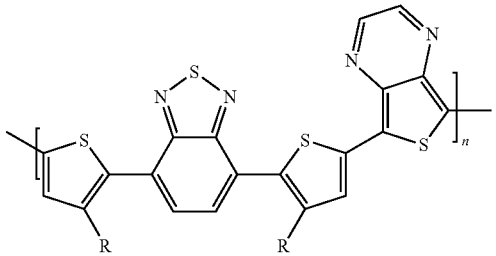
(9)
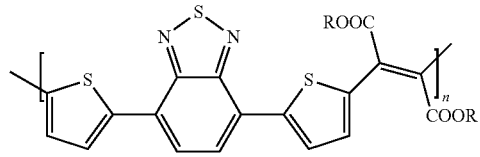
(10)
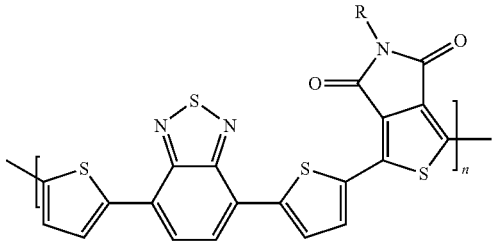
(11)

-continued
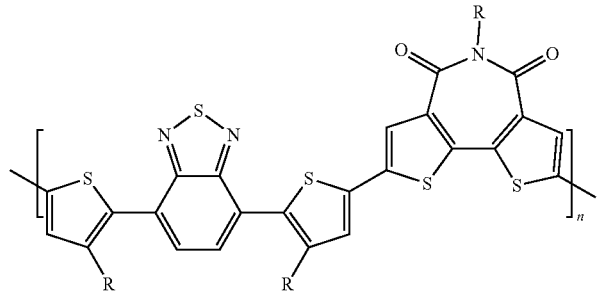
(12)
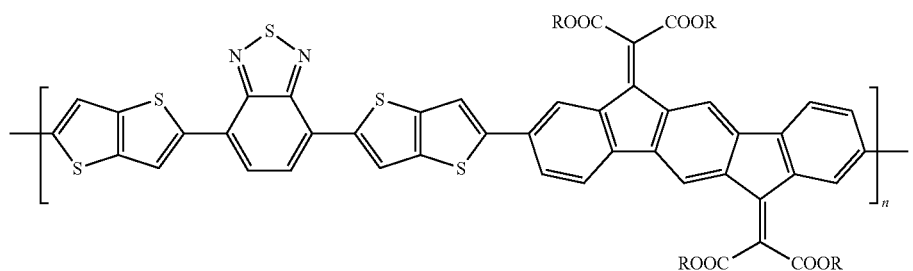
(13)
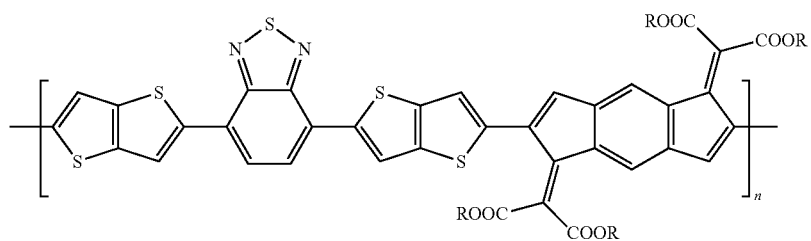
(14)
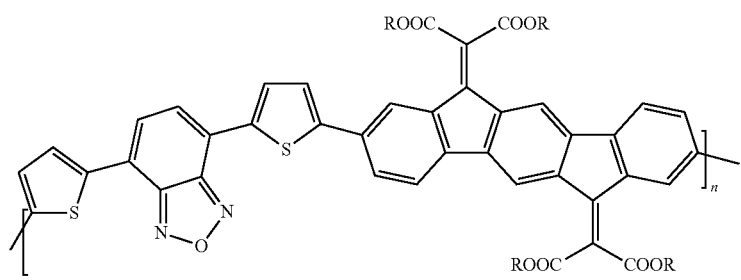
(15)
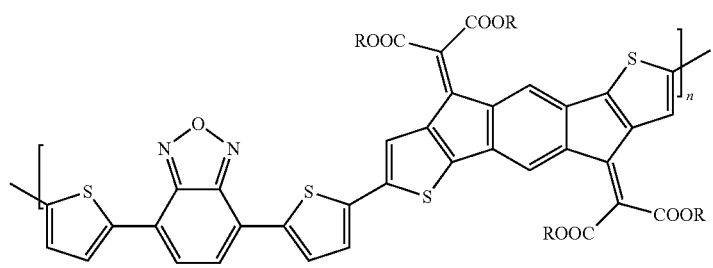
(16)

-continued

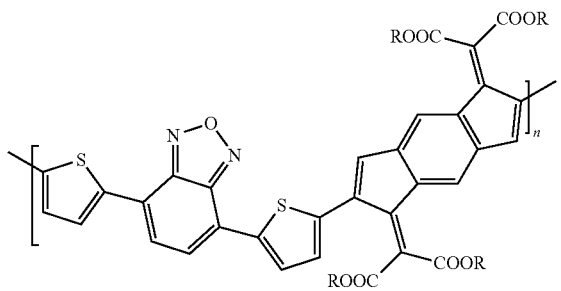
(17)

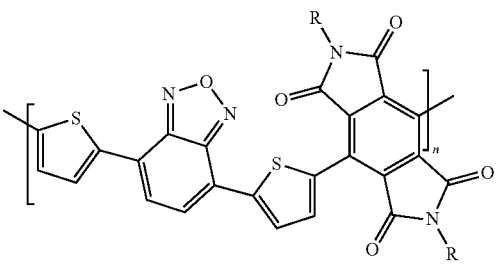
(18)

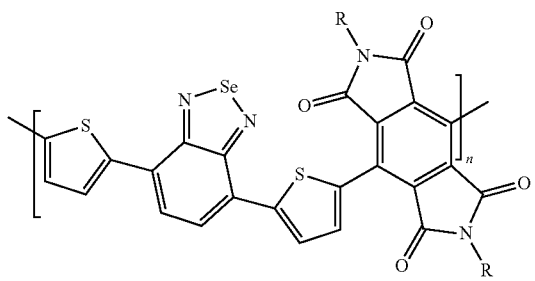
(19)

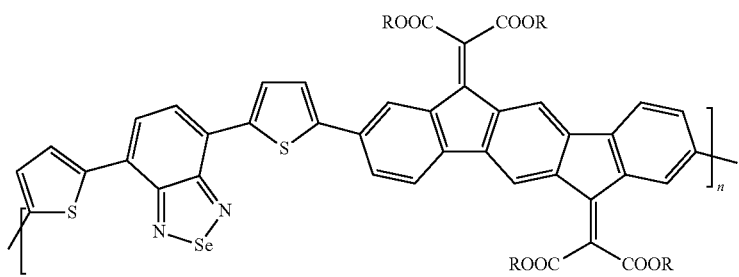
(20)

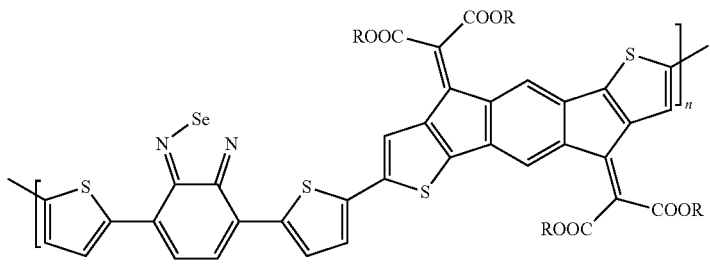
(21)

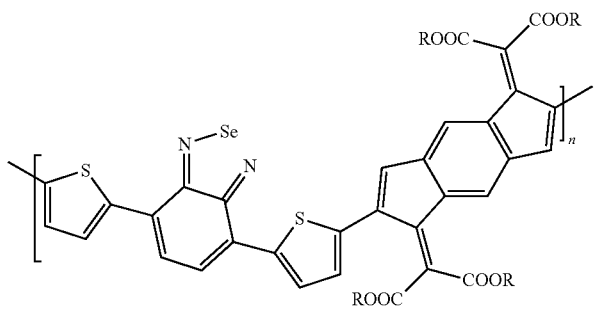
(22)

Thus, a compound of formula I may have a formula of any one of compounds 1 to 22. In certain embodiments, a compound of formula I has a formula of compound 1. In certain embodiments, a compound of formula I has a formula of compound 2. In certain embodiments, a compound of formula I has a formula of compound 3. In certain embodiments, a compound of formula I has a formula of compound 4. In certain embodiments, a compound of formula I has a formula of compound 5. In certain embodiments, a compound of formula I has a formula of compound 6. In certain embodiments, a compound of formula I has a formula of compound 7. In certain embodiments, a compound of formula I has a formula of compound 8. In certain embodiments, a compound of formula I has a formula of compound 9. In certain embodiments, a compound of formula I has a formula of compound 10. In certain embodiments, a compound of formula I has a formula of compound 11. In certain embodiments, a compound of formula I has a formula of compound 12. In certain embodiments, a compound of formula I has a formula of compound 13. In certain embodiments, a compound of formula I has a formula of compound 14. In certain embodiments, a compound of formula I has a formula of compound 15. In certain embodiments, a compound of formula I has a formula of compound 16. In certain embodiments, a compound of formula I has a formula of compound 17. In certain embodiments, a compound of formula I has a formula of compound 18. In certain embodiments, a compound of formula I has a formula of compound 19. In certain embodiments, a compound of formula I has a formula of compound 20. In certain embodiments, a compound of formula I has a formula of compound 21. In certain embodiments, a compound of formula I has a formula of compound 22.

Alternatively, the $A_{core}$ group may be thus yielding compounds having general formula Ib:

(Ib)

In the $A_{core}$ group depicted in formula Ib, X is S, O or Se. Each R may independently be straight or branched $C_1$-$C_{40}$ alkyl, straight or branched alkoxy having from 1 to 40 carbons in the alkyl portion, $C_6$-$C_{40}$ aryl, $C_6$-$C_{40}$ substituted aryl, heteroaryl having from 5 to 40 backbone atoms, substituted heteroaryl having from 5 to 40 backbone atoms, any of which may be optionally substituted with F, Cl or CN, where appropriate.

In formula Ib, each D group is an independently selected conjugated electron donating aromatic or heteroaromatic group having from 5 to 50 backbone atoms, each D optionally substituted with one or more electron donating substituents or electron withdrawing substituents, provided that even when substituted the electronic character of each D is electron donating.

In some embodiments, each D may independently be any one of the following divalent electron donating groups:

D13

D14

D15

D16

D17

D18

D19

D20

D13

D14

D15

D16

D17

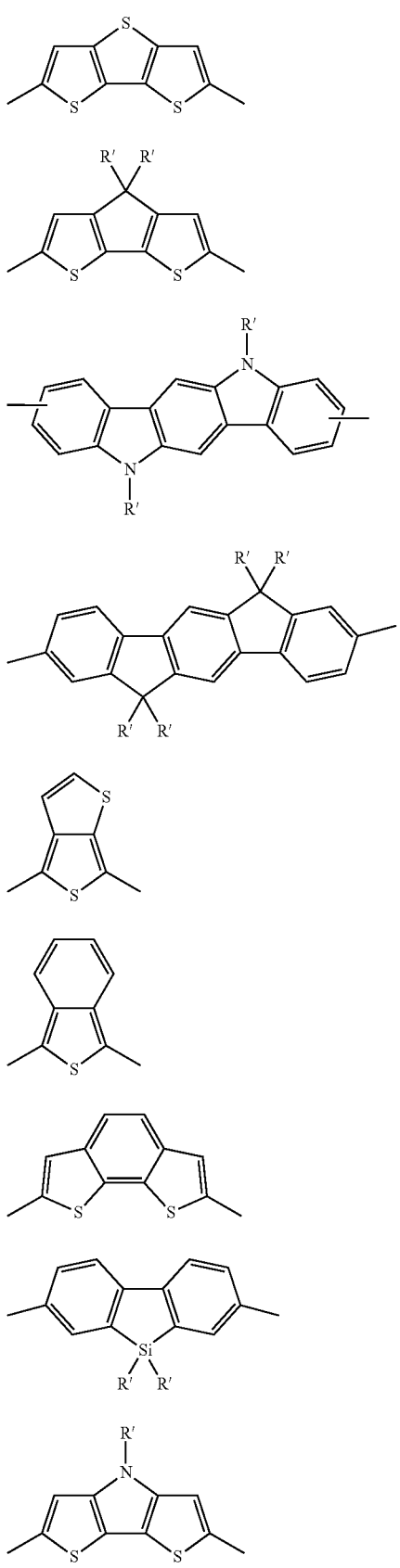

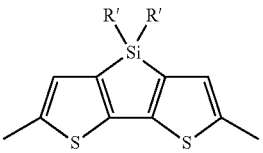

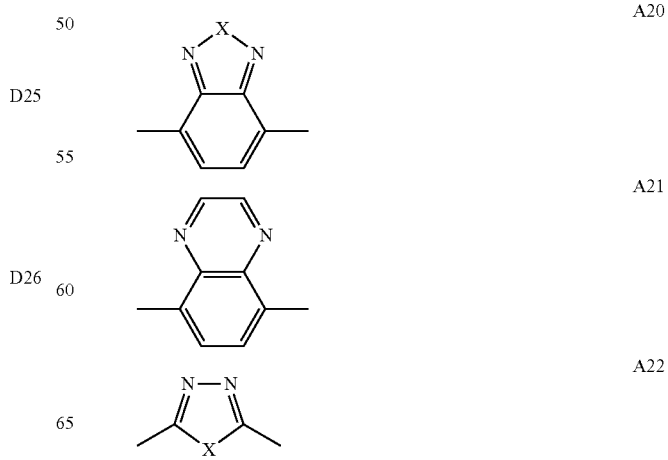

In the above D groups D13 to D27, any R' may independently be straight or branched $C_1$-$C_{40}$ alkyl, straight or branched alkoxy having from 1 to 40 carbons in the alkyl portion, $C_6$-$C_{40}$ aryl, $C_6$-$C_{40}$ substituted aryl, heteroaryl having from 5 to 40 backbone atoms, substituted heteroaryl having from 5 to 40 backbone atoms, any of which may be optionally substituted with F, Cl or CN, where appropriate.

Although the above list for various D groups is provided, it is intended that in certain embodiments, each D may be independently chosen from any subset of the above list.

In certain embodiments any D may be D13. In certain embodiments, any D may be D14. In certain embodiments, any D may be D15. In certain embodiments, any D may be D16. In certain embodiments, any D may be D17. In certain embodiments, any D may be D18. In certain embodiments, any D may be D19. In certain embodiments, any D may be D₂O. In certain embodiments, any D may be D21. In certain embodiments, any D may be D22. In certain embodiments, any D may be D23. In certain embodiments, any D may be D24. In certain embodiments, any D may be D25. In certain embodiments, any D may be D26. In certain embodiments, any D may be D27.

As stated above, any D group may be optionally substituted, including for example, with Br, F, Cl, nitro, cyano, one or more straight or branched $C_1$-$C_{40}$ alkyl, straight or branched alkoxy having from 1 to 40 carbons in the alkyl portion, $C_6$-$C_{40}$ aryl, $C_6$-$C_{40}$ substituted aryl, heteroaryl having from 5 to 40 backbone atoms, substituted heteroaryl having from 5 to 40 backbone atoms, any of which may be optionally substituted with F, Cl or CN, where appropriate.

In formula Ib, each A group is an electron accepting optionally substituted aromatic or heteroaromatic group or is an electron accepting substituted ethenylene group.

Thus, in some embodiments, each A may independently be any one of the following divalent electron accepting groups:

-continued

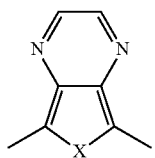
A23

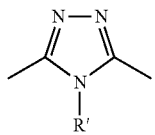
A24

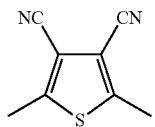
A25

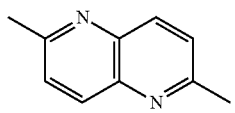
A26

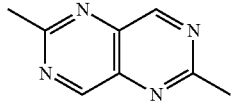
A27

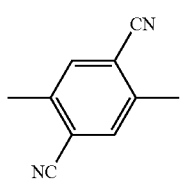
A28

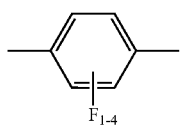
A29

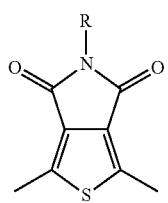
A30

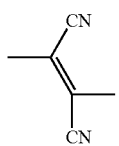
A31

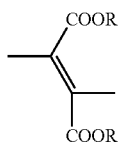
A32

-continued

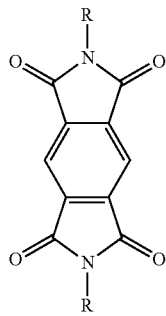
A33

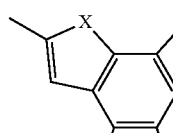
A34

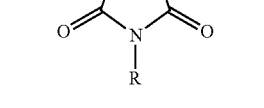
A35

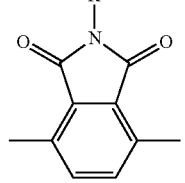

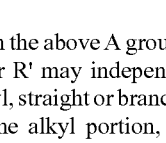

In the above A groups A20 to A35, X is S, O or Se, and any R or R' may independently be straight or branched $C_1$-$C_{40}$ alkyl, straight or branched alkoxy having from 1 to 40 carbons in the alkyl portion, $C_6$-$C_{40}$ aryl, $C_6$-$C_{40}$ substituted aryl, heteroaryl having from 5 to 40 backbone atoms, substituted heteroaryl having from 5 to 40 backbone atoms, any of which may be optionally substituted with F, Cl or CN, where appropriate.

Although the above list for various A groups is provided, it is intended that in certain embodiments, each A may be independently chosen from any subset of the above list.

In certain embodiments any A may be A20. In certain embodiments any A may be A21. In certain embodiments, any A may be A22. In certain embodiments, any A may be A23. In certain embodiments, any A may be A24. In certain embodiments, any A may be A25. In certain embodiments, any A may be A26. In certain embodiments, any A may be A27. In certain embodiments, any A may be A28. In certain embodiments, any A may be A29. In certain embodiments, any A may be A30. In certain embodiments, any A may be A31. In certain embodiments, any A may be A32. In certain embodiments, any A may be A33. In certain embodiments, any A may be A34. In certain embodiments, any A may be A35.

By selecting specific A groups for inclusion in the compound, the LUMO energy level of the polymer can be lowered, facilitating electron injection and transport.

In various embodiments, compounds of formula Ib include the following compounds 1 and 23 to 37, in which R is as defined above:

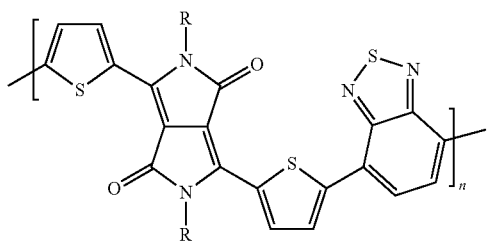 (1)
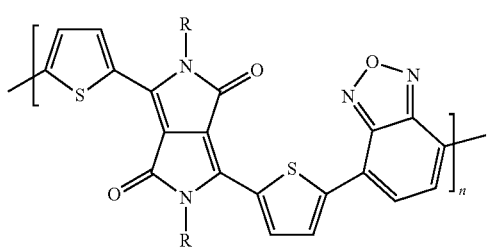 (23)
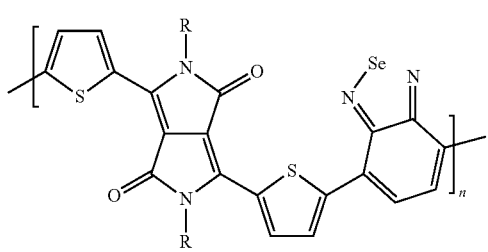 (24)
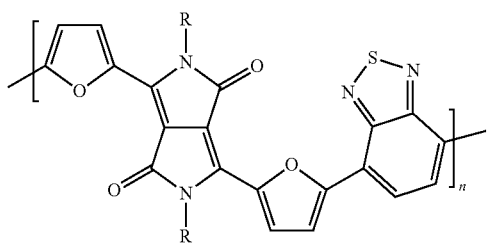 (25)
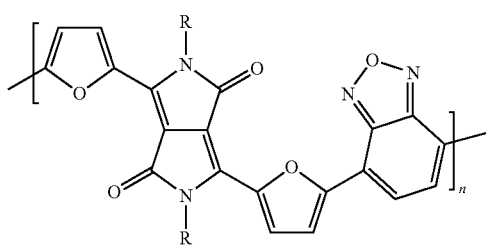 (26)
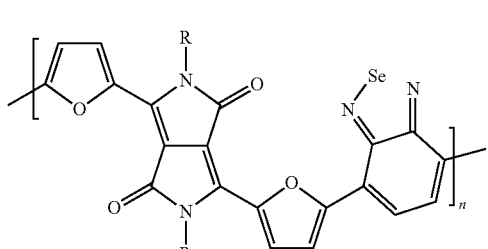 (27)
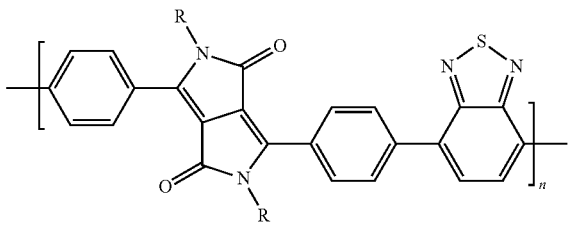 (28)
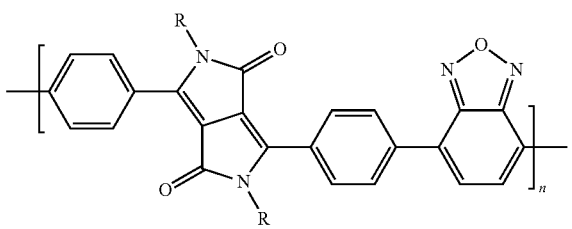 (29)
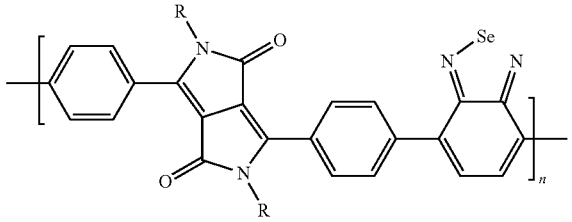 (30)
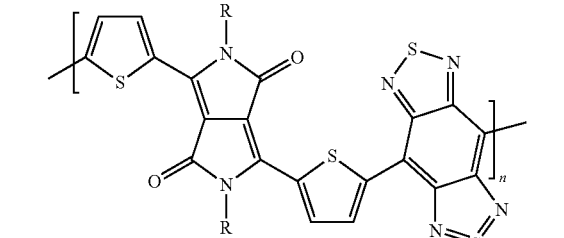 (31)
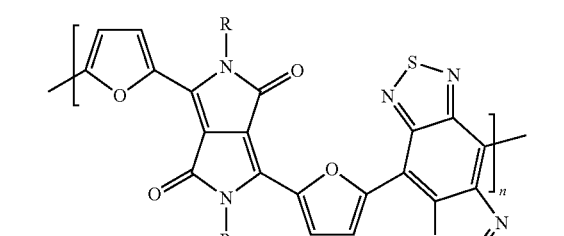 (32)
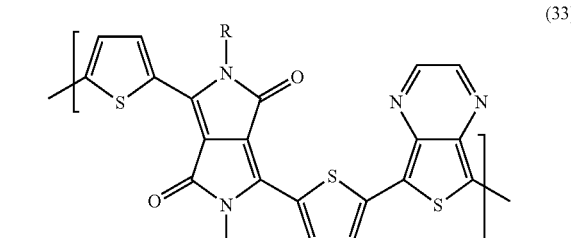 (33)

(34)
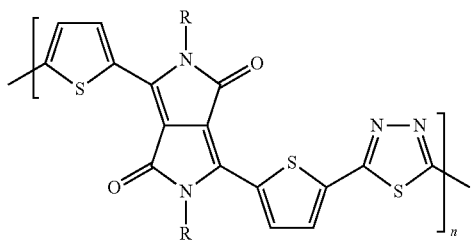

(35)
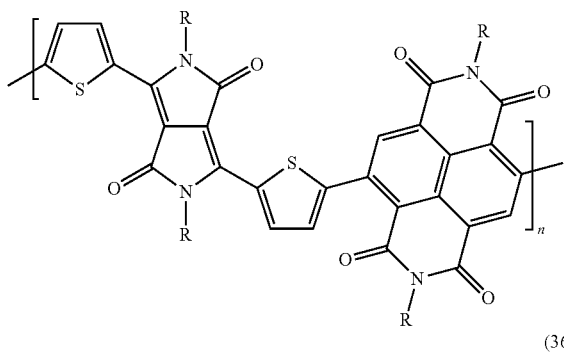

(36)
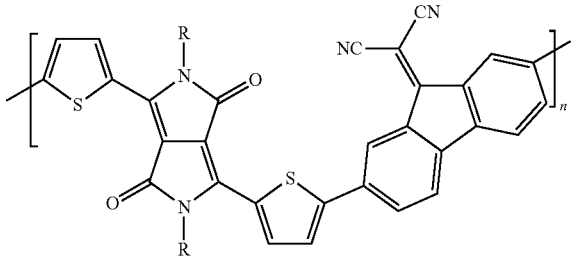

(37)
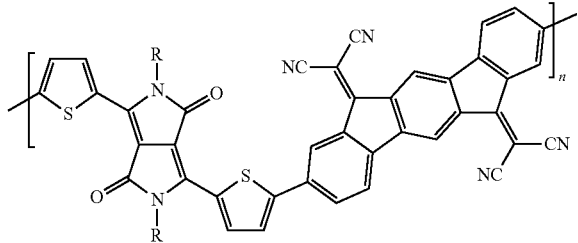

It will be appreciated that compound 1 falls within both formula Ia and formula 1b, and that depending on the precise choice of the various D groups, A groups and $A_{core}$, other compounds may be designed that fall within formulae Ia and Ib.

Thus, a compound of formula I may have a formula of any one of compounds 1 and 23 to 37. In certain embodiments, a compound of formula I has a formula of compound 1. In certain embodiments, a compound of formula I has a formula of compound 23. In certain embodiments, a compound of formula I has a formula of compound 24. In certain embodiments, a compound of formula I has a formula of compound 25. In certain embodiments, a compound of formula I has a formula of compound 26. In certain embodiments, a compound of formula I has a formula of compound 27. In certain embodiments, a compound of formula I has a formula of compound 28. In certain embodiments, a compound of formula I has a formula of compound 29. In certain embodiments, a compound of formula I has a formula of compound 30. In certain embodiments, a compound of formula I has a formula of compound 31. In certain embodiments, a compound of formula I has a formula of compound 32. In certain embodiments, a compound of formula I has a formula of compound 33. In certain embodiments, a compound of formula I has a formula of compound 34. In certain embodiments, a compound of formula I has a formula of compound 35. In certain embodiments, a compound of formula I has a formula of compound 36. In certain embodiments, a compound of formula I has a formula of compound 37.

The compounds of formula I can be synthesized using commercially available reagents, using routine chemical techniques, including via appropriate reactions, such as for example, the Suzuki coupling reaction or the Stille coupling reaction.

Particular reaction schemes to synthesize compounds 1 and 2 are set out in the Examples below, in Schemes 1 and 2, which reaction schemes may be adapted for synthesis of other compounds within formula I.

The compounds of formula I may exhibit high solubility in organic solvents and may be easily purified using standard techniques including precipitation and/or Soxhlet extraction.

The energy levels of the HOMO (highest occupied molecular orbital) and the LUMO (lowest unoccupied molecular orbital) of compounds of formula I can be tuned through selection of the specific electron donating D groups and electron withdrawing A groups included in a particular compound, along with the number and length of each acceptor block and donor block. Thus, the bandgap (the difference in energy level between the HOMO and the LUMO) for compounds of formula I can be varied by varying the A and D groups used in the compounds.

The tunability of the energy levels, along with the ease in synthesis and purification, can make the compounds of formula I useful for general applications as a single-component ambipolar semiconductor material. For example, the compounds of formula I may be used as semiconductor material in organic thin film transistors.

The compounds of formula I are suitable for solution processing, thus allowing for production of a thin film containing such a compound, for inclusion in an organic electronic device. Thus, there is presently provided a thin film comprising a compound of formula I, including a compound of formula Ia and/or formula Ib. In various embodiments, the thin film may comprise any of compounds 1 to 42 as described above.

The thin film is a layer comprising a compound of formula I as described above, which may be formed to be in the order of from about 1 to about 1000 nm thick, from about 5 to about 500 nm thick, from about 10 to about 250 nm thick, or from about 10 to about 100 nm thick.

The thin film may be formed on a suitable substrate, which may be any solid substrate, including indium tin oxide (ITO) coated glass or plastic, fluorine tin oxide (FTO) coated glass or plastic, quartz, glass, mica, a plastic substrate such as polyethylene terephthalate (PET), polyethylene naphthalate (PEN), or polycarbonate; paper, metal, or silicon. The thin film may also be deposited onto another layer when forming a multilayered device, or onto an electrode.

To form the thin film, the compound of formula (I) and any additional film components may be dissolved in a suitable organic solvent. Suitable solvents include dichloromethane, chloroform, heptanes, octane, toluene, xylene, ethyl benzoate, methyl benzoate, 1,1,2,2-tetrachloroethane, THF, dioxane, chlorobenzene, dichlorobenzenes, trichlorobenzene, mesitylene, and mixtures of the aforesaid solvents.

The thin film may be formed on a suitable surface using any suitable deposition or coating methods including solution coating. Solution coating includes spin coating, casting, microgravure coating, gravure coating, bar coating, roll coating, wire bar coating, dip coating, spray coating, screen printing, flexo printing, offset printing and inkjet printing.

The compounds of formula (I) and thin films containing such compounds may be used to construct organic electronic devices. The compounds of formula (I) and thin films containing such compounds may form the semiconductor material or charge transport material in an organic electronic device, including an organic thin film transistor, an organic photovoltaic, an organic light emitting diodes, a chemical sensor, or a biosensor. Such devices are known in the art.

Thus, there is presently provided a device comprising a compound of formula (I) or a thin film comprising a compound of formula (I). The device may be a thin film transistor.

In one embodiment, as depicted in FIG. 1, the device 2 comprises a bottom gate, top contact thin film transistor. The device comprises a gate electrode 10, a source electrode 12, and a drain electrode 14. The gate electrode 10 is separated from the source electrode 12 and drain electrode 14 by a gate dielectric 18. A semiconductor material 16 comprising a compound of formula I, for example in the form of a thin film, is in contact with the gate dielectric 18 and forms a conductive path between source electrode 12 and drain electrode 14.

The semiconductor material 16 may have a thickness of from about 5 nm to about 1 μm, including any intermediate value or range.

The gate electrode 10 may comprise doped silicon, for example p$^+$ or n$^+$ doped silicon, a metal such as Al, Cu, Ni, Ag, or Au, a conductive polymer such as PEDOT:PSSA, or a conductive metal oxide such as indium-tin oxide (ITO). The gate electrode 10 may have a thickness of from about 20 nm to about 5 mm.

The gate dielectric 18 may be, for example, silicon dioxide, which may be optionally modified with a self-assembling monolayer of an organosilane, for example comprising octyltrichlorosilane, to improve the interfacial property of the dielectric layer 18 and the semiconductor material 16 and/or facilitate the molecular ordering of the semiconductor material 16.

The source 12 and drain 14 electrodes may be made of any suitable conductive material as used for gate electrode 10, and may be the same or different material. In some embodiments, source electrode 12 and drain electrode 14 are made from the same metal, for example gold.

The above-mentioned devices may be prepared by depositing the relevant layers on top of one another. The layers may be prepared by methods known in the art, including solution coating techniques mentioned above. Solution coating steps may be carried out in ambient conditions or in an inert atmosphere, such as, for example, under nitrogen gas. Alternatively, some layers may be prepared by thermal evaporation. Metallic layers may be prepared by known techniques, such as, for example, thermal or electron-beam evaporation, chemical-vapour deposition or sputtering, or by printing conductive inks. Layers may be optionally annealed at a temperature of from about 30° C. to about 300° C.

The following examples are intended as exemplary only and are not in any way intended to limit the scope of the present invention.

EXAMPLES

Example 1

Synthesis of Polymer (1)

Polymer (1) was synthesized according to Scheme 1 as set out below, based on the following synthetic steps: i) diisopropylsuccinate/t-C$_5$H$_{11}$OK/2-methyl-2-butanol/120° C.; ii) 2-octyl-1-dodecyl bromide/K$_2$CO$_3$/DMF/130° C.; iii) NBS/chloroform; v) Pd(dppf)Cl$_2$/KOAc/1,4-dioxane; vi) Pd(PPh$_3$)$_4$/Aliquat 336/2M K$_2$CO$_3$/toluene.

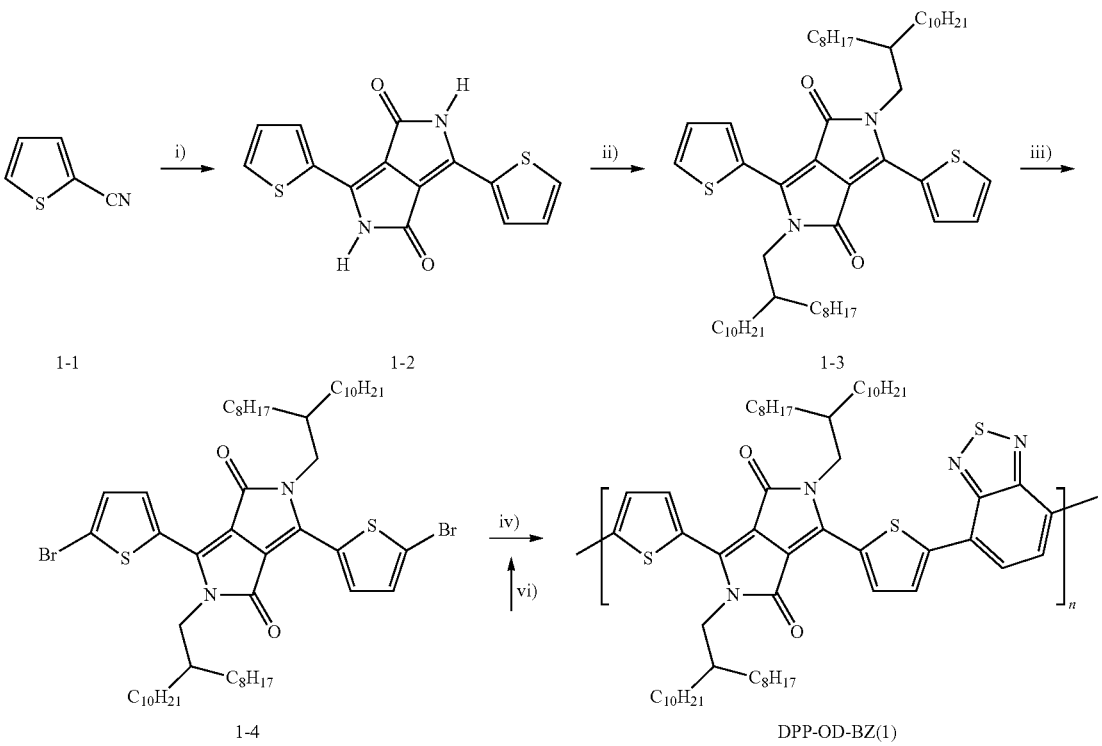

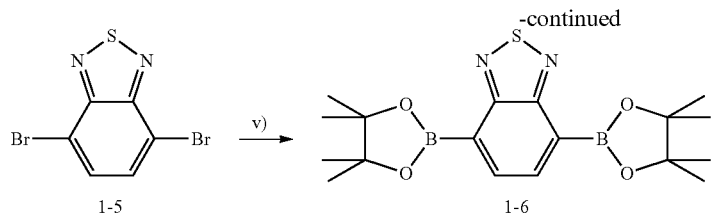

(i) Synthesis of 2,5-dihydro-1,4-dioxo-3,6-dithienylpyrrolo[3,4-c]-pyrrole (1-2)

Sodium metal (6.90 g, 0.30 mol) was added to 100 ml t-amyl alcohol and a small amount of iron (III) chloride (100 mg) was added. The mixture was stirred vigorously for 2 hr at 105° C. until the sodium dissolved. The solution was cooled to 85° C. and 2-thiophenecarbonitrile (22.0 g, 0.2 mol) was added. Diisopropyl succinate (16.6 g, 0.08 mol) dissolved in 10 ml of t-amyl alcohol was added dropwise to the reaction mixture over 1 hr at 85° C. The reaction mixture was stirred at this temperature for 12 hrs, then cooled to 50° C., diluted with 100 ml of methanol, and then slowly neutralized with 30 ml of glacial acetic acid and refluxed briefly, and then filtered. The residue was washed several times with hot methanol and water, and the resultant solid was dried in a vacuum oven at 50° C. A dark red color powder was obtained which was used without further purification (20 g, 83%).

(ii) Synthesis of N,N'-bis(2-octyl1-dodecyl)-3,6-dithienyl-1,4-diketopyrrolo[3,4-c]pyrrole (1-3)

In a three-neck, oven dried, 250 ml round bottom flask, 2,5-dihydro-1,4-dioxo-3,6-dithienylpyrrolo[3,4-c]-pyrrole (2), (7.0 g. 23.30 mmol) and anhydrous $K_2CO_3$ (8.95 g, 69.91 mmol) were dissolved in 250 ml of anhydrous N,N-dimethylformamide (DMF), and heated to 120° C. under argon for 1 h. 2-octyl-1-dodecylbromide (25.27 g, 69.91 mmol) was then added dropwise, and the reaction mixture was further stirred and heated overnight at 130° C. The reaction mixture was cooled to room temperature and then poured into water and stirred for 30 minutes. The product was extracted with chloroform, then successively washed with water, and dried over $MgSO_4$. Removal of the solvent afforded the crude product which was then purified using column chromatography on silica gel using a mixture of hexane and chloroform as eluent, giving a purple solid (11.0 g, 54%). 1H NMR ($CDCl_3$): (0.87 (t, 12H), 1.13-1.45 (m, 64H), 1.89 (s, 2H), 4.00 (d, 4H), 7.26 (d, 2H), 7.52 (d, 2H), 8.87 (d, 2H). MS (MALDI-TOF) m/z 860.63 (M). calcd. for $C_{54}H_{88}N_2O_2S_2$=860.25.

(iii) Synthesis of 3,6-Bis-(5-bromo-thiophen-2-yl)-N,N'-bis((2-octyl-1-dodecyl)-1,4-dioxo-pyrrolo[3,4-c]pyrrole (1-4)

Compound N,N'-bis(2-octyldodecyl)-3,6-dithienyl-1,4-diketopyrrolo[3,4-c]pyrrole (3) (7.0 g, 8.12 mmol) and 50 ml of chloroform were added to a 100 ml three-neck flask equipped with a stirring bar, a condenser, and an addition funnel. 0.832 ml (16.25 mmol) of bromine ($Br_2$) in 20 ml of chloroform was added to the flask at room temperature. The mixture was stirred at room temperature overnight. The next day the reaction mixture was slowly poured into an aqueous solution of sodium thiosulfate and stirred for 30 minutes. The product was extracted with chloroform, then successively washed with water, and dried over $MgSO_4$. Removal of the solvent afforded the crude product which was then purified using column chromatography (silica gel, hexane: chloroform as eluent), giving a dark purple solid (6.45 g, 78%). 1H NMR ($CDCl_3$): 0.86 (t, 12H), 1.10-1.47 (m, 64H), 1.88 (s, 2H), 3.98 (d, 4H), 7.52 (d, 2H), 7.22 (d, 2H), 8.63 (d, 2H). MS (MALDI-TOF) m/z 1016.45 (M). calcd. for $C_{54}H_{86}Br_2N_2O_2S_2$=1017.45 (M+1).

(v) 4,7-bis(4,4,5,5-tetramethyl-1,3,2-dioxabrolan-2-yl)benzothiadiazole (1-6)

A mixture of 4,7-dibromo-2,1,3-benzothiadiazole (5) (4 g, 13.64 mmol), bis(pinacolato)diboron (8 g, 31.20 mmol), $PdCl_2$(dppf) (2.0 g, 2.4 mmol), and KOAc (8 g, 80 mmol) was kept under vacuum for 10 minutes and then degassed. 1,4-Dioxane (50 ml) was added under argon. The reaction mixture was stirred at 80° C. overnight. The reaction was quenched with water, and the resulting mixture was washed with ethyl acetate (100 ml). The organic layers were washed with brine, dried over $Na_2SO_4$, and concentrated in vacuum to yield a dark red solid. The solid was purified by silica gel chromatography using 3% ethyl acetate in hexane to give the desired compound as a pink solid (2.4 g, 46%). FD-MS: m/z=388.0 (calcd. 388.1). 1H NMR (250 MHz, $CDCl_3$): δ 8.13 (s, 2H), 1.42 (s, 24H).

(vi) Synthesis of polymer (1)

3,6-Bis-(5-bromo-thiophen-2-yl)-N,N'-bis((2-octyl-1-dodecyl)-1,4-dioxo-pyrrolo[3,4-c]pyrrole (1-4) (0.300 g, 0.29 mmol), 4,7-bis(4,4,5,5-tetramethyl-1,3,2-dioxabrolan-2-yl)benzothiadiazole (1-6) (0.114 g, 0.29 mmol), $K_2CO_3$ (3 ml, 2 M) and 2 drops of Aliquat 336 were dissolved in 6 ml toluene in a Schlenk flask. The solution was purged with argon for 30 minutes, and then tetrakis (triphenylphosphine) palladium(0) (Pd(PPh$_3$)$_4$) (20 mg, 0.017 mmol) was added. The reaction was stirred at 80° C. for 3 days. A toluene solution of phenyl boronic acid was then added, followed by the addition of bromobenzene and stirred overnight. The resulting mixture was poured into a mixture of methanol and water and stirred overnight. The precipitated dark solid was redissolved in chloroform and added dropwise to methanol (250 ml). The resulting solid was filtered off and subjected to Soxhlet extraction for 2 days in methanol, acetone, and hexane for removal of oligomer and other impurities. The residue was finally extracted with chloroform and precipitated again from methanol, filtered, washed with methanol, and dried. (200 mg, 69% yield).

Example 2

Synthesis of Polymer (2)

Polymer (2) was synthesized according to Scheme 2 as set out below, based on the following synthetic steps: i) 2-butyl-1-octanol, $H_2SO_4$, 98%; ii) $AgNO_3$/KF/Pd(PhCN)$Cl_2$/

DMSO, 62%; iii) 2-tributylstannylthiophene, Pd$_2$dba$_3$/P(o-tolyl)$_3$/toluene, 75%; iv) 2 eq. NBS, 97%; v) Pd(PPh$_3$)$_4$, 2M Na$_2$CO$_3$, 2,1,3-Benzothiadiazole-4,7-bis(boronic acid pinacol ester), toluene, reflux, 24 hr, 56%.

Scheme 2

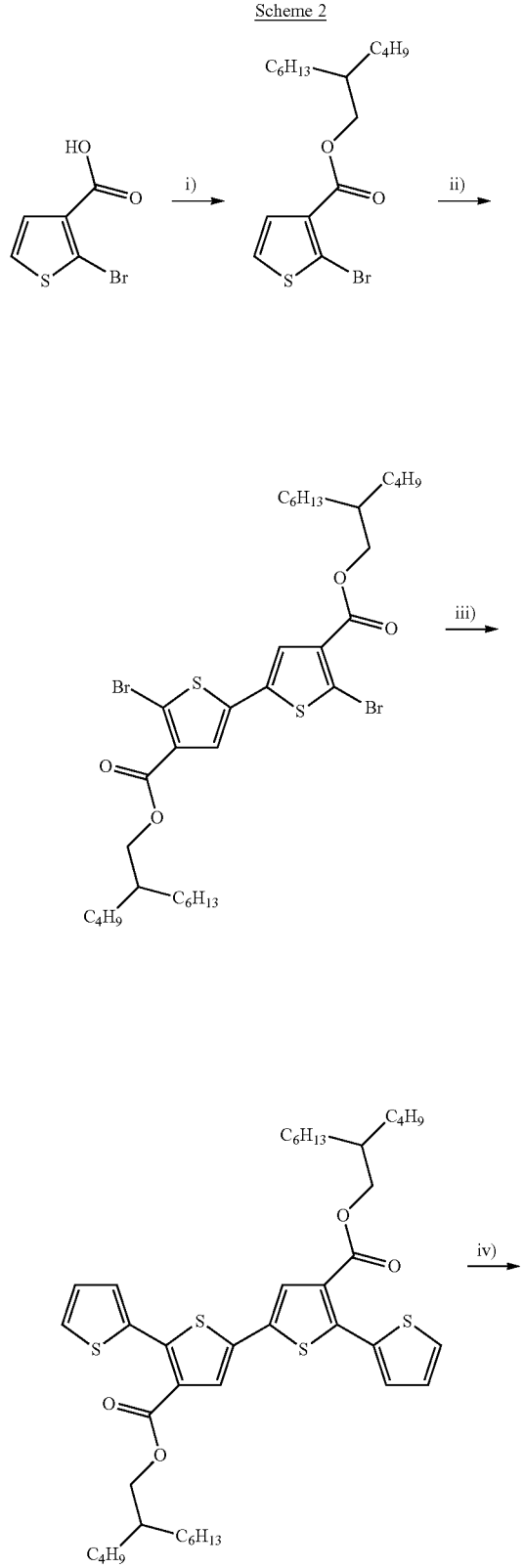

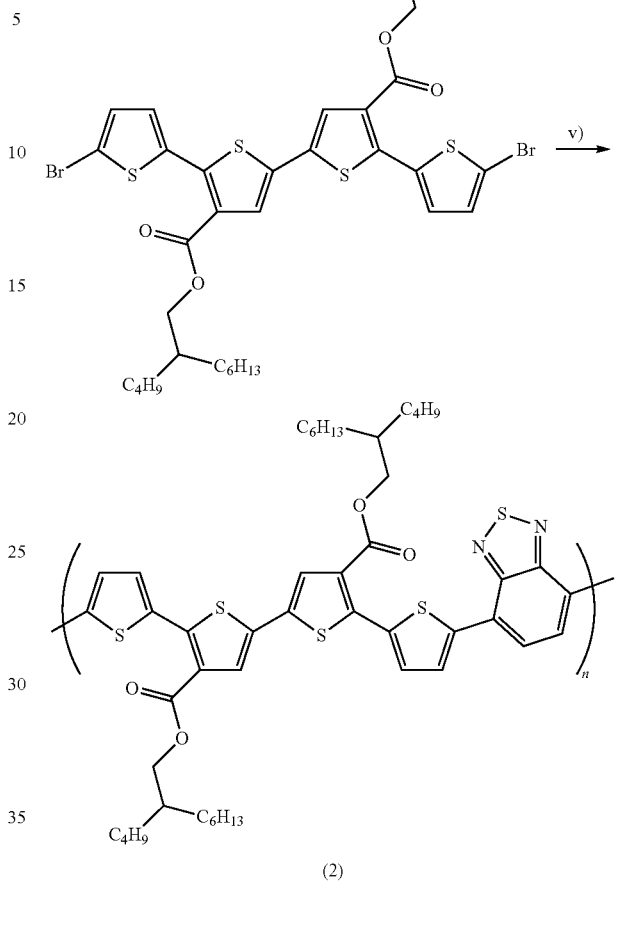

(i) Synthesis of 2-butyl-1-ocatyl 2-bromo-3-thiophenecarboxylate

In a 500 ml, round-bottomed flask equipped with a Dean-Stark apparatus and a water condenser were placed 4.5 g of 2-bromo-3-thiophenecarboxylic acid (21.7 mmol), 9.32 g (50 mmol) of 2-butyl-1-octanol, 0.44 g (4.8 mmol) of conc. H$_2$SO$_4$, and 100 ml of toluene. The mixture was heated under reflux for 24 hr. The mixture was cooled to room temperature and then dissolved in ethyl acetate (100 ml) and the solution was washed with dilute sodium bicarbonate (twice) and water (twice), and then dried over MgSO$_4$, and the solvent was removed. The residue was purified with column chromatography on silica using toluene. Yield: 8.0 g (98%).

(ii) Synthesis of bis(2-butyl-1-octyl) 5,5'-dibromo-2, 2'-bithiophene-4,4'-dicarboxylate 2-Butyl-1-octyl 2-bromo-3-thiophenecarboxylate (7.56 g, 20.1 mmol), PdCl$_2$(PhCN)$_2$ (88 mg, 0.23 mmol), potassium fluoride (2.63 g, 45.3 mmol), and DMSO (100 ml) were added to a 100 ml Schlenk tube equipped with a magnetic stirring bar. AgNO$_3$ (7.70 g, 45.3 mmol) was added in one portion and the resulting mixture was heated with stirring at 60° C. for 3 h. Additional AgNO$_3$ (7.70 g, 45.3 mmol) and potassium fluoride (2.63 mg, 45.3 mmol) was then added and stirring was continued for a further 3 h. The reaction mixture was poured into a separatory funnel and toluene (100 ml) and water (100 ml) were added. The organic layer was washed with water three times and dried over $MgSO_4$. The solution was passed through a Celite pad to remove solid residue and the cake was washed repeatedly with toluene. After removing the solvent, the residue was purified by column chromatography on silica gel using toluene/hexane=1/1. 2.70 g of bis(2-butyl-1-octyl) 5,5'-dibromo-2,2'-bithiophene-4,4'-dicarboxylate as a light yellow liquid. Yield: 2.70 g (36%).

(iii) Synthesis of bis(2-butyl-1-octyl) 5,5'-bis(2-thienyl)-2,2'-bithiophene-4,4'-dicarboxylate To the mixture of bis(2-butyl-1-octyl) 5,5'-dibromo-2,2'-bithiophene-4,4'-dicarboxylate (1.00 g, 1.34 mmol) and 2-tributylstannylthiophene (1.50 g, 4 mmol) was added $Pd(PPh_3)_4$ (46 mg, 0.04 mmol), and anhydrous DMF (15 ml). The mixture was placed under vacuum and flushed with argon several times and was put on a microwave reactor with a setting of 160° C. for 60 min. The reaction mixture was cooled to room temperature and the solvent was removed. The residue was washed with methanol to remove traces of DMF. After drying, the liquid was dissolved in hexane and purified twice by column chromatography on silica gel using a mixture of hexane/ethyl acetate (9/1) (Rf=0.5). A light yellow liquid was obtained. Yield: 1.01 g (100%).

(iv) Synthesis of bis(2-butyl-1-octyl) 5,5'-bis(5-bromo-2-thienyl)-2,2' bithiophene-4,4'-dicarboxylate Bis(2-butyl-1-octyl) 5,5'-bis(2-thienyl)-2,2'-bithiophene-4,4'-dicarboxylate (1.01 g, 1.34 mmol) was dissolved in DMF (20 ml) at room temperature. N-Bromosuccinimide (NBS) (0.477 g, 2.68 mmol) was added to the reaction mixture and stirred for 5 hr and then cooled down to room temperature. A yellow precipitate was formed, which was filtered and washed with methanol. The solid was then recrystallized from DMF (20 ml) for 3 times to give a yellow crystal. Yield: 0.80 g (66%).

(v) Synthesis of polymer (2)

Bis(2-butyl-1-octyl) 5,5'-bis(5-bromo-2-thienyl)-2,2'-bithiophene-4,4'-dicarboxylate (0.365 g, 0.4 mmol), 2,1,3-benzothiadiazole-4,7-bis(boronic acid pinacol ester) (0.155 g, 0.4 mmol), Aliquat 336 (0.1 g), and 2 M $Na_2CO_3$ (1 ml) were charged into to a 50 ml flask equipped with a condenser. After purging with argon and evacuated for 3 times, $Pd(PPh_3)_4$ was added, along with 10 ml of toluene. The mixture was heated at 100° C. for 24 hr before cooling down to room temperature. The solution was then poured into a methanol-water mixture (200 ml, 9:1). The precipitate was collected by filtration, washed with 50 ml of methanol, and dried. After Sohxlet extraction with acetone, hexane, and then the polymer was dissolved with chlorobenzene. After removal of solvent, a blue polymer was obtained. Yield: 0.20 (56%).

Example 3

Fabrication of Devices with Polymer (1)

Device Fabrication
Top contact/bottom gate OTFT devices were fabricated as follows.

(i) Substrate Preparation $p^+$-Si (or $n^+$-Si)/$SiO_2$ substrates were used for OTFT fabrication where $p^+$-Si (or $n^+$-Si) and $SiO_2$ work as gate contact and gate dielectric, respectively. Substrates were subject to routine cleaning using ultrasonication in acetone, methanol and de-ionized water. The cleaned wafers were dried under a nitrogen flow and heated at 100° C. for 5 minutes and then were subjected to UV-ozone treatment for 20 minutes.

(ii) Self-Assembled Monolayer (SAM)

$p^+$-Si (or $n^+$-Si)/$SiO_2$ substrates were kept in a desiccator with few drops of octyltricholorosilane (OTS). A vacuum was applied to the desiccator for 3 minutes and then the desiccator was placed in an oven at 110° C. for three hours. $p^+$-Si (or $n^+$-Si)/$SiO_2$ substrates were then removed from desiccators, thoroughly rinsed with isopropanol and dried under a nitrogen flow.

(iii) Deposition of Organic Semiconductor Thin Film

A thin film of (1) was deposited on above stated substrates by spin coating a solution of (1) (8 mg/ml) in chloroform, optionally followed by thermal annealing at 80° C., 120° C., 160° C. and 200° C., respectively, under nitrogen.

(iv) Deposition of Source/Drain Electrodes

Once organic thin films were deposited on substrates, top contact bottom gate OTFTs were fabricated by depositing ~100 nm of gold as source and drain contacts using shadow masks. Typical OTFT devices had 50, 100 or 200 μm channel length (L) and either 1 mm or 3 mm channel width (W).

Characterization of Polymers
The thermal properties of (1) were investigated by differential scanning calorimetry (DSC). No noticeable thermal transition was observed during the heating/cooling scans in a range of from −20° C. to 300° C. Thermal stability of the material (1) was characterized by thermogravimetric analysis (TGA), which showed a thermal decomposition temperature (Td) of ~375° C. under $N_2$, indicating its excellent thermal stability.

Figure 2:
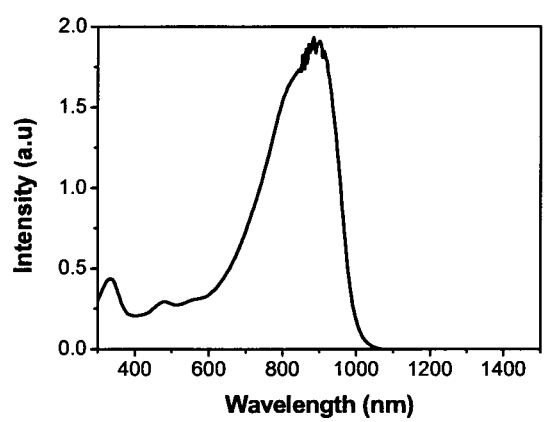
FIG. 2 depicts the UV-vis-NIR of DPP-OD-BTZ (1), an exemplary polymer of the invention.

The photophysical properties of (1) were characterized by UV-vis-NIR spectroscopy (FIG. 2). The polymer showed maximum absorption at ~900 nm. The optical bandgap calculated from absorption cut off value is 1.20 eV, indicating (1) is a low bandgap semiconductor.

Cyclic voltammograms (CV) of the polymer thin film was used to determine the HOMO of polymer (1). The HOMO of 1 is ~5.2 eV, calculated from onset oxidation potential. The LUMO of (1) is ~4.0 eV determined from the HOMO and the optical bandgap. The HOMO and LUMO levels of polymer (1) are desirable for facile injection and stable conduction of holes and electrons in OTFT devices.

Characterization of Devices
The evaluation of field-effect thin film transistor performance was accomplished in a glove box under nitrogen using a Keithley 4200 parameter analyzer. The carrier mobility, μ, was calculated from the data in the saturated regime (gate voltage, $V_G$<source-drain voltage, $V_{SD}$) according to equation (a):

$$I_{SD}=C_i\mu(W/2L)(V_G-V_T)^2 \quad (a)$$

$I_{SD}$ is the drain current at the saturated regime, W and L are, respectively, the semiconductor channel width and length, $C_i$ is the capacitance per unit area of the gate dielectric layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}$=0.

The OTFT devices show characteristic ambipolar field effect characteristics with hole and moblities, as indicated in Table 1.

TABLE 1

Charge carrier mobility (cm²/V-sec.) for (1) based ambipolar OFET devices obtained from the saturation regimes of the electron and hole enhancement mode operation.

| Serial # | Annealing temperature, °C. | Charge carrier mobility (cm²/V-Sec.) | |
|---|---|---|---|
| | | Electron mobility ($\mu_e$) | Hole mobility ($\mu_h$) |
| 1 | Room temp | 0.037 | 0.064 |
| 2 | 80 | 0.16 | 0.20 |
| 3 | 120 | 0.26 | 0.22 |
| 4 | 160 | 0.28 | 0.22 |
| 5 | 200 | 0.40 | 0.35 |

Figure 3A:
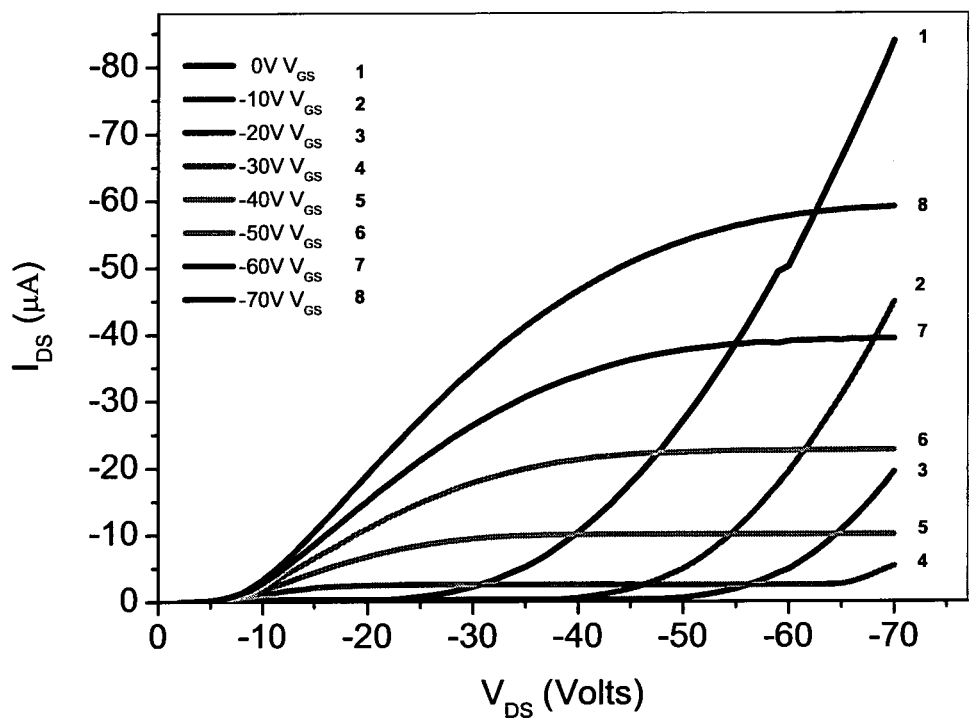
FIG. 3 shows graphs of output characteristic ($V_{DS}$ vs $I_{DS}$) in hole enhancement mode (A) and electron enhancement mode (B) of a DPP-OD-BTZ (1) based ambipolar OFET device annealed at 200° C. on OTS treated $p^+$-$Si/SiO_2$ substrate.
Figure 3B:
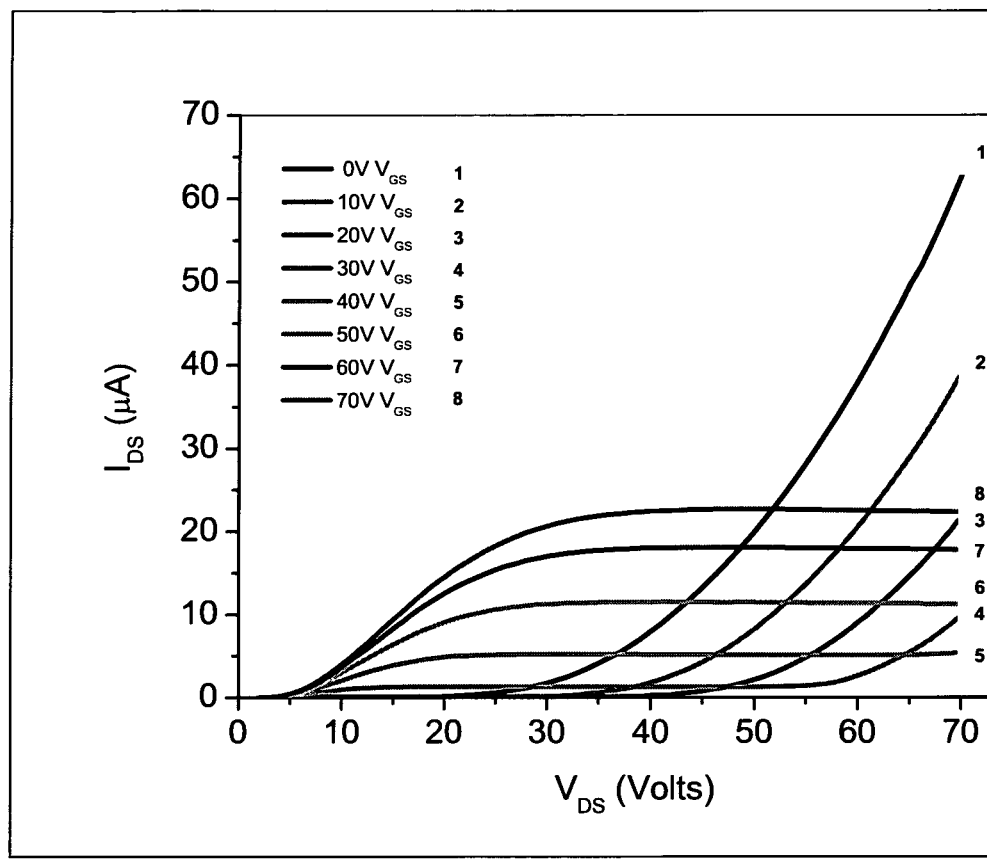
Figure 4:
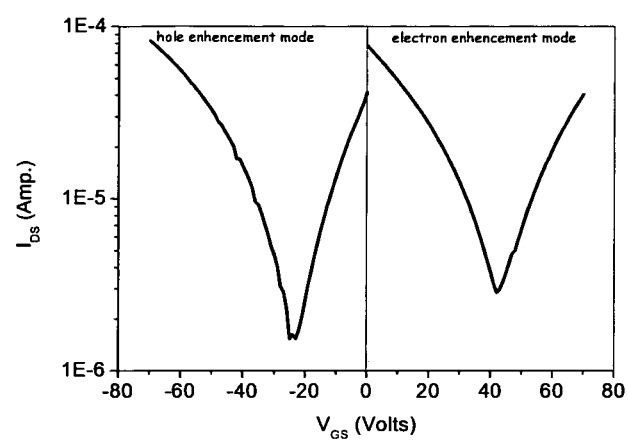
FIG. 4 shows graphs of transfer characteristics ($V_{Gs}$-$I_{DS}$) of a DPP-OD-BTZ (1) based OTFT device annealed at 200°

Bottom-gate, top-contact OTFT devices were fabricated by spin coating 8 mg/ml solution of polymer (1) in chloroform on a p⁺-(or n⁺) doped silicon wafer with a 200 nm thick thermally grown silicon oxide layer that was modified by a monolayer of octyltrichlorosilane. Some of the films were annealed at 80° C., 120° C., 160° C. and 200° C., respectively under nitrogen for 10 min. After depositing gold source and drain electrodes on top of the polymer layer, the devices were characterized in a glove box under nitrogen using a Keithley 4200 parameter analyzer. OTFT devices of polymer (1) showed characteristic ambipolar field effect performance as clearly seen in the output and transfer curves shown in FIG. 3 and FIG. 4.

The hole and electron mobilities obtained from the saturation regimes of electron and hole enhancement mode operation are summarized in Table 1, above. The non-annealed device showed electron mobility of 0.037 cm²/V·s and hole mobility of 0.063 cm²/V·s. The annealed semiconductor thin films showed dramatic increase in both electron and hole mobility. The highest hole and electron mobilities are 0.40 cm²/V·s and 0.35 cm²/V·s, respectively, obtained from devices with thin films of (1) annealed at 200° C.

All publications and patent applications cited in this specification are herein incorporated by reference as if each individual publication or patent application were specifically and individually indicated to be incorporated by reference. The citation of any publication or patent application is for its disclosure prior to the filing date and should not be construed as an admission that the present invention is not entitled to antedate such publication or patent application by virtue of prior invention.

As used in this specification and the appended claims, the terms "comprise", "comprising", "comprises" and other forms of these terms are intended in the non-limiting inclusive sense, that is, to include particular recited elements or components without excluding any other element or component. As used in this specification and the appended claims, all ranges or lists as given are intended to convey any intermediate value or range or any sublist contained therein. Unless defined otherwise all technical and scientific terms used herein have the same meaning as commonly understood to one of ordinary skill in the art to which this invention belongs.

Although the foregoing invention has been described in some detail by way of illustration and example for purposes of clarity of understanding, it is readily apparent to those of ordinary skill in the art in light of the teachings of this invention that certain changes and modifications may be made thereto without departing from the spirit or scope of the appended claims.

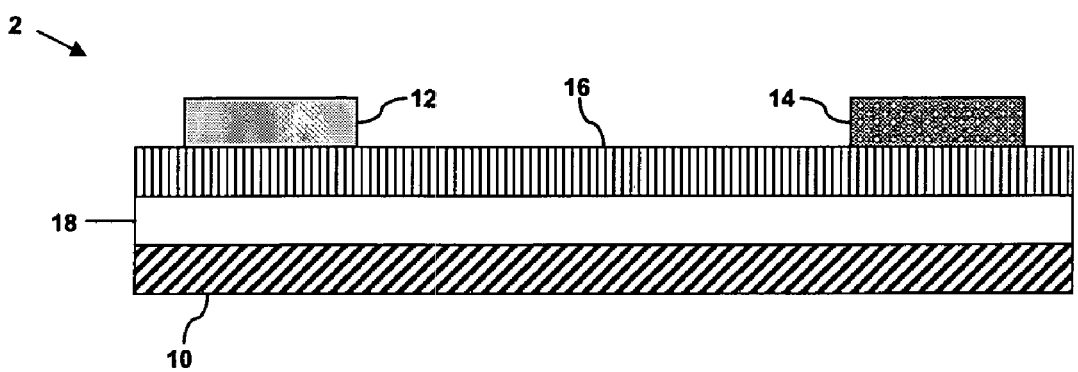

What is claimed is:

1. A compound of formula I:

$$[D_a\text{-}A_{core}\text{-}D_b\text{-}A_c\text{-}]_n \qquad (I)$$

wherein each $A_{core}$ is an electron accepting fused heteroaromatic group having at least one nitrogen atom in the backbone of the heteroaromatic group and at least one S, O or Se atom either in the backbone of the heteroaromatic group or as a conjugated substituent on the heteroaromatic group;

each D is an independently selected conjugated electron donating aromatic or heteroaromatic group having from 5 to 50 backbone atoms, each D optionally substituted with one or more electron donating substituents or electron withdrawing substituents, provided that even when substituted the electronic character of each D is electron donating;

each A is an independently selected conjugated electron accepting aromatic or heteroaromatic group having from 5 to 50 backbone atoms or an ethenylene group substituted with one or two electron withdrawing substituents, each A being optionally substituted with one or more electron donating substituents or electron withdrawing substituents provided that even when substituted the electronic character of each A is electron accepting;

n is an integer having a value of from 2 to 10000; and each a, each b and each c is independently an integer from 1 to 4.

2. The compound of claim 1, having a formula of Ia:

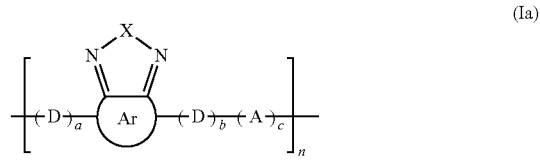

(Ia)

wherein each Ar is a fused aromatic or heteroaromatic divalent moiety which has, including the two atoms of the C₂N₂X ring to which Ar is fused, from 5 to 40 backbone atoms;

each X is independently S, O or Se;

each D is independently an electron donating group that includes at least a five-membered conjugated heterocyclic moiety that contains at least one heteroatom that is S, O or Se, and which may further include one or more additional heteroatoms, including N, S, O or Se, and which may be optionally substituted.

3. The compound of claim 2, wherein each Ar is independently one of Ar1 to Ar8 and each Ar is optionally substituted:

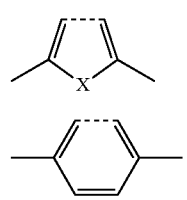

Ar1

Ar2

-continued
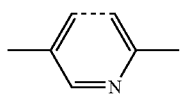
Ar3
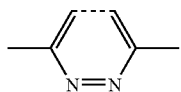
Ar4
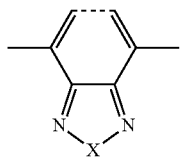
Ar5
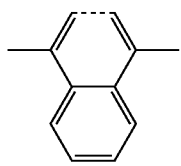
Ar6
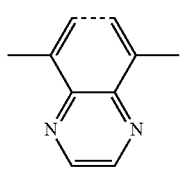
Ar7
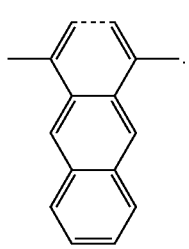
Ar8
4. The compound of claim 2 or 3, wherein each D is independently one of D1 to D12 and each D is optionally substituted:
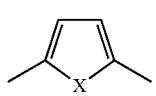
D1
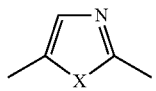
D2
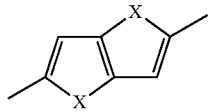
D3
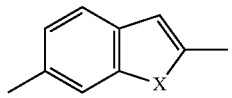
D4
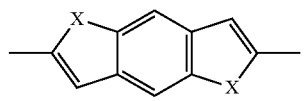
D5
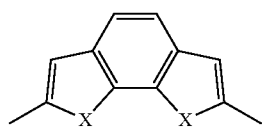
D6
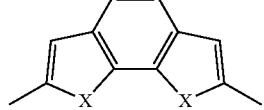
D7
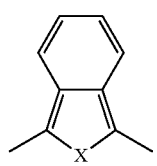
D7
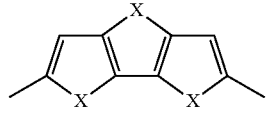
D8
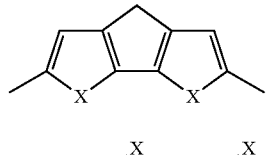
D9
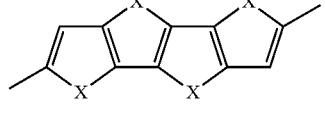
D10
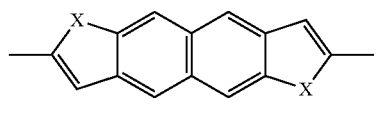
D11
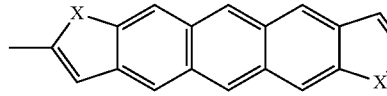
D12
wherein
each X is independently S, O or Se.
5. The compound of any one of claims 2 to 4, wherein each A is independently one of A1 to A19 and each A is optionally substituted:
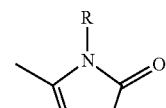
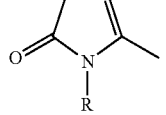
A1

A2 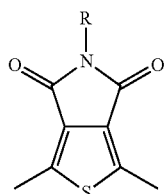
A3 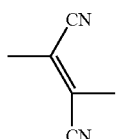
A4 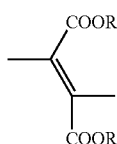
A5 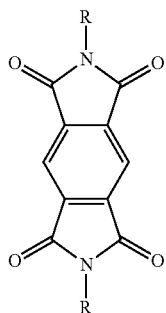
A6 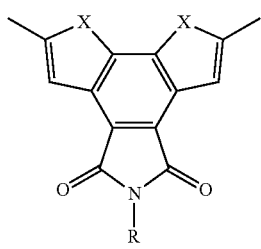
A7 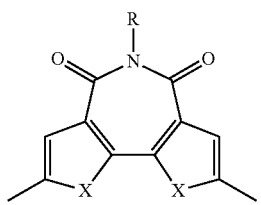
A8 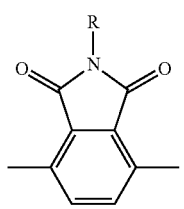
A9 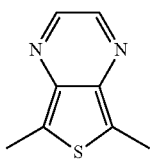
A10 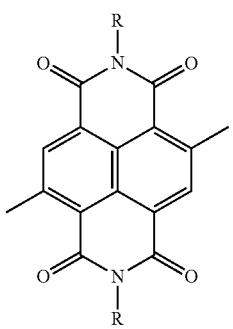
A11 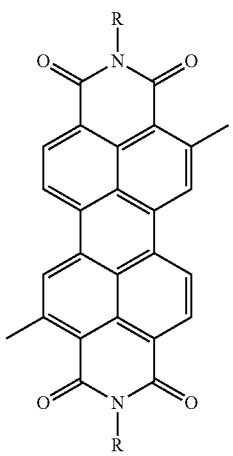
A12 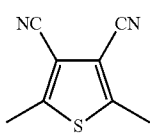
A13 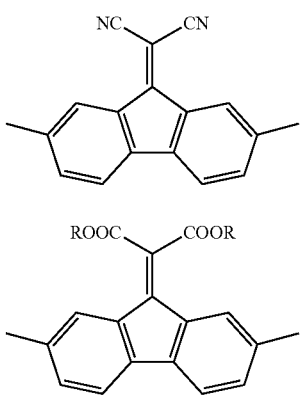
A14

-continued

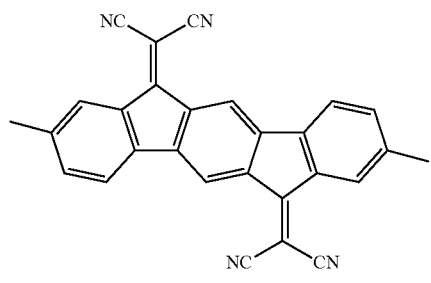
A15

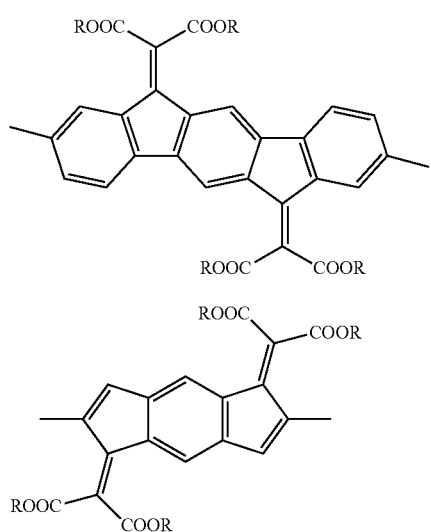
A16

A17

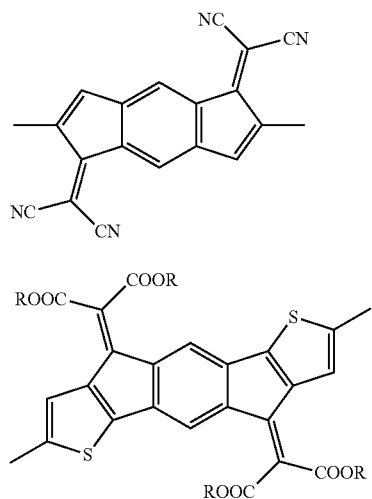
A18

A19 wherein
each X is independently S, O or Se; and
each R is independently straight or branched $C_1$-$C_{40}$ alkyl, straight or branched alkoxy having from 1 to 40 carbons in the alkyl portion, $C_6$-$C_{40}$ aryl, $C_6$-$C_{40}$ substituted aryl, heteroaryl having from 5 to 40 backbone atoms, substituted heteroaryl having from 5 to 40 backbone atoms, any of which may be optionally substituted with F, Cl or CN, where appropriate.

6. The compound of claim 1, having a formula of Ib:

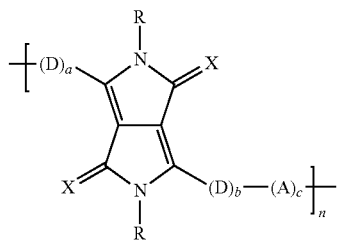
(Ib)

wherein
each R is independently straight or branched $C_1$-$C_{40}$ alkyl, straight or branched alkoxy having from 1 to 40 carbons in the alkyl portion, $C_6$-$C_{40}$ aryl, $C_6$-$C_{40}$ substituted aryl, heteroaryl having from 5 to 40 backbone atoms, substituted heteroaryl having from 5 to 40 backbone atoms, any of which may be optionally substituted with F, Cl or CN, where appropriate; and
each X is independently S, O or Se.

7. The compound of claim 6, wherein each D is independently one of D13 to D27 and each D is optionally substituted:

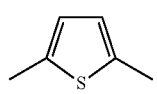
D13

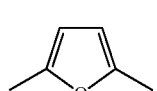
D14

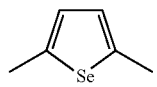
D15

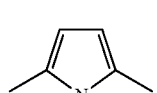
D16

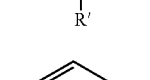
D17

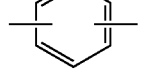
D18

D19

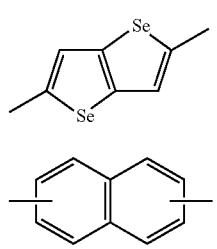
D20

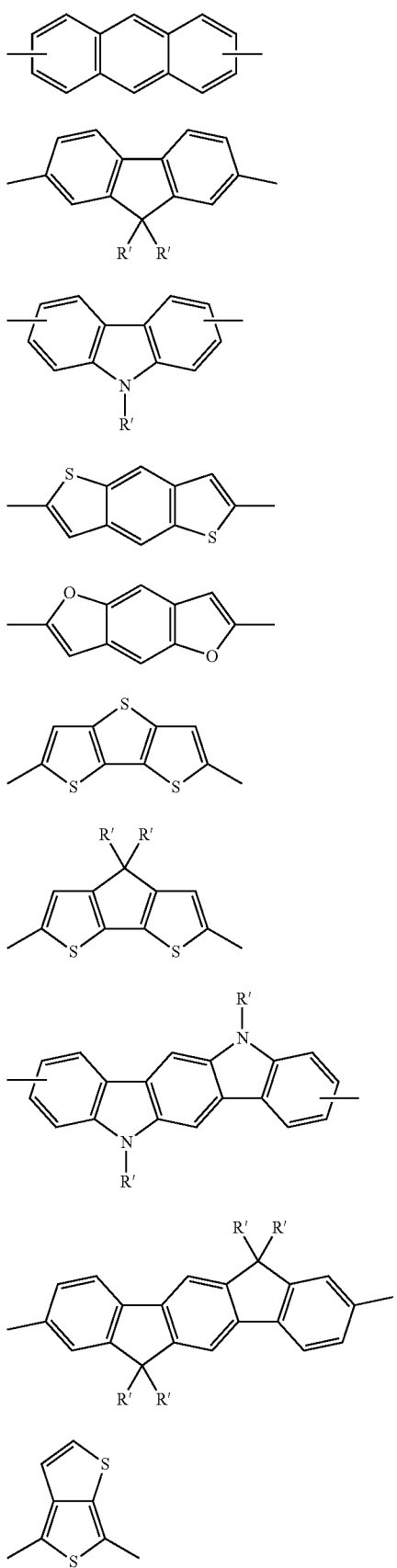

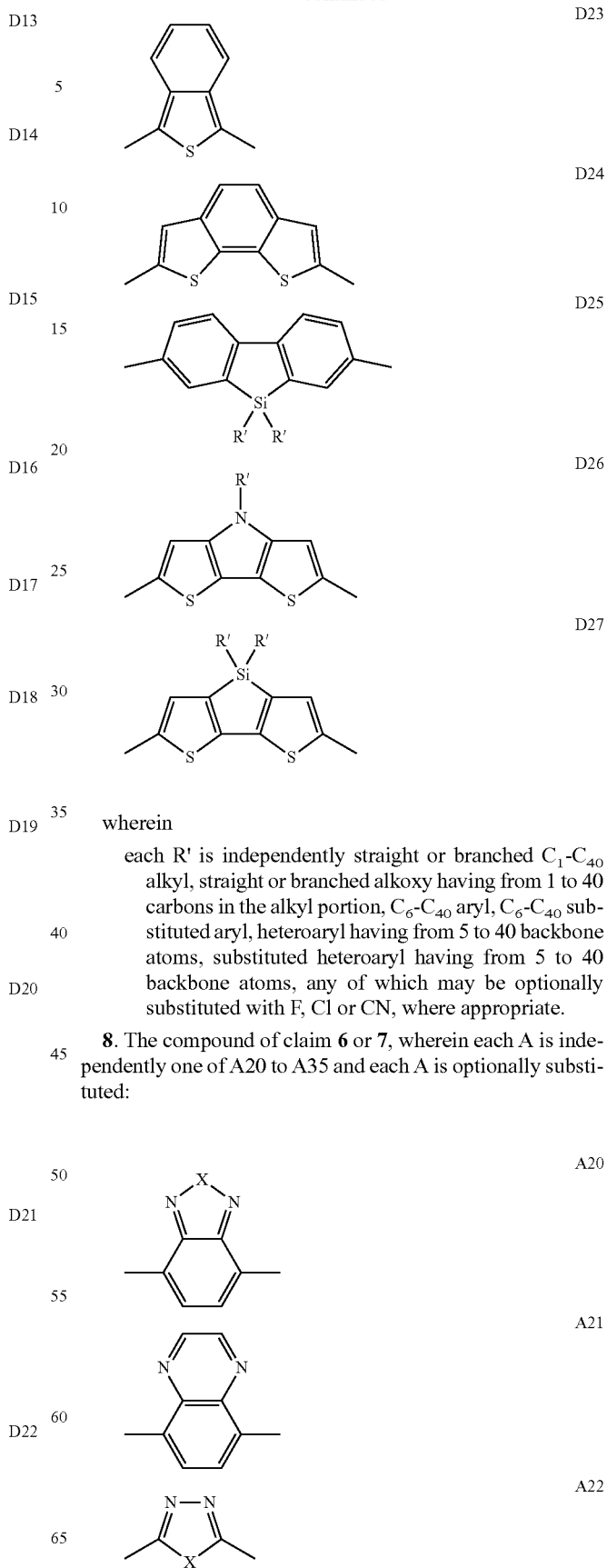

wherein each R' is independently straight or branched $C_1$-$C_{40}$ alkyl, straight or branched alkoxy having from 1 to 40 carbons in the alkyl portion, $C_6$-$C_{40}$ aryl, $C_6$-$C_{40}$ substituted aryl, heteroaryl having from 5 to 40 backbone atoms, substituted heteroaryl having from 5 to 40 backbone atoms, any of which may be optionally substituted with F, Cl or CN, where appropriate.

8. The compound of claim 6 or 7, wherein each A is independently one of A20 to A35 and each A is optionally substituted:

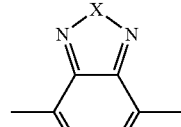

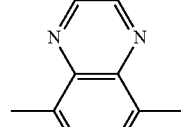

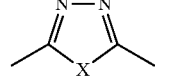

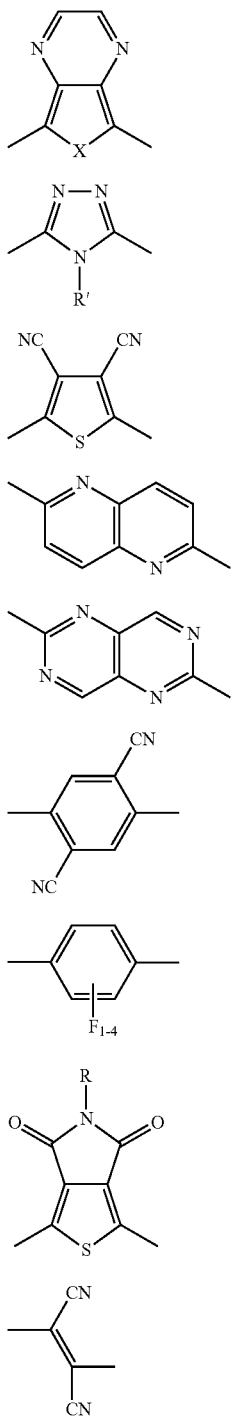

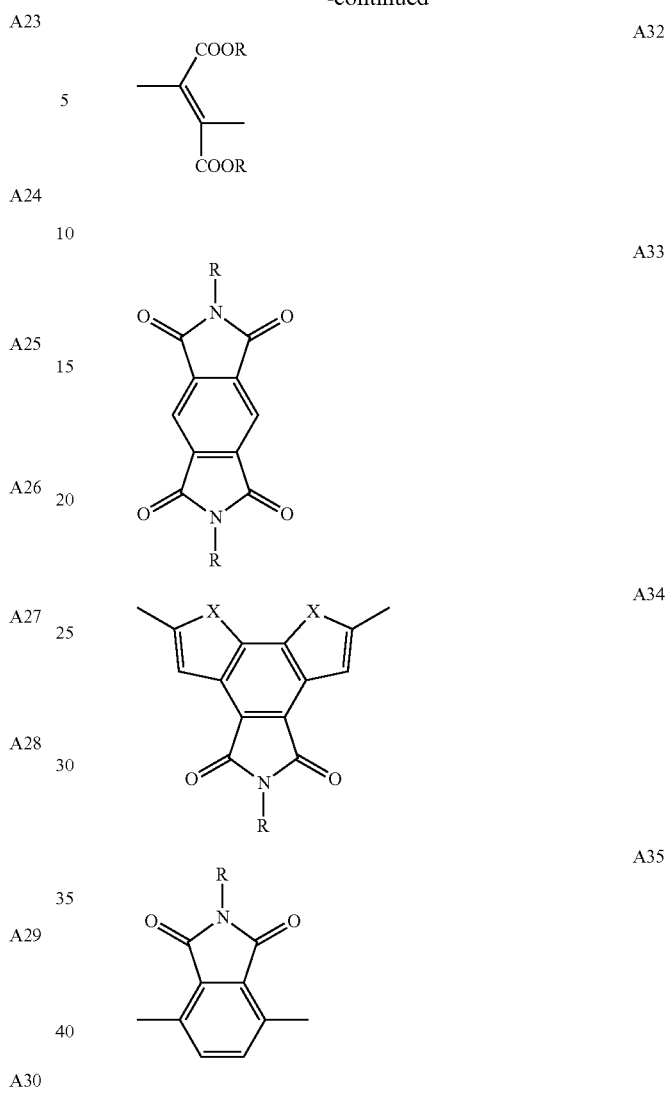

wherein
each X is independently S, O or Se; and
each R and each R' is independently straight or branched $C_1$-$C_{40}$ alkyl, straight or branched alkoxy having from 1 to 40 carbons in the alkyl portion, $C_6$-$C_{40}$ aryl, $C_6$-$C_{40}$ substituted aryl, heteroaryl having from 5 to 40 backbone atoms, substituted heteroaryl having from 5 to 40 backbone atoms, any of which may be optionally substituted with F, Cl or CN, where appropriate.

9. The compound of claim 1 that is any one of compounds 1 to 37:

(1)

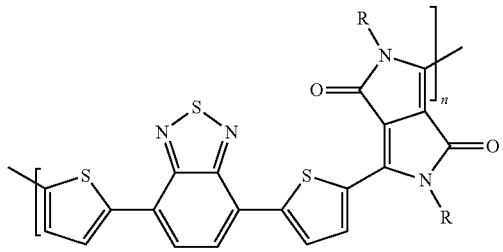

(2)
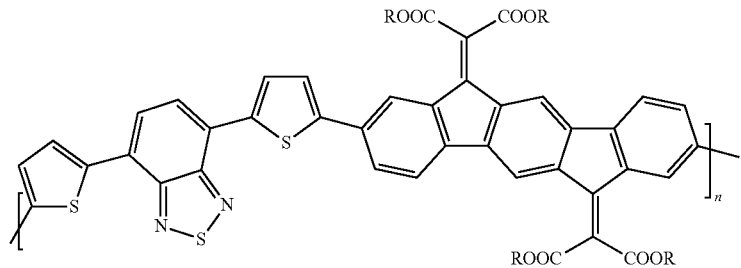
(3)
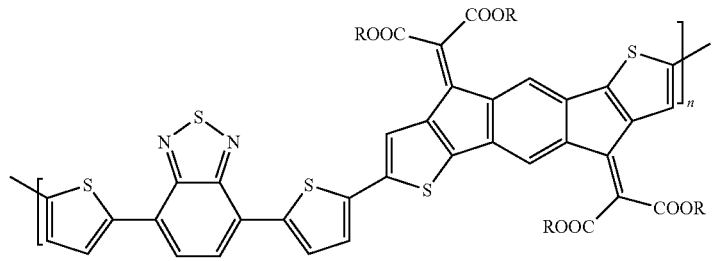
(4) (5)
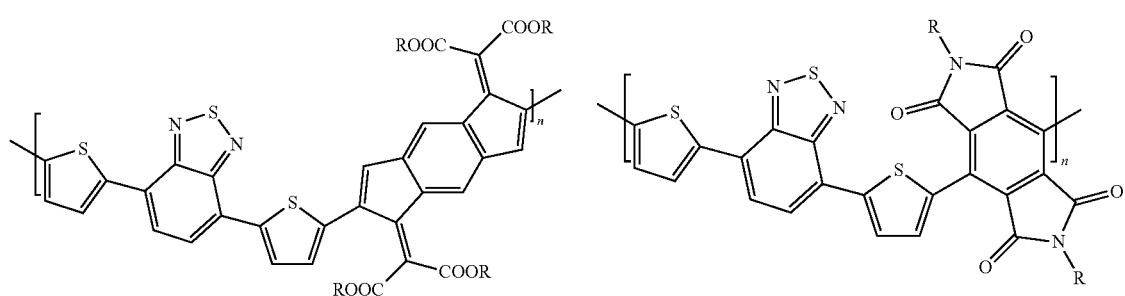
(6) (7)
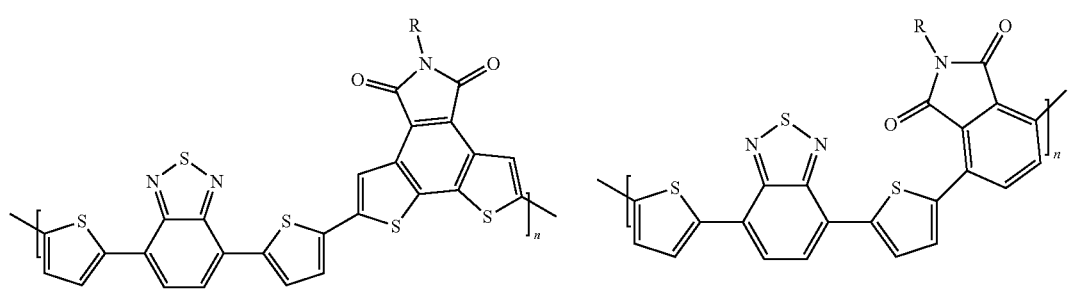
(8) (9)
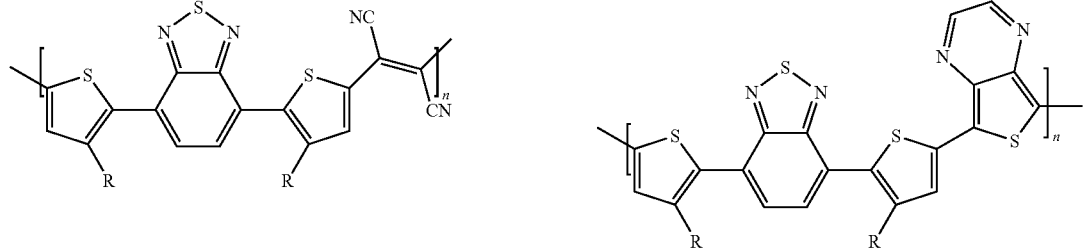

-continued
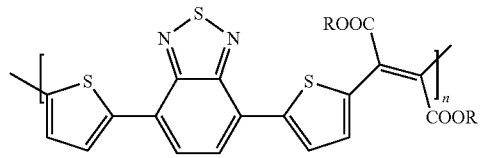
(10)
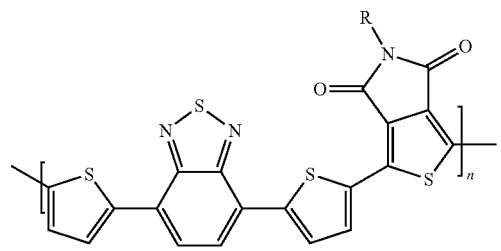
(11)
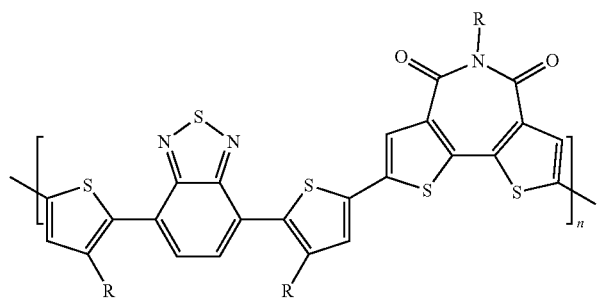
(12)
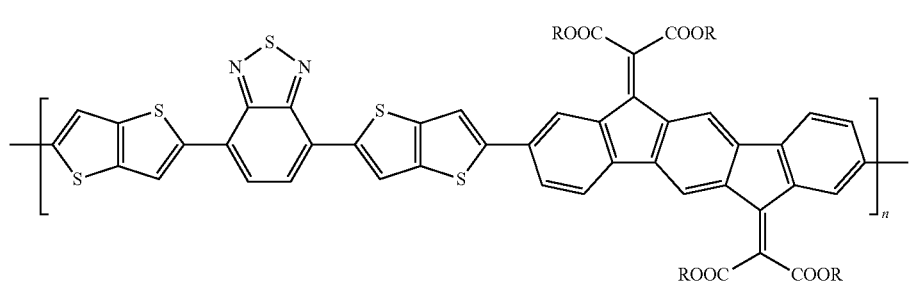
(13)
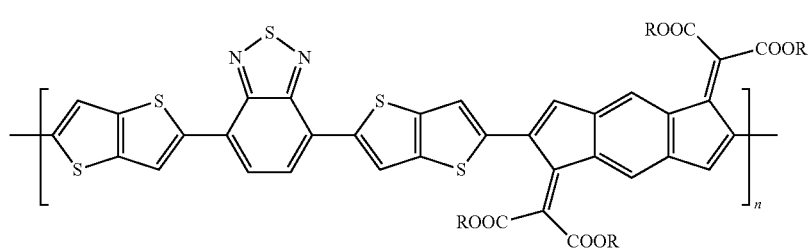
(14)
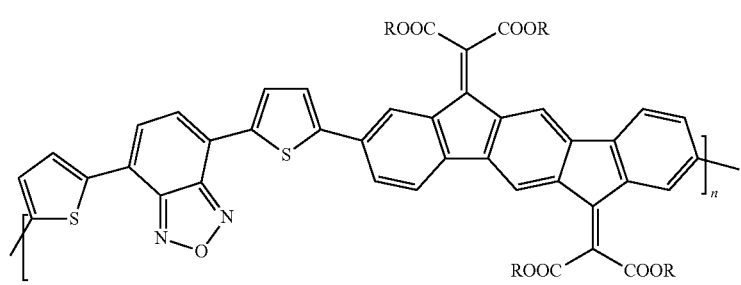
(15)
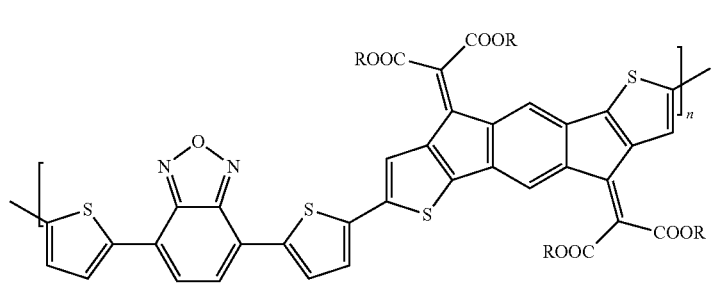
(16)

-continued
(17)
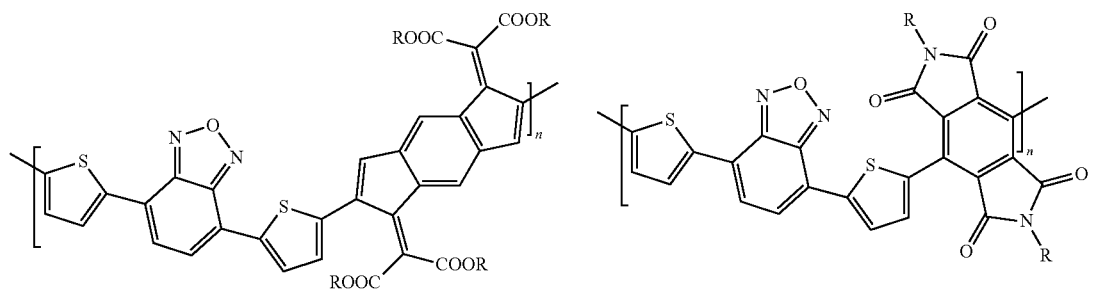
(18)
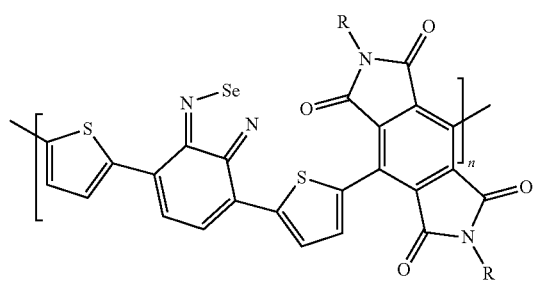
(19)
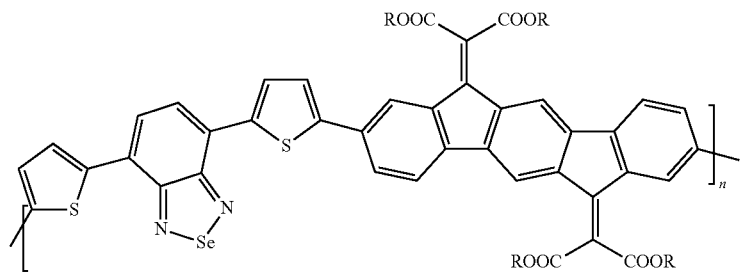
(20)
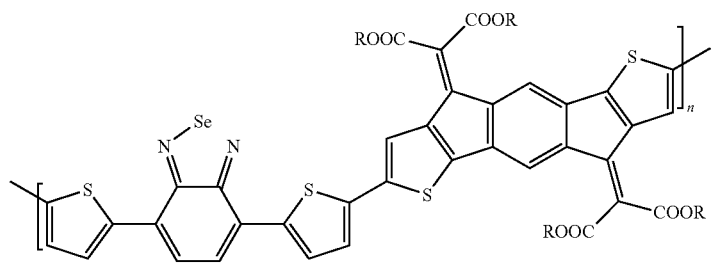
(21)
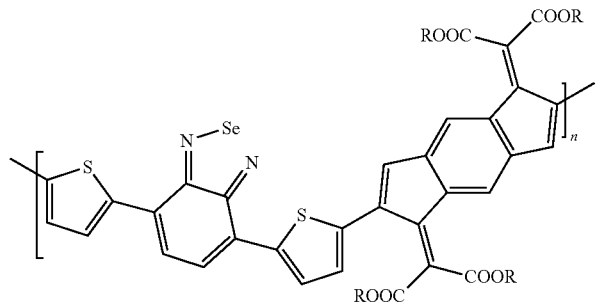
(22)

-continued
(23)
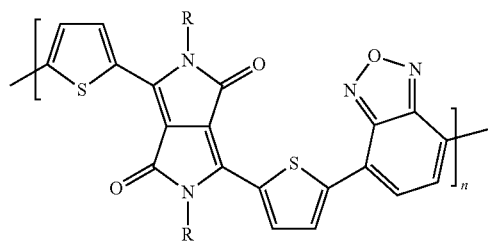
(24)
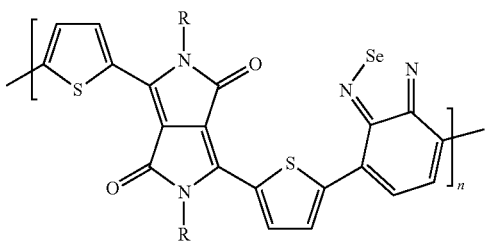
(25)
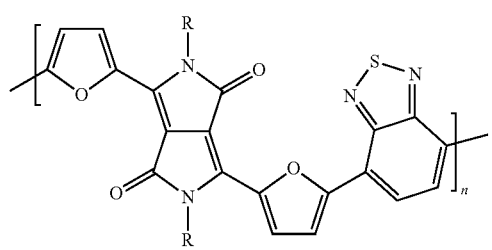
(26)
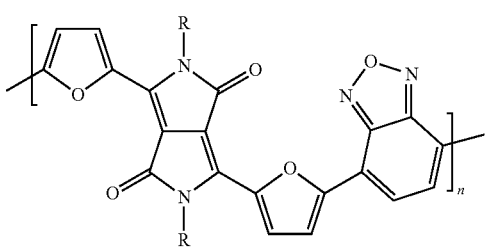
(27)
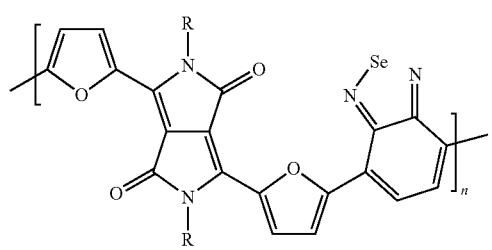
(28)
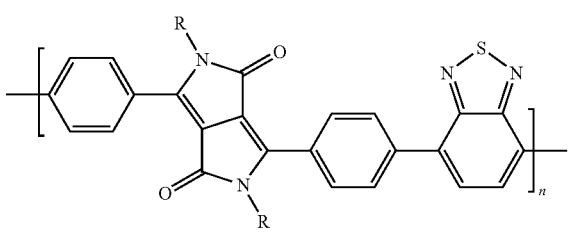
(29)
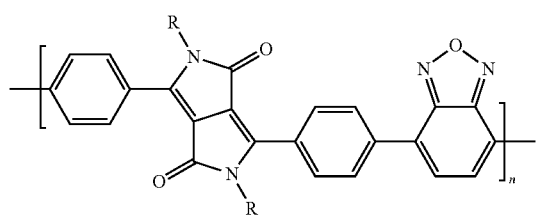
(30)
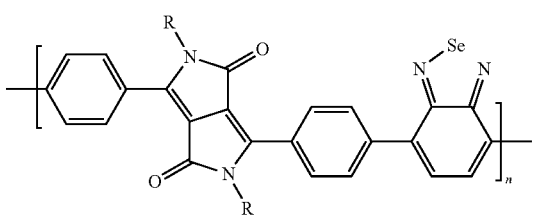
(31)
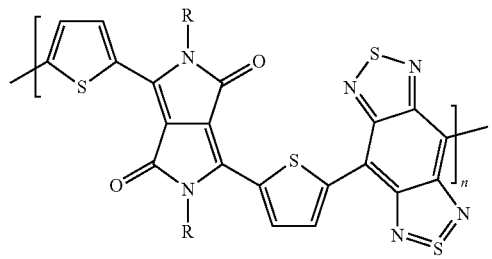
(32)
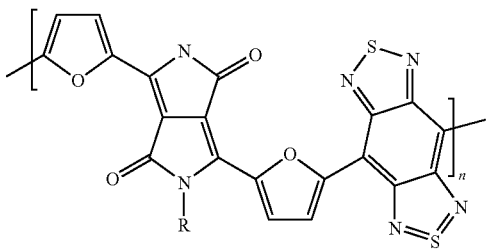
(33)
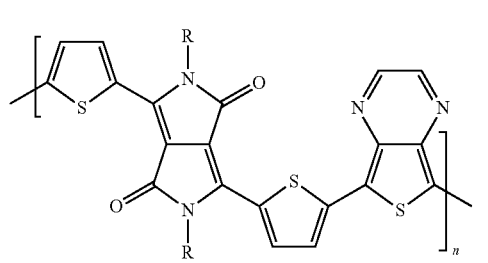
(34)
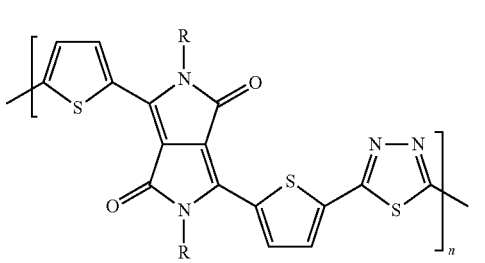

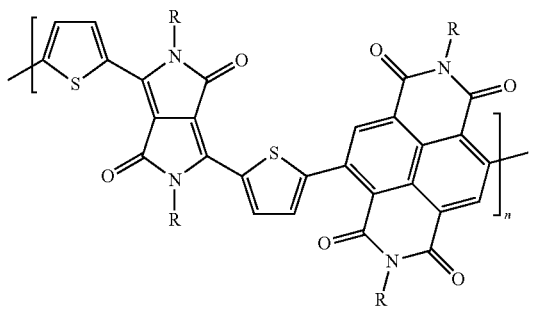
(35)

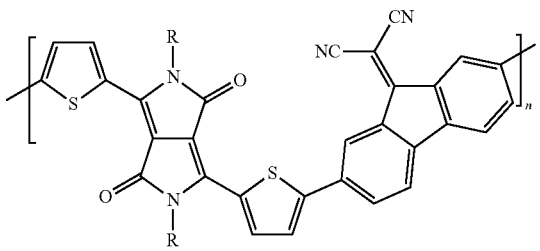
(36)

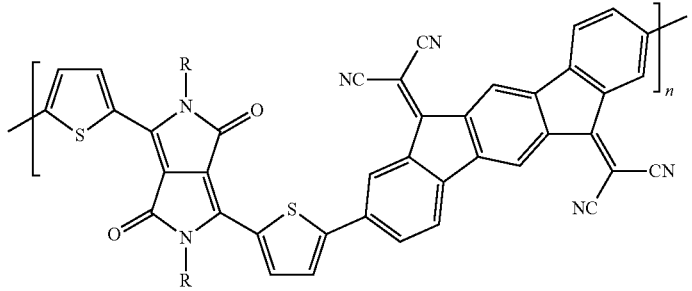
(37)

wherein each R is independently straight or branched $C_1$-$C_{40}$ alkyl, straight or branched alkoxy having from 1 to 40 carbons in the alkyl portion, $C_6$-$C_{40}$ aryl, $C_6$-$C_{40}$ substituted aryl, heteroaryl having from 5 to 40 backbone atoms, substituted heteroaryl having from 5 to 40 backbone atoms, any of which may be optionally substituted with F, Cl or CN, where appropriate.

10. A thin film comprising a compound of any one of claims 1 to 9.

11. An organic electronic device comprising a compound, of any one of claims 1 to 9 or a thin film of claim 10.

12. The organic electronic device of claim 11 that is a thin film transistor, the device comprising a gate electrode separated from a source electrode and a drain electrode by a gate dielectric, and a semiconductor material in contact with the gate dielectric and forming a conductive path between the source electrode and the drain electrode, the semiconductor material comprising a thin film of claim 10.

13. The organic electronic device of claim 12, wherein the thin film transistor is an ambipolar thin film transistor.

14. The organic electronic device of claim 12 or claim 13, wherein the source electrode and the drain electrode are made of the same conductive material.

\* \* \* \* \*

UNITED STATES PATENT AND TRADEMARK OFFICE
CERTIFICATE OF CORRECTION

PATENT NO. : 8,624,232 B2
APPLICATION NO. : 13/393223
DATED : January 7, 2014
INVENTOR(S) : Prashant Sonar et al.

It is certified that error appears in the above-identified patent and that said Letters Patent is hereby corrected as shown below:

Title Page should be replaced with attached Title Page showing -- Claims 13, 4 Drawing Sheets --

In The Specification

Column 8, line 26; column 10, line 29; and Column 40, lines 1 and 10, "D27" should read -- D35 --

Column 9, line 1 and column 38, line 41, "D13" should read -- D21 --

Column 9, line 7 and column 38, line 45, "D14" should read -- D22 --

Column 9, line 14 and column 38, line 52, "D15" should read -- D23 --

Column 9, line 21 and column 38, line 59, "D16" should read -- D24 --

Column 9, line 26 and column 38, line 63, "D17" should read -- D25 --

Column 9, line 30 and column 39, line 1, "D18" should read -- D26 --

Column 9, line 36 and column 39, line 8, "D19" should read -- D27 --

Column 9, line 42 and column 39, line 14, "D20" should read -- D28 --

Column 9, line 52 and column 39, line 24, "D21" should read -- D29 --

Column 9, line 61 and column 39, line 33, "D22" should read -- D30 --

Column 10, line 1 and column 39, line 39, "D23" should read -- D31 --

Column 10, line 9 and column 39, line 47, "D24" should read -- D32 --

Signed and Sealed this
Sixteenth Day of August, 2016

Michelle K. Lee
*Director of the United States Patent and Trademark Office*

CERTIFICATE OF CORRECTION (continued)

U.S. Pat. No. 8,624,232 B2

Column 10, line 15 and column 39, line 53, "D25" should read -- D33 --

Column 10, line 22 and column 39, line 59, "D26" should read -- D34 --

Column 10, line 29 and column 40, line 1, "D27" should read -- D35 --

Column 40, line 33, "any D may be D27." should read -- any D may be D27. In certain embodiments any D may be D28. In certain embodiments any D may be D29. In certain embodiments any D may be D30. In certain embodiments any D may be D31. In certain embodiments any D may be D32. In certain embodiments any D may be D33. In certain embodiments any D may be D34. In certain embodiments any D may be D35. --

In the Claims:

Column 56, Claim 1, line 12, "heteroaromatic group;" should read -- heteroaromatic group, each $A_{core}$ selected so that the compound has either formula Ia or Ib:

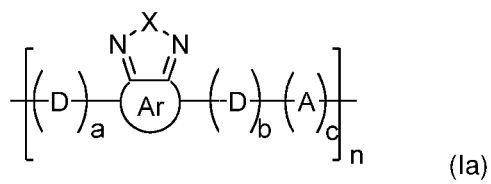
(Ia)

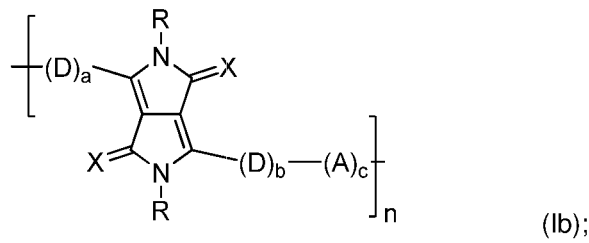
(Ib);

each Ar is a fused aromatic or heteroaromatic divalent moiety which has, including the two atoms of the $C_2N_2X$ ring to which Ar is fused, from 5 to 40 backbone atoms; --

Column 56, Claim 1, line 19, "each D is electron donating;" should read -- each D is electron donating and, for each D in formula Ia that is immediately adjacent to $A_{core}$ and for each D in formula Ib adjacent to an A that comprises ![Ar ring], includes at least a five-membered conjugated heterocyclic moiety that contains at least one heteroatom that is S, O or Se, and which may further include one or more additional heteroatoms, including N, S, O or Se, and which may be optionally substituted; --

Column 56, Claim 1, lines 28 and 29, "electron accepting;" should read -- electron accepting, and wherein for formula Ia, each A is independently one of A1 to A19 and each A is optionally substituted:
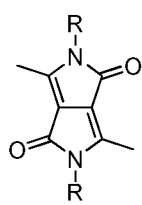 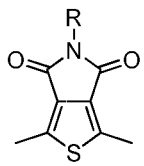 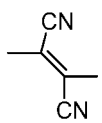 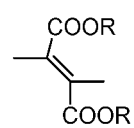
   A1      A2      A3      A4
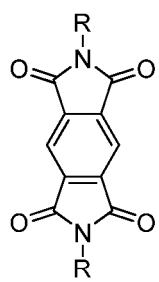 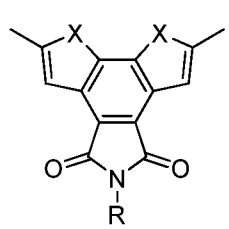 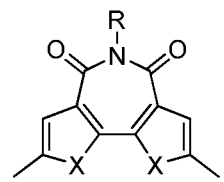 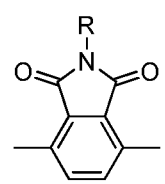 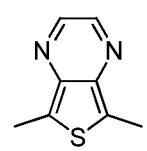
 A5   A6   A7   A8   A9
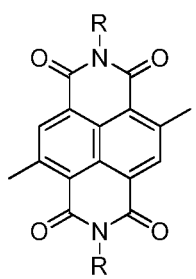 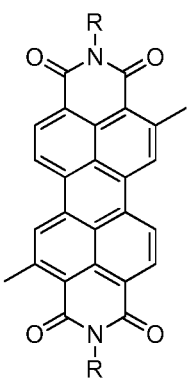 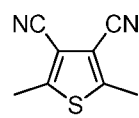 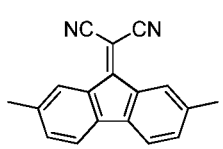 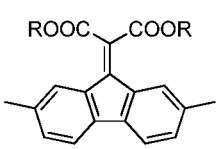
 A10   A11   A12   A13   A14
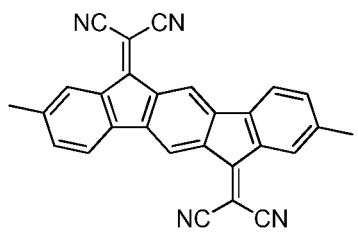 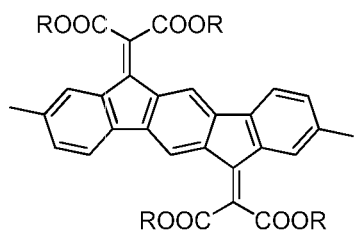 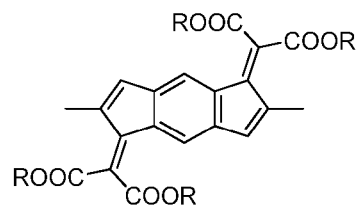
  A15      A16      A17

CERTIFICATE OF CORRECTION (continued)
U.S. Pat. No. 8,624,232 B2

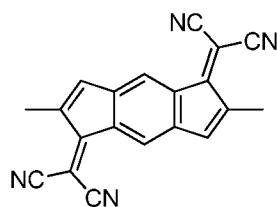 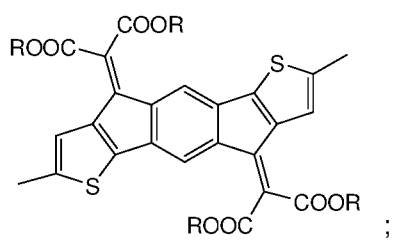

A18          A19 each R is independently straight or branched $C_1$-$C_{40}$ alkyl, straight or branched alkoxy having from 1 to 40 carbons in the alkyl portion, $C_6$-$C_{40}$ aryl, $C_6$-$C_{40}$ substituted aryl, heteroaryl having from 5 to 40 backbone atoms, substituted heteroaryl having from 5 to 40 backbone atoms, any of which may be optionally substituted with F, Cl or CN, where appropriate;

each X is independently S, O or Se; --

Column 56, Claim 2, line 49, "each D is independently" should read -- each D that is adjacent to $A_{core}$ is independently --

Column 56, Claim 2, line 54, "substituted." should read -- substituted; and each A is independently one of A1 to A19 and each A is optionally substituted:

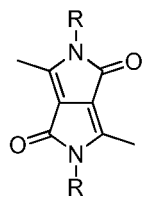 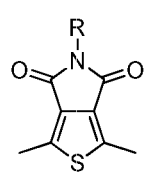 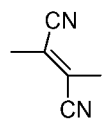 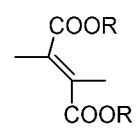

A1         A2         A3         A4

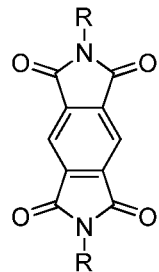 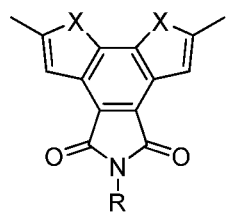 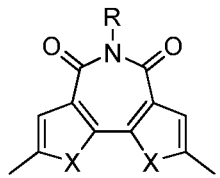 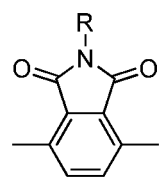 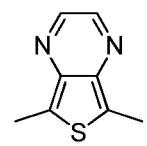

A5         A6         A7         A8         A9

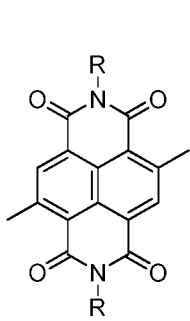 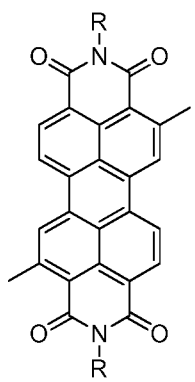 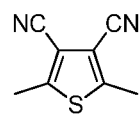 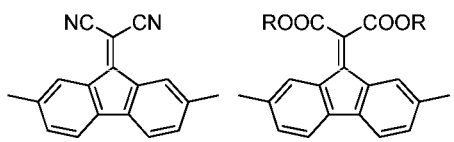

A10     A11     A12     A13     A14

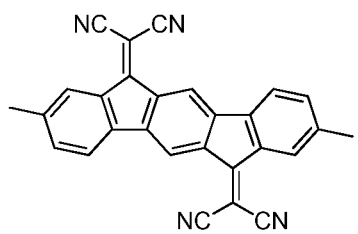 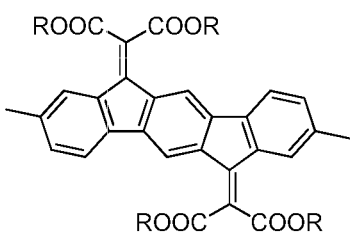 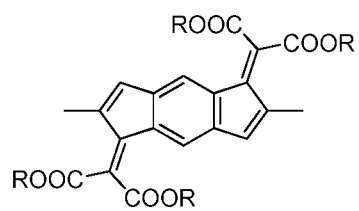

A15     A16     A17

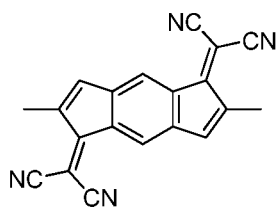 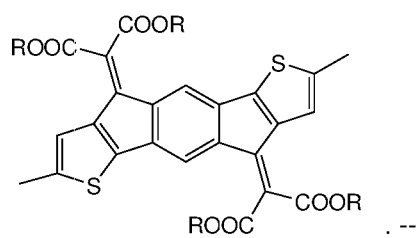

A18     A19

Column 57, Claim 4, line 44, "claim 2 or 3" should read -- claim 2 --

Column 58, Claim 5 should be cancelled.

Column 62, Claim 6 (should be claim 5), line 16, "wherein" should read -- wherein 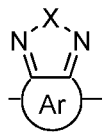

for each D that is adjacent to an A that comprises , D includes at least a five-membered conjugated heterocyclic moiety that contains at least one heteroatom that is S, O or Se, and which may further include one or more additional heteroatoms, including N, S, O or Se, and which may be optionally substituted; --

CERTIFICATE OF CORRECTION (continued)
U.S. Pat. No. 8,624,232 B2

Column 62, Claim 7 (should be claim 6), lines 26 and 27, "claim 6, wherein each D is independently one of D13 to D27" should read -- claim 5, wherein each D is independently one of D13 to D35 --

Column 63, Claim 7 (should be claim 6), line 1, "D13" should read -- D21 --

Column 63, Claim 7 (should be claim 6), line 7, "D14" should read -- D22 --

Column 63, Claim 7 (should be claim 6), line 14, "D15" should read -- D23 --

Column 63, Claim 7 (should be claim 6), line 21, "D16" should read -- D24 --

Column 63, Claim 7 (should be claim 6), line 26, "D17" should read -- D25 --

Column 63, Claim 7 (should be claim 6), line 30, "D18" should read -- D26 --

Column 63, Claim 7 (should be claim 6), line 36, "D19" should read -- D27 --

Column 63, Claim 7 (should be claim 6), line 42, "D20" should read -- D28 --

Column 63, Claim 7 (should be claim 6), line 52, "D21" should read -- D29 --

Column 63, Claim 7 (should be claim 6), line 61, "D22" should read -- D30 --

Column 64, Claim 7 (should be claim 6), line 1, "D23" should read -- D31 --

Column 64, Claim 7 (should be claim 6), line 8, "D24" should read -- D32 --

Column 64, Claim 7 (should be claim 6), line 14, "D25" should read -- D33 --

Column 64, Claim 7 (should be claim 6), line 21, "D26" should read -- D34 --

Column 64, Claim 7 (should be claim 6), line 27, "D27" should read -- D35 --

Column 64, Claim 8 (should be claim 7), line 44, "claim 6 or 7" should read -- claim 5 --

Column 66, Claim 9 (should be claim 8), line 56, "1 to 37" should read -- 1 to 27 and 31 to 37 --

Column 74, Claim 9 (should be claim 8), compounds 28 to 30 should be cancelled.

Column 75, Claim 10 (should be claim 9), lines 36 and 37, "any one of claims 1 to 9" should read -- formula I:

$$[D_a - A_{core} - D_b - A_c -]_n \quad (I)$$

wherein each $A_{core}$ is an electron accepting fused heteroaromatic group having at least one nitrogen atom in the backbone of the heteroaromatic group and at least one S, O or Se atom either in the backbone of the heteroaromatic group or as a conjugated substituent on the heteroaromatic group, each $A_{core}$ selected so that the compound has either formula Ia or Ib:

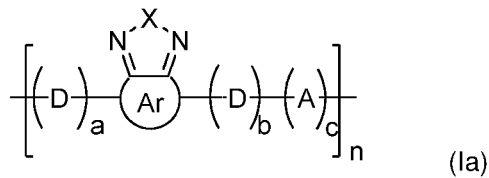

(Ia)

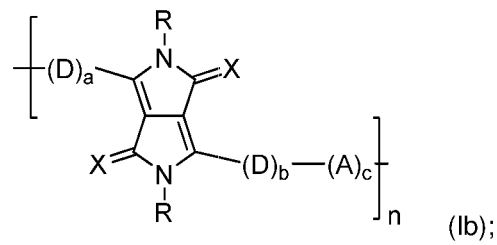

(Ib);

each Ar is a fused aromatic or heteroaromatic divalent moiety which has, including the two atoms of the $C_2N_2X$ ring to which Ar is fused, from 5 to 40 backbone atoms;

each D is an independently selected conjugated electron donating aromatic or heteroaromatic group having from 5 to 50 backbone atoms, each D optionally substituted with one or more electron donating substituents or electron withdrawing substituents, provided that even when substituted the electronic character of each D is electron donating and, for each D in formula Ia that is immediately adjacent to $A_{core}$ and for each D in formula Ib adjacent to an A that comprises adjacent to an A that comprises 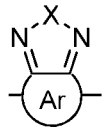, D includes at least a five-membered conjugated heterocyclic moiety that contains at least one heteroatom that is S, O or Se, and which may further include one or more additional heteroatoms, including N, S, O or Se, and which may be optionally substituted;

each A is an independently selected conjugated electron accepting aromatic or heteroaromatic group having from 5 to 50 backbone atoms or an ethenylene group substituted with one or two electron withdrawing substituents, each A being optionally substituted with one or more electron donating substituents or electron withdrawing substituents provided that even when substituted the electronic character of each A is electron accepting, and wherein for formula Ia, each A is independently one of A1 to A19 and each A is optionally substituted:

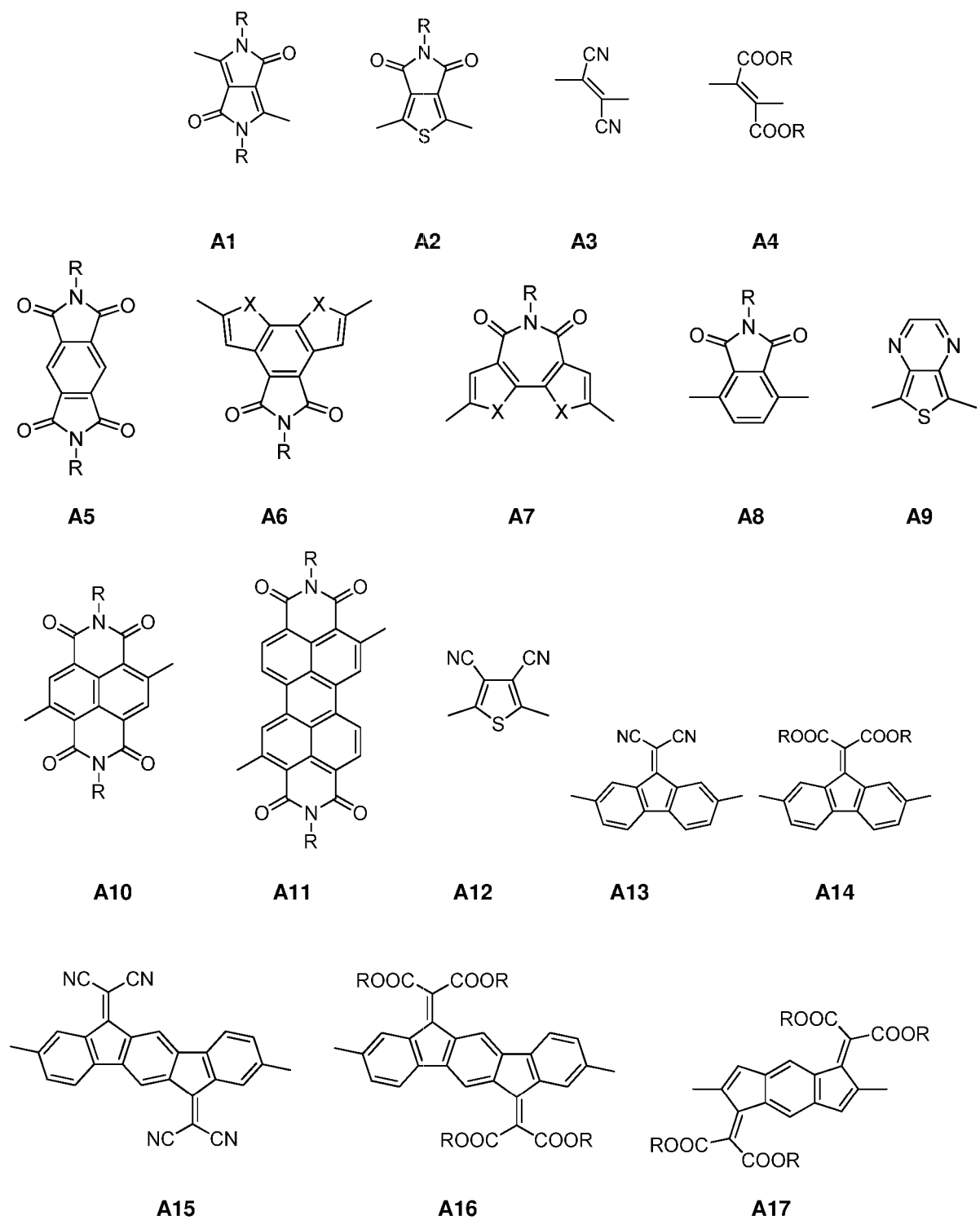

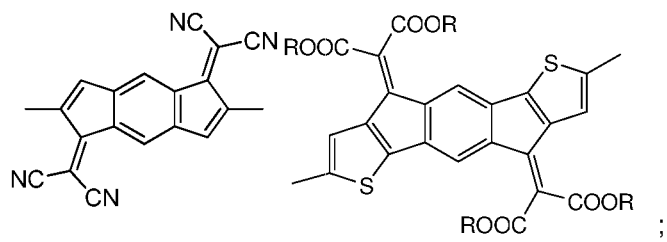

A18          A19 each R is independently straight or branched C1-C40 alkyl, straight or branched alkoxy having from 1 to 40 carbons in the alkyl portion, C6-C40 aryl, C6-C40 substituted aryl, heteroaryl having from 5 to 40 backbone atoms, substituted heteroaryl having from 5 to 40 backbone atoms, any of which may be optionally substituted with F, Cl or CN, where appropriate;

each X is independently S, O or Se;

n is an integer having a value of from 2 to 10000; and each a, each b and each c is independently an integer from 1 to 4. --

Column 75, Claim 11 (should be claim 10), lines 35 and 36, "any one of claims 1 to 9 or a thin film of claim 10" should read -- formula I:

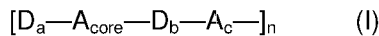

$$[D_a-A_{core}-D_b-A_c-]_n \quad (I)$$

wherein each $A_{core}$ is an electron accepting fused heteroaromatic group having at least one nitrogen atom in the backbone of the heteroaromatic group and at least one S, O or Se atom either in the backbone of the heteroaromatic group or as a conjugated substituent on the heteroaromatic group, each $A_{core}$ selected so that the compound has either formula Ia or Ib:

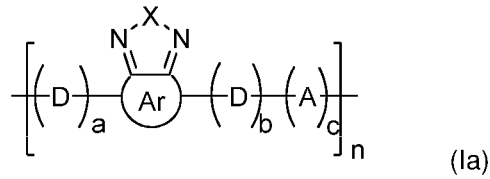

(Ia)

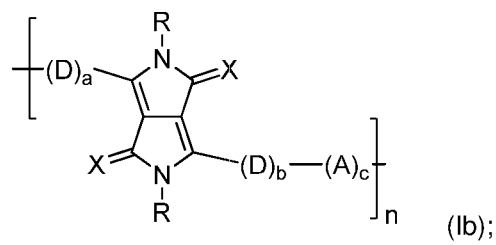

(Ib);

each Ar is a fused aromatic or heteroaromatic divalent moiety which has, including the two atoms of the $C_2N_2X$ ring to which Ar is fused, from 5 to 40 backbone atoms;

each D is an independently selected conjugated electron donating aromatic or heteroaromatic group having from 5 to 50 backbone atoms, each D optionally substituted with one or more electron donating substituents or electron withdrawing substituents, provided that even when substituted the electronic character of each D is electron donating and, for each D in formula Ia that is immediately adjacent to $A_{core}$ and for each D in formula Ib adjacent to an A that comprises 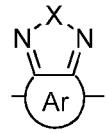, D includes at least a five-membered conjugated heterocyclic moiety that contains at least one heteroatom that is S, O or Se, and which may further include one or more additional heteroatoms, including N, S, O or Se, and which may be optionally substituted;

each A is an independently selected conjugated electron accepting aromatic or heteroaromatic group having from 5 to 50 backbone atoms or an ethenylene group substituted with one or two electron withdrawing substituents, each A being optionally substituted with one or more electron donating substituents or electron withdrawing substituents provided that even when substituted the electronic character of each A is electron accepting, and wherein for formula Ia, each A is independently one of A1 to A19 and each A is optionally substituted:

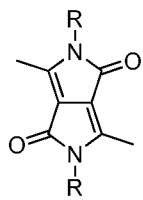 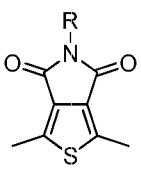 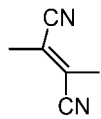 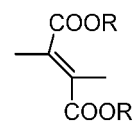

A1  A2  A3  A4

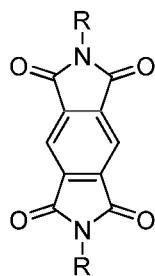 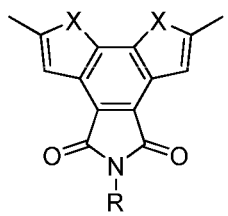 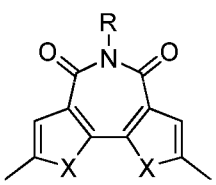 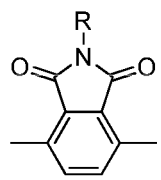 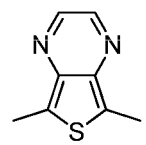

A5  A6  A7  A8  A9

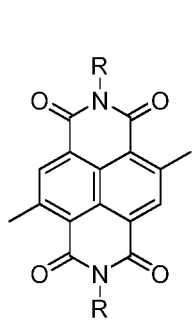 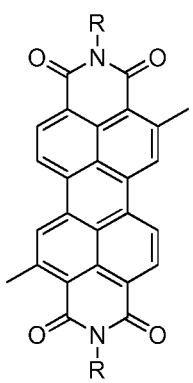 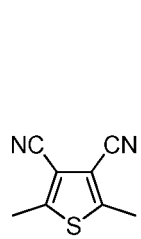 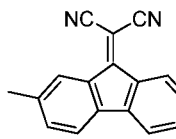 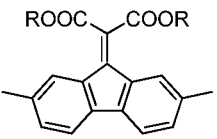

A10  A11  A12  A13  A14

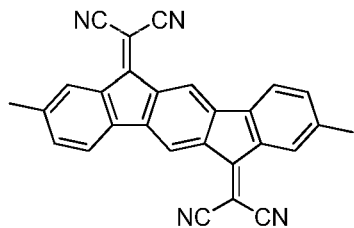 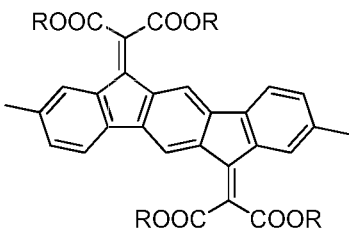 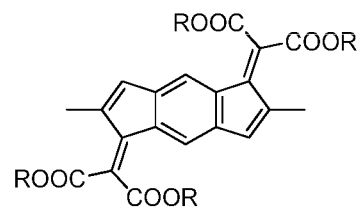

A15  A16  A17

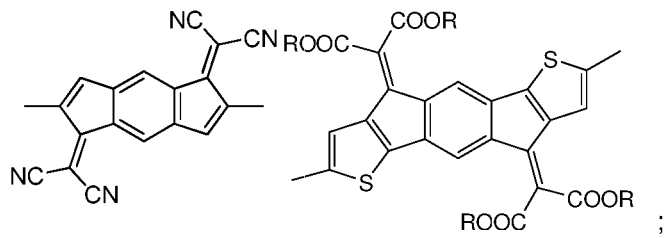

A18  A19 each R is independently straight or branched $C_1$-$C_{40}$ alkyl, straight or branched alkoxy having from 1 to 40 carbons in the alkyl portion, $C_6$-$C_{40}$ aryl, $C_6$-$C_{40}$ substituted aryl, heteroaryl having from 5 to 40 backbone atoms, substituted heteroaryl having from 5 to 40 backbone atoms, any of which may be optionally substituted with F, Cl or CN, where appropriate;

each X is independently S, O or Se;

n is an integer having a value of from 2 to 10000; and each a, each b and each c is independently an integer from 1 to 4. --

Column 75, Claim 12 (should be claim 11), line 38, "claim 11" should read -- claim 10 --

Column 76, Claim 12 (should be claim 11), line 33, "claim 10" should read -- comprising a compound of formula I:

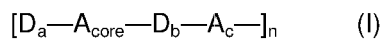

wherein each $A_{core}$ is an electron accepting fused heteroaromatic group having at least one nitrogen atom in the backbone of the heteroaromatic group and at least one S, O or Se atom either in the backbone of the heteroaromatic group or as a conjugated substituent on the heteroaromatic group, each $A_{core}$ selected so that the compound has either formula Ia or Ib:

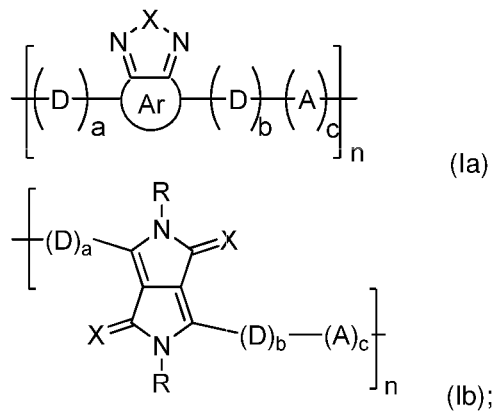

each Ar is a fused aromatic or heteroaromatic divalent moiety which has, including the two atoms of the $C_2N_2X$ ring to which Ar is fused, from 5 to 40 backbone atoms;

each D is an independently selected conjugated electron donating aromatic or heteroaromatic group having from 5 to 50 backbone atoms, each D optionally substituted with one or more electron donating substituents or electron withdrawing substituents, provided that even when substituted the electronic character of each D is electron donating and, for each D in formula Ia that is immediately adjacent to $A_{core}$ and for each D in formula Ib adjacent to an A that comprises 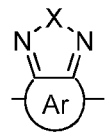 , D includes at least a five-membered conjugated heterocyclic moiety that contains at least one heteroatom that is S, O or Se, and which may further include one or more additional heteroatoms, including N, S, O or Se, and which may be optionally substituted;

each A is an independently selected conjugated electron accepting aromatic or heteroaromatic group having from 5 to 50 backbone atoms or an ethenylene group substituted with one or two electron withdrawing substituents, each A being optionally substituted with one or more electron donating substituents or electron withdrawing substituents provided that even when substituted the electronic character of each A is electron accepting, and wherein for formula Ia, each A is independently one of A1 to A19 and each A is optionally substituted:

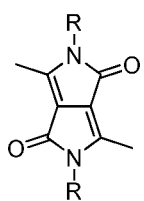 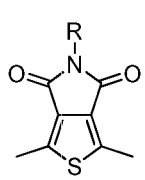 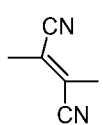 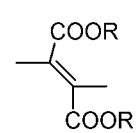
A1  A2  A3  A4
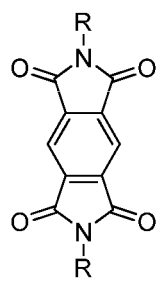 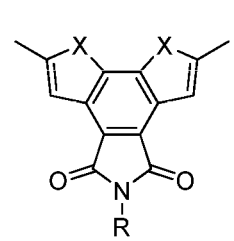 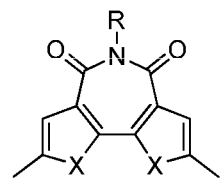 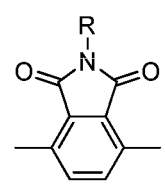 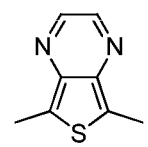
A5  A6  A7  A8  A9
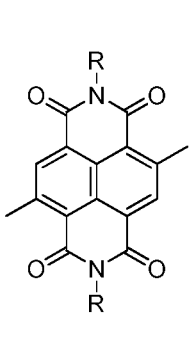 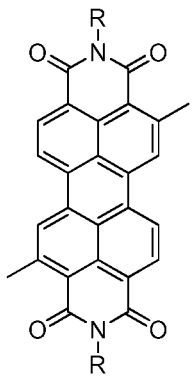 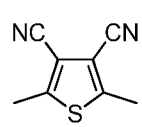 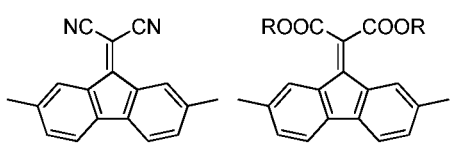
A10  A11  A12  A13  A14
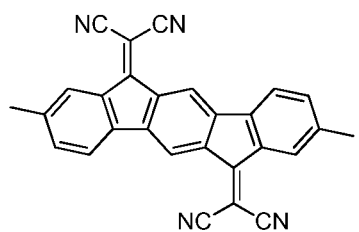 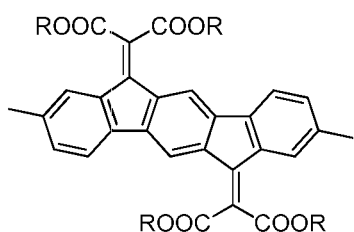 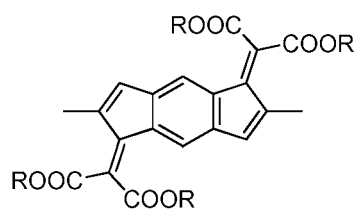
A15  A16  A17

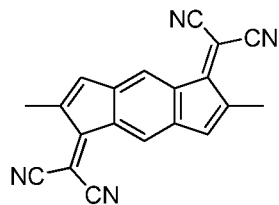 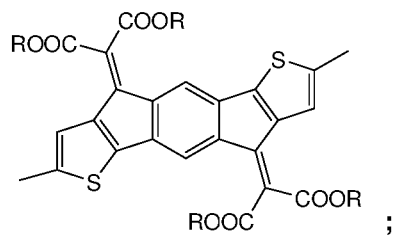

A18    A19 each R is independently straight or branched $C_1$-$C_{40}$ alkyl, straight or branched alkoxy having from 1 to 40 carbons in the alkyl portion, $C_6$-$C_{40}$ aryl, $C_6$-$C_{40}$ substituted aryl, heteroaryl having from 5 to 40 backbone atoms, substituted heteroaryl having from 5 to 40 backbone atoms, any of which may be optionally substituted with F, Cl or CN, where appropriate;

each X is independently S, O or Se;

n is an integer having a value of from 2 to 10000; and each a, each b and each c is independently an integer from 1 to 4.

Column 76, Claim 13 (should be claim 12), line 34, "claim 12" should read -- claim 11 --

Column 76, Claim 14 (should be claim 13), line 36, "claim 12 or claim 13" should read -- claim 11 --

CERTIFICATE OF CORRECTION (continued)

(12) United States Patent
Sonar et al.

(10) Patent No.: US 8,624,232 B2
(45) Date of Patent: Jan. 7, 2014

(54) AMBIPOLAR POLYMERIC SEMICONDUCTOR MATERIALS AND ORGANIC ELECTRONIC DEVICES

(76) Inventors: Prashant Sonar, Singapore (SG);
Samarendra P. Singh, Singapore (SG);
Mui Siang Soh, Singapore (SG); Yuning Li, Singapore (SG)

(*) Notice: Subject to any disclaimer, the term of this patent is extended or adjusted under 35 U.S.C. 154(b) by 8 days.

(21) Appl. No.: 13/393,223

(22) PCT Filed: Apr. 30, 2010

(86) PCT No.: PCT/SG2010/000174
§ 371 (c)(1),
(2), (4) Date: Feb. 28, 2012

(87) PCT Pub. No.: WO2011/025454
PCT Pub. Date: Mar. 3, 2011

(65) Prior Publication Data
US 2012/0153274 A1    Jun. 21, 2012

Related U.S. Application Data

(60) Provisional application No. 61/272,182, filed on Aug. 28, 2009.

(51) Int. Cl.
*H01L 29/08* (2006.01)

(52) U.S. Cl.
USPC .............. 257/40; 257/E51.005; 257/E51.024; 528/360; 528/367

(58) Field of Classification Search
USPC .............. 257/40, E51.005, E51.024; 528/360, 528/367
See application file for complete search history.

(56) References Cited

U.S. PATENT DOCUMENTS

| | | |
|---|---|---|
| 6,791,129 B2 | 9/2004 | Inukai |
| 7,112,679 B2 | 9/2006 | Zhou et al. |
| 7,132,500 B2 | 11/2006 | Ong et al. |
| 7,132,682 B2 | 11/2006 | Ong et al. |
| 7,141,644 B2 | 11/2006 | Ong et al. |
| 7,223,484 B2 | 5/2007 | Stössel et al. |
| 7,244,809 B2 | 7/2007 | Giles et al. |
| 7,282,733 B2 | 10/2007 | Ong et al. |
| 7,294,288 B2 | 11/2007 | Koller et al. |
| 7,368,510 B2 | 5/2008 | Lee et al. |
| 7,517,945 B2 | 4/2009 | Ong et al. |
| 8,329,915 B2 | 12/2012 | Moawia et al. |
| 2003/0186079 A1 | 10/2003 | Towns et al. |
| 2006/0081839 A1 | 4/2006 | Jeong et al. |
| 2006/0113527 A1 | 6/2006 | Han et al. |

(Continued)

FOREIGN PATENT DOCUMENTS

| | | |
|---|---|---|
| CA | 2 625 306 A1 | 9/2009 |
| EP | 2 033 983 A2 | 3/2009 |

(Continued)

OTHER PUBLICATIONS

PCT International Search Report for PCT Counterpart Application No. PCT/SG2010/000174, 4 pgs (Jul. 12, 2010).

(Continued)

*Primary Examiner* — Shane Fang
(74) *Attorney, Agent, or Firm* — Blakely, Sokoloff, Taylor & Zafman LLP

(57) ABSTRACT

There is provided compounds of formula I, ambipolar semiconductor material derived from such compounds and devices comprising such ambipolar semiconductor material.

$$[D_a\text{-}A_{core}\text{-}D_b\text{-}A_c\text{-}]_n \quad (I)$$

13 Claims, 4 Drawing Sheets